United States Patent [19]

Hong et al.

[11] Patent Number: 4,593,351
[45] Date of Patent: Jun. 3, 1986

[54] HIGH SPEED MACHINE FOR THE PHYSICAL DESIGN OF VERY LARGE SCALE INTEGRATED CIRCUITS

[75] Inventors: Se J. Hong, Yorktown Heights; Ravindra K. Nair, Peekskill, both of N.Y.; Eugene Shapiro, Stamford, Conn.

[73] Assignee: International Business Machines Corporation, Armonk, N.Y.

[21] Appl. No.: 621,988

[22] Filed: Jun. 18, 1984

Related U.S. Application Data

[62] Division of Ser. No. 272,880, Jun. 12, 1981, Pat. No. 4,484,292.

[51] Int. Cl.⁴ .............................................. G06F 15/16
[52] U.S. Cl. .................................................... 364/200
[58] Field of Search ................................ 364/200, 900

[56] References Cited

U.S. PATENT DOCUMENTS

| | | | |
|---|---|---|---|
| 3,979,728 | 9/1976 | Reddaway | 364/200 |
| 4,035,777 | 7/1977 | Moreton | 364/200 |
| 4,365,292 | 12/1982 | Barnes et al. | 364/200 |

Primary Examiner—Thomas M. Heckler
Attorney, Agent, or Firm—Jack M. Arnold

[57] ABSTRACT

Method and apparatus for the physical design of very large scale integrated (VLSI) circuits, and in particular the interconnection and wire routing between circuits formed on a chip. Apparatus is set forth for determining the wire routings in a VLSI circuit comprised of cells, wherein the cells are composed of electronic devices functioning as logic gates. Groups of cells may be interconnected to function as flip flops, shift registers and the like. A supervisory controller communicates with n, where n is an integer, identical multi-port processors, with one processor dedicated to each cell, for determining the wire routings between the respective cells. Each processor communicates simultaneously with its four adjacent neighbor processors to determine channel routings from one point to the next in the array of cells, wherein a channel routing includes vertical and horizontal paths. Following determination of global channel routings, exact vertical and horizontal tracks for the wire paths are assigned. The array of processors may be utilized to wire a much larger array of cells.

2 Claims, 54 Drawing Figures

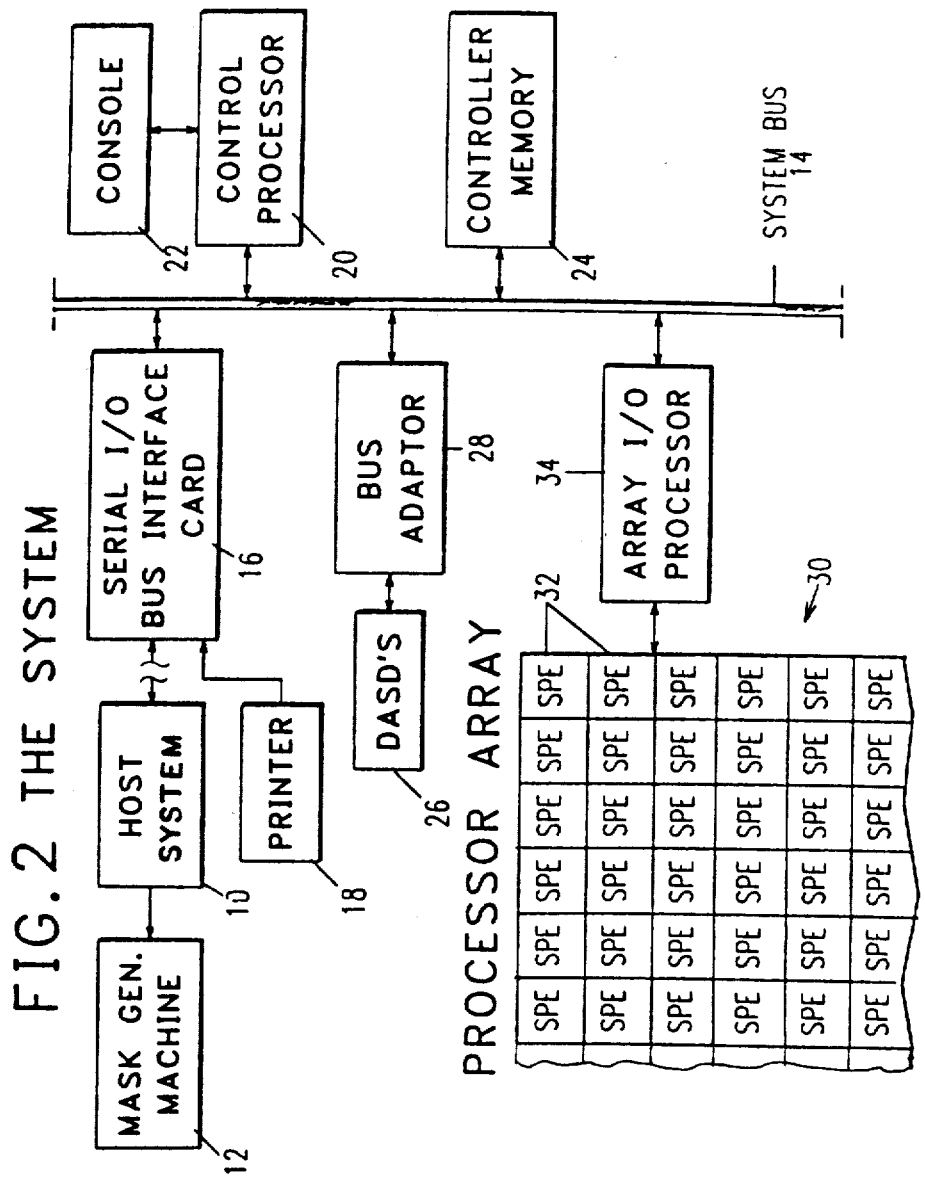
FIG.2 THE SYSTEM

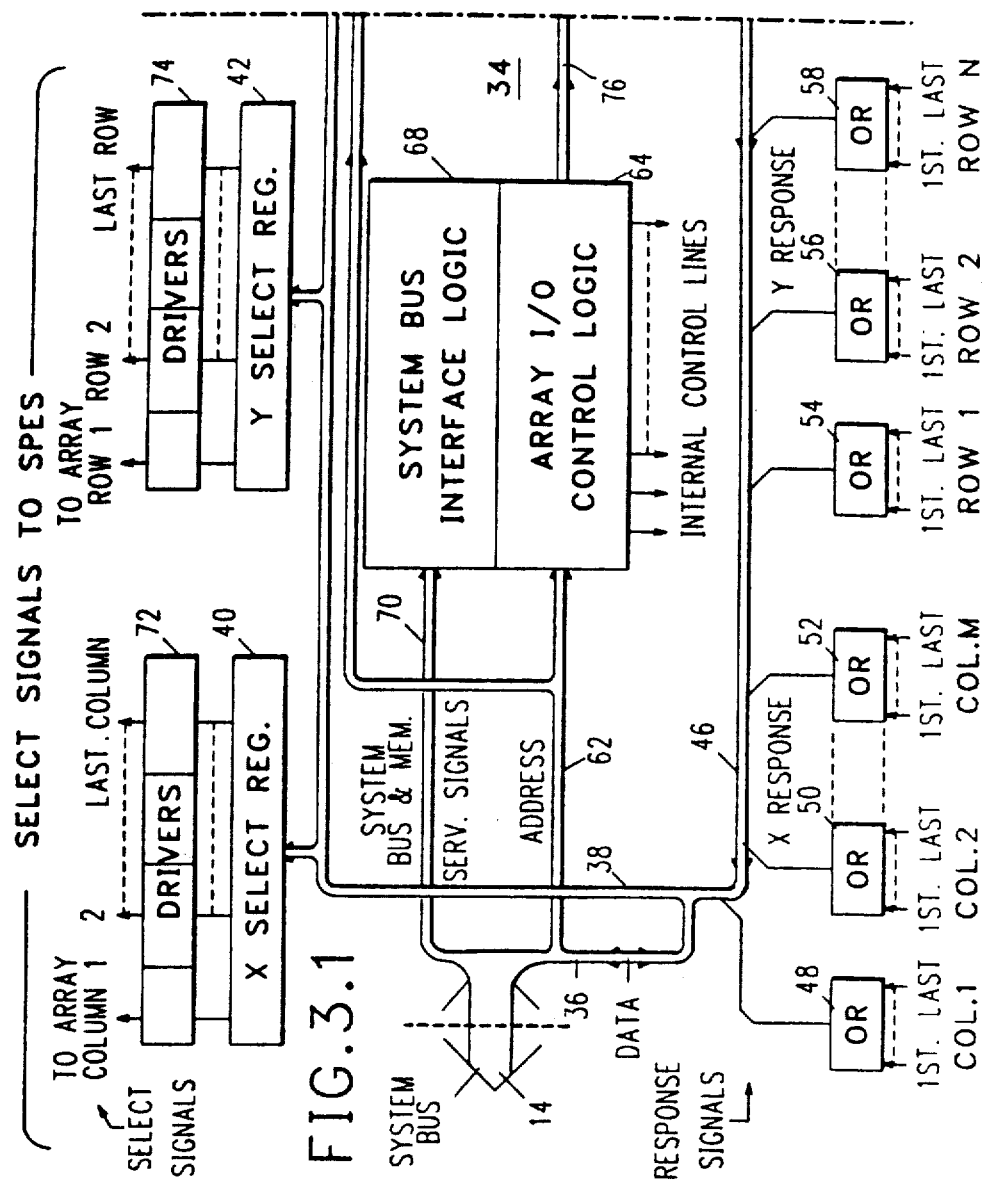
FIG.3.1

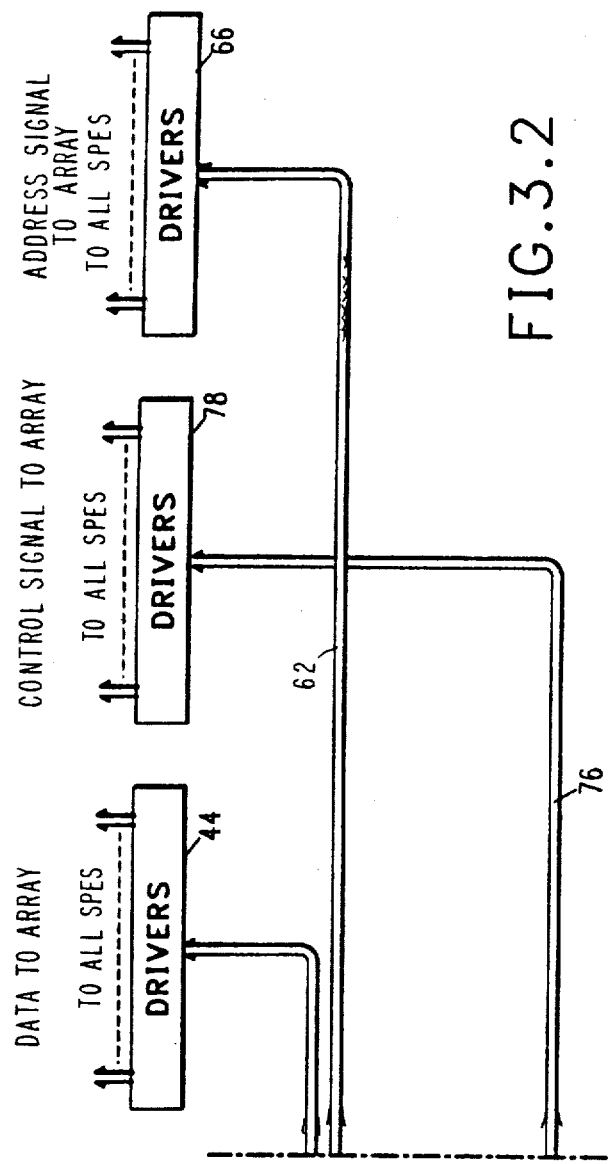
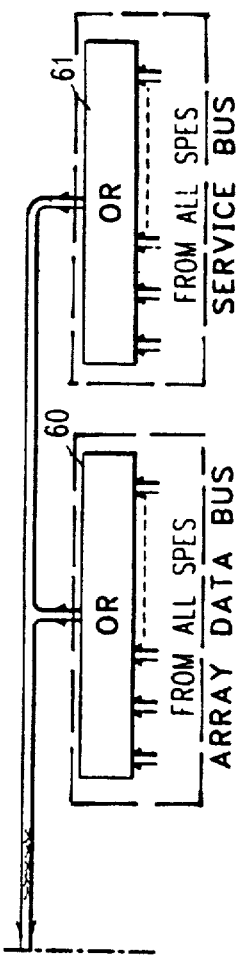
FIG.3.2

PHYSICAL DESIGN PROCESS

DRIVERS TO ARRAY

X-Y SELECTION DETERMINATION

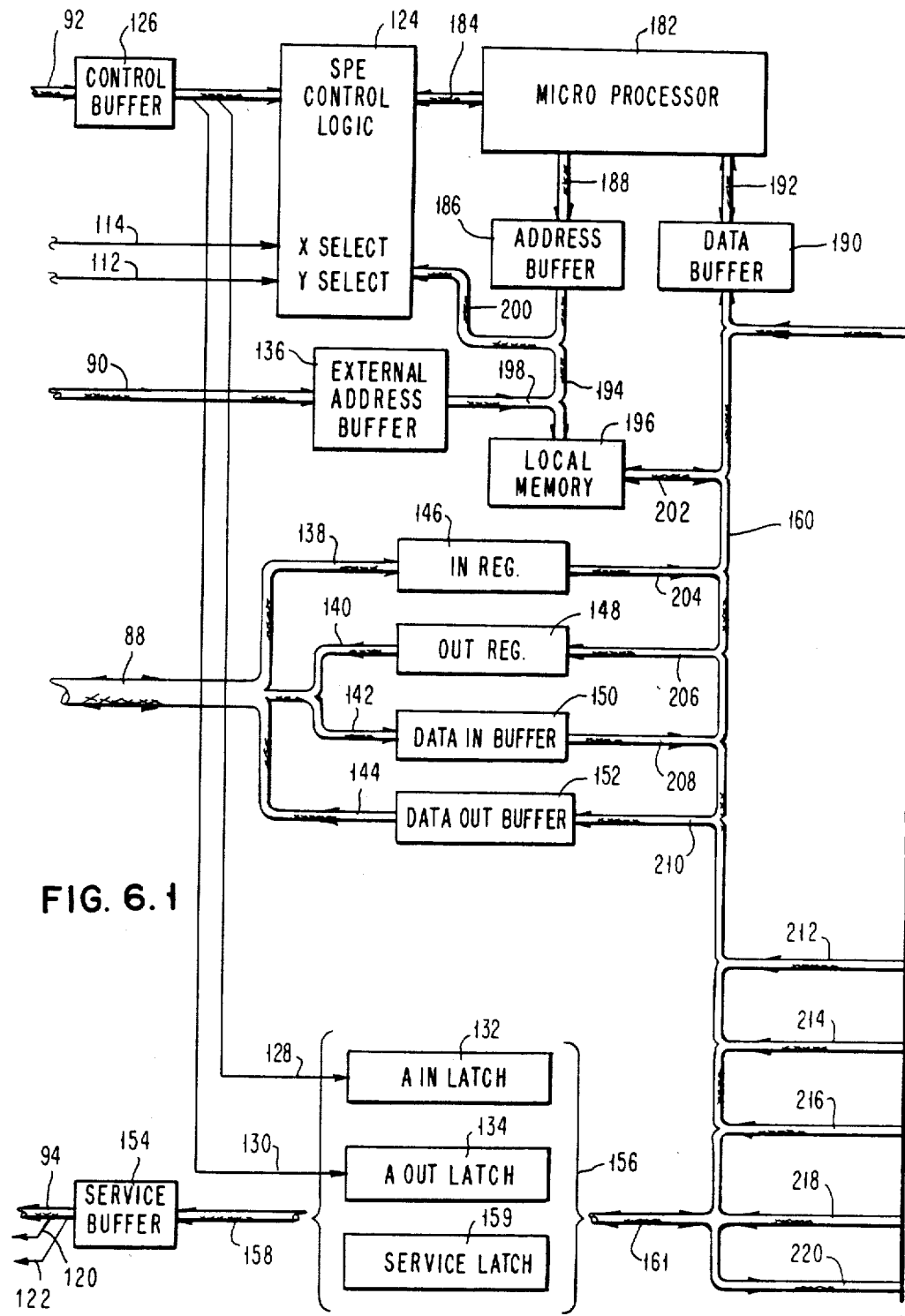
FIG. 6.1

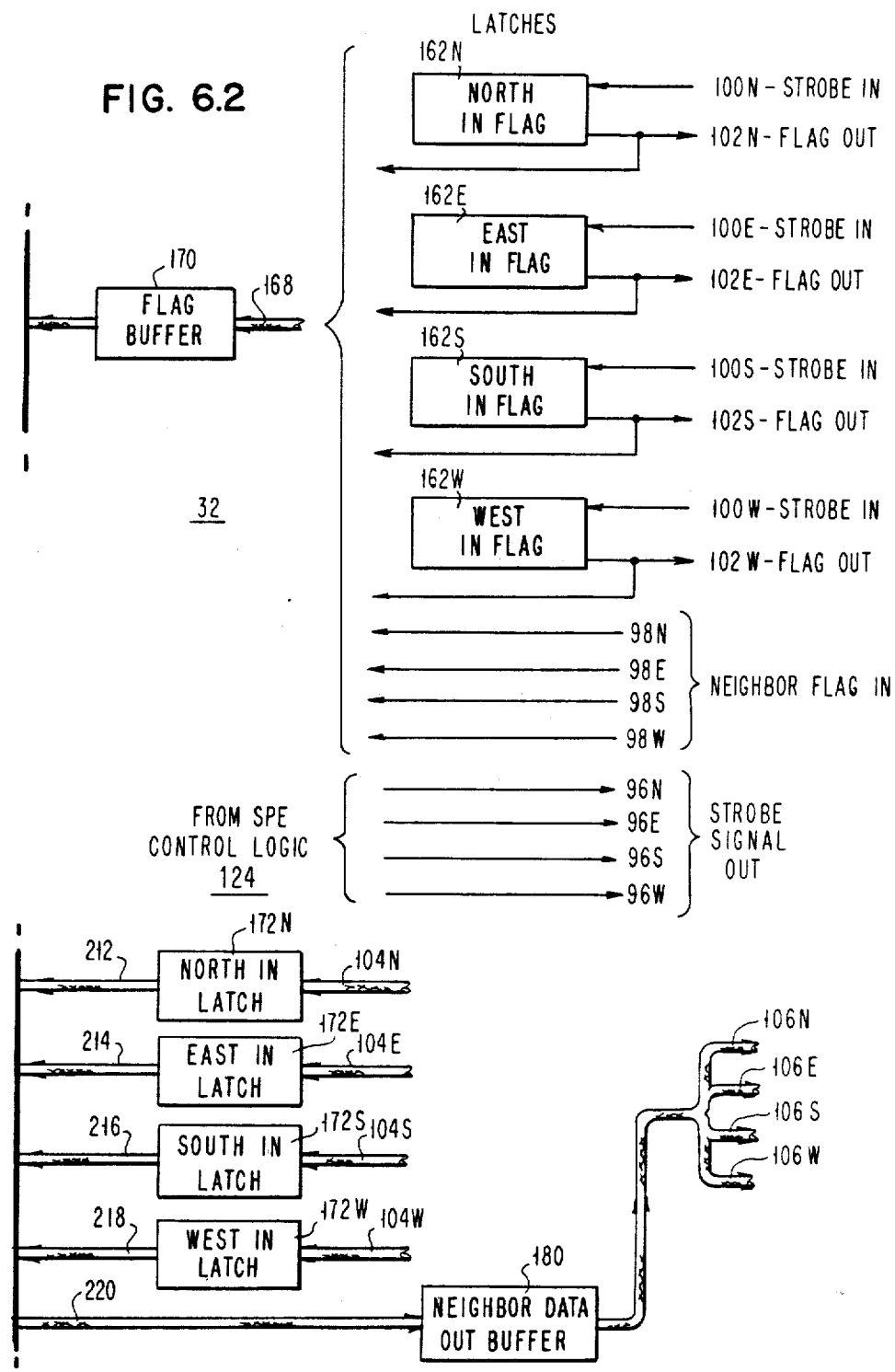
FIG. 6.2

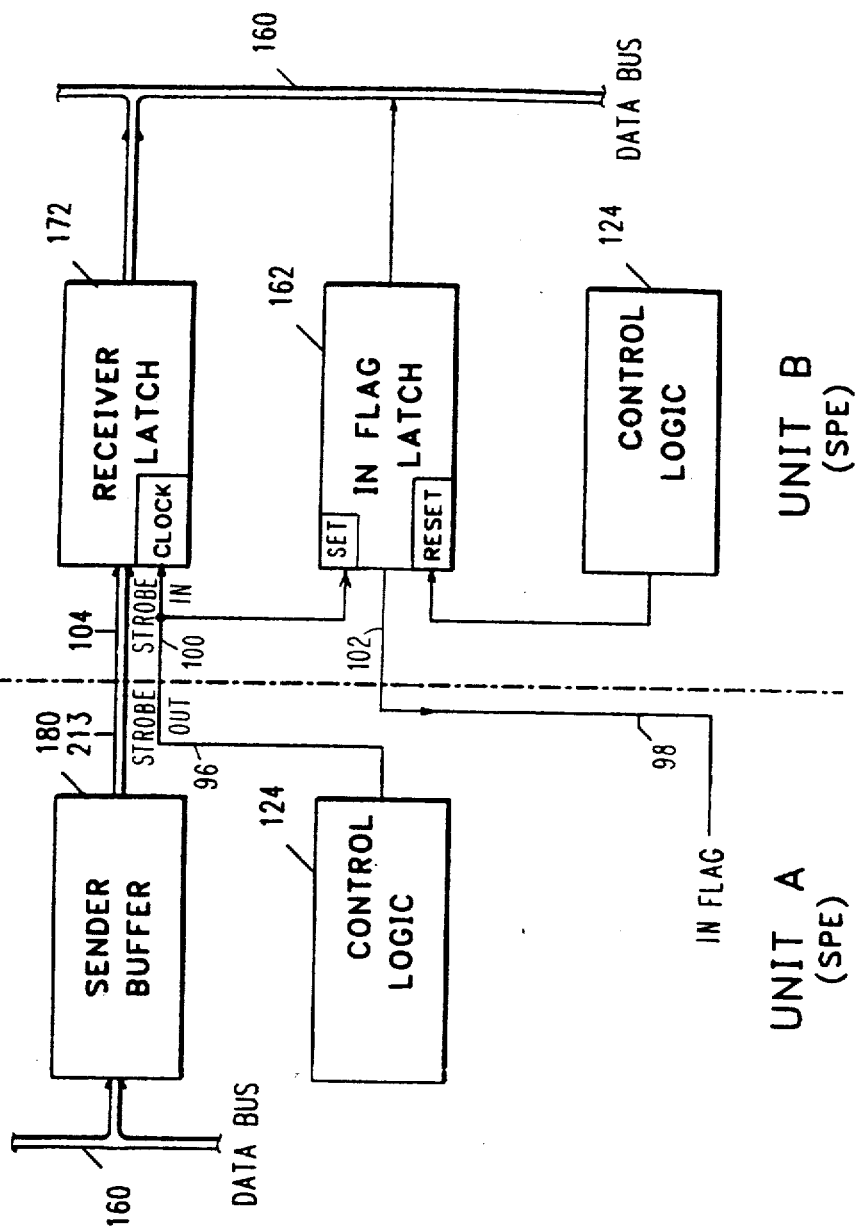

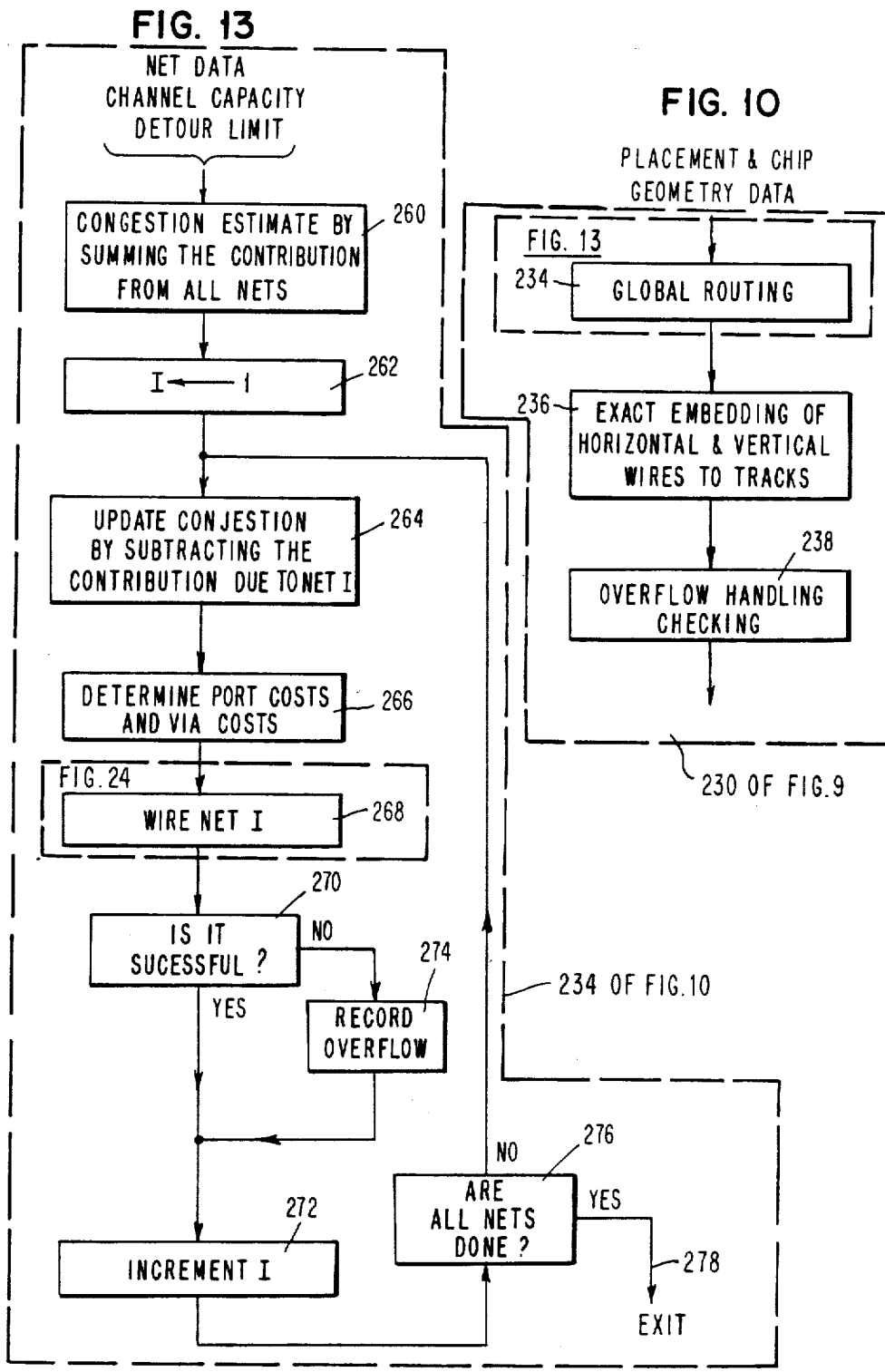

MASTER SLICE/GATE ARRAY CHIP GEOMETRY

DETAILS OF A CELL 242

CONGESTION ESTIMATE

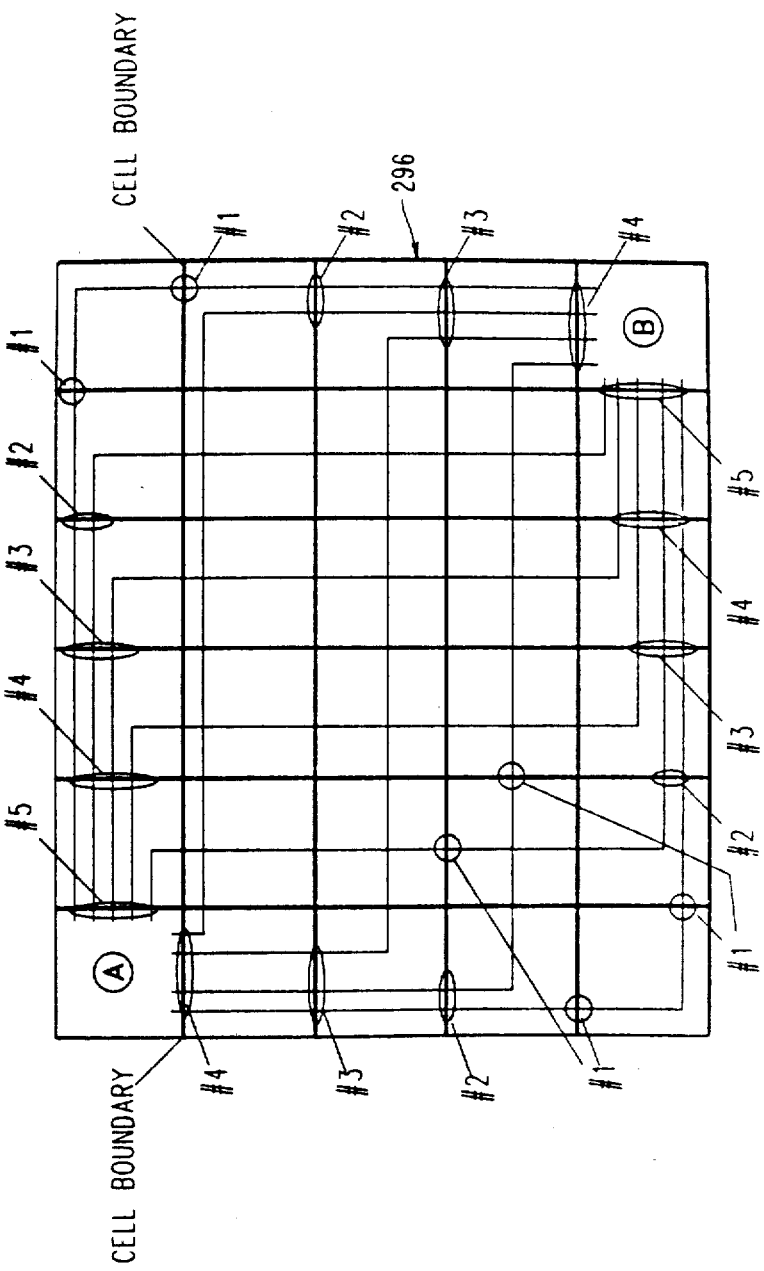
FIG.15 ALL REASONABLE ROUTES BETWEEN A & B

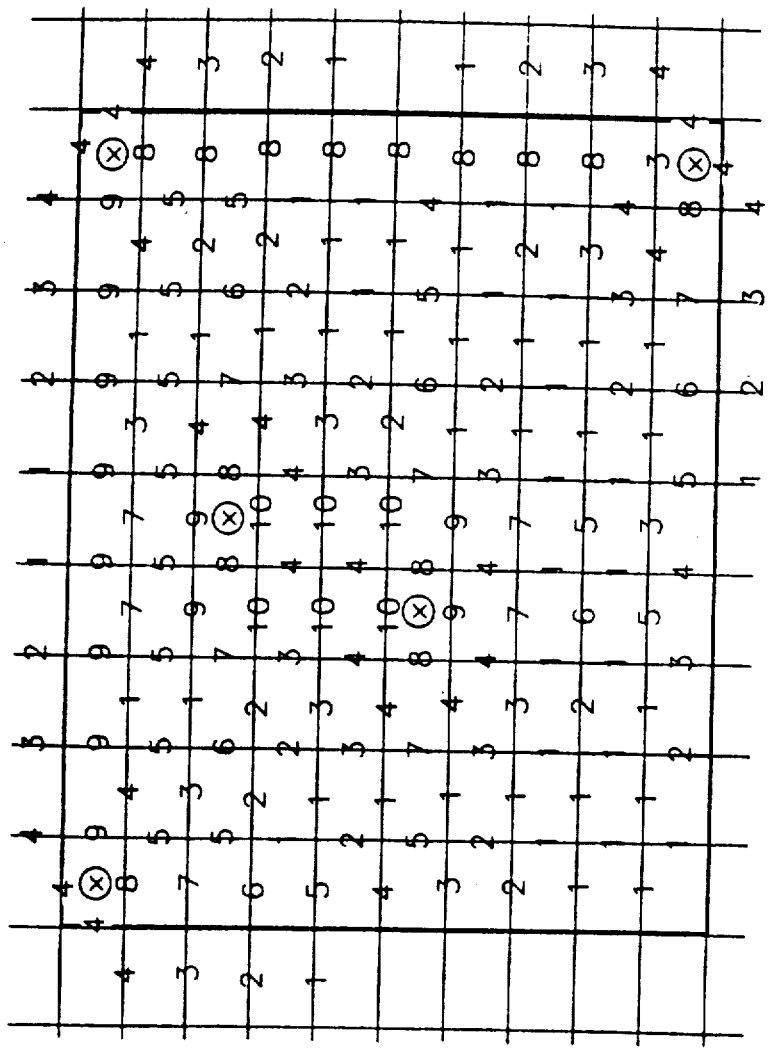

HORIZONTAL
CONGESTION
ESTIMATE

VERTICAL
CONGESTION
ESTIMATE

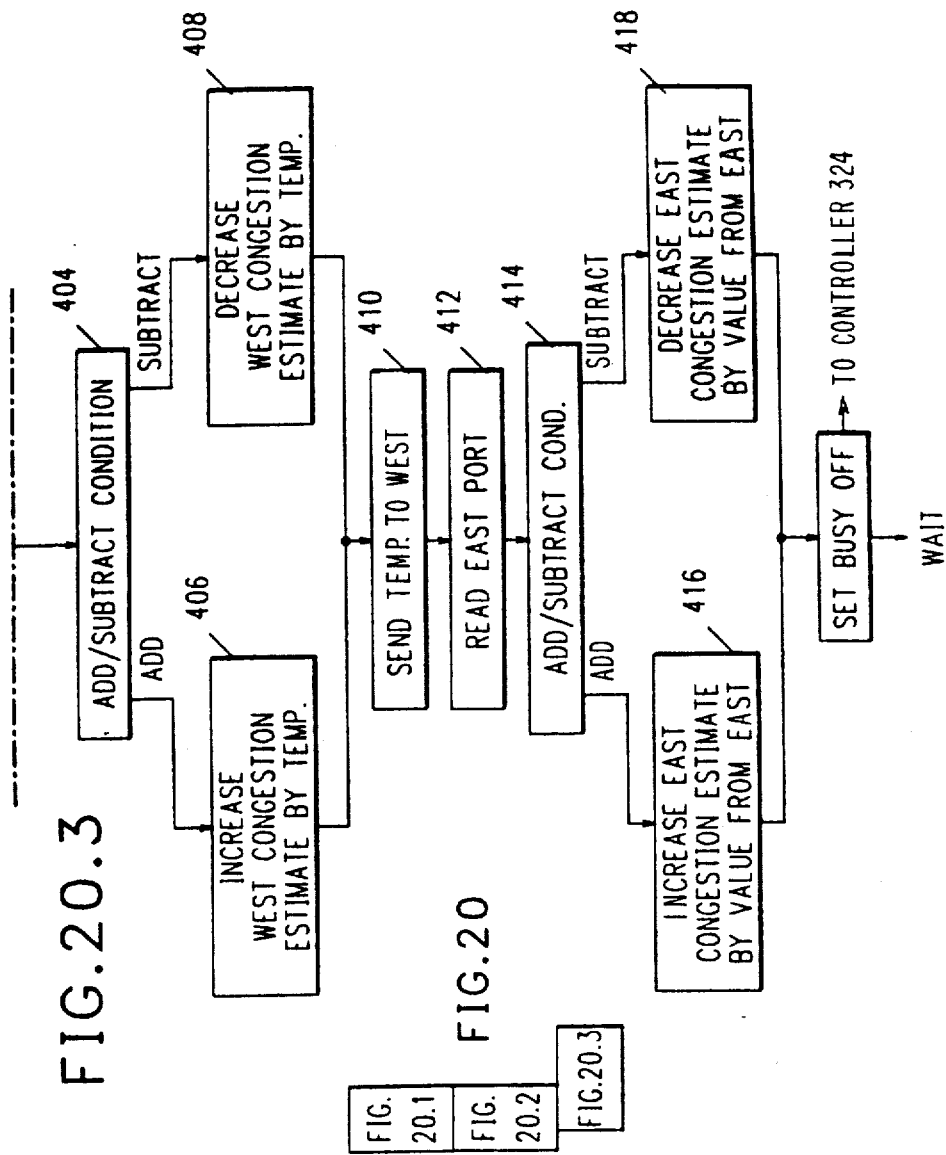
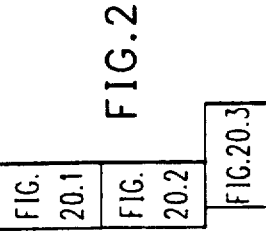
FIG.20.3
FIG.20

FIG. 20.1
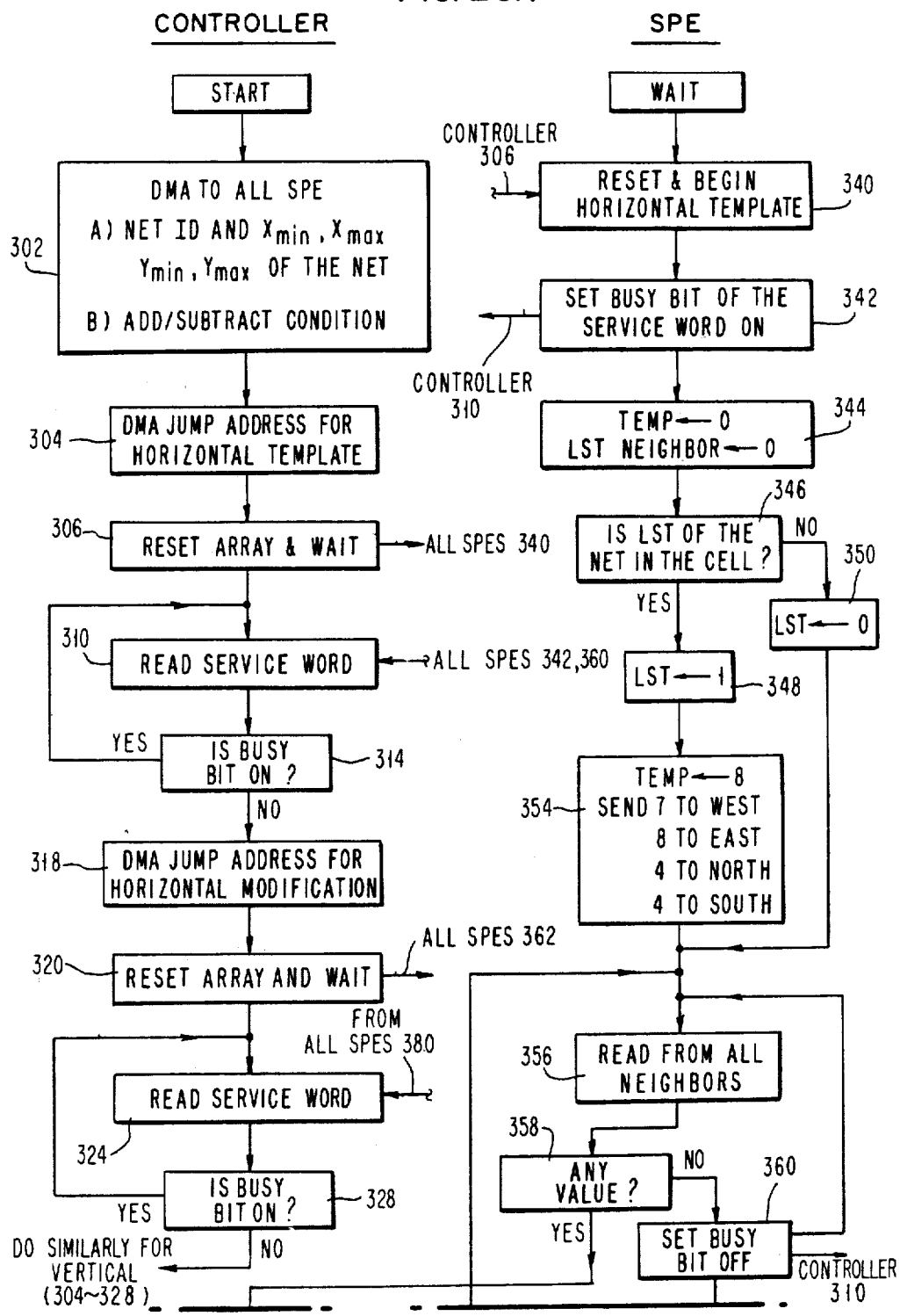

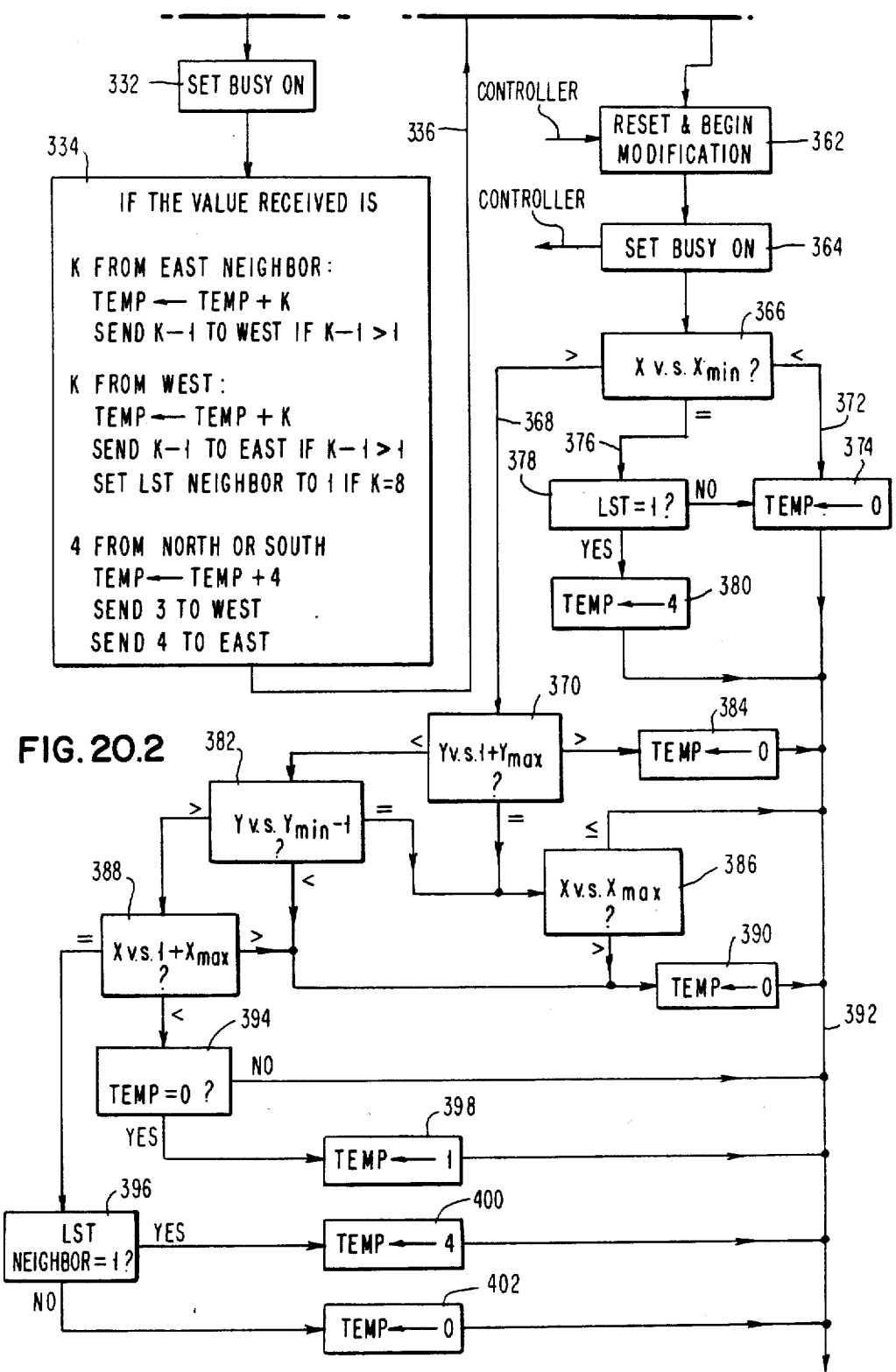
FIG. 20.2

THE PORT COST AS A FUNCTION OF CE & C

THE PORT COST IN 3D VIEW

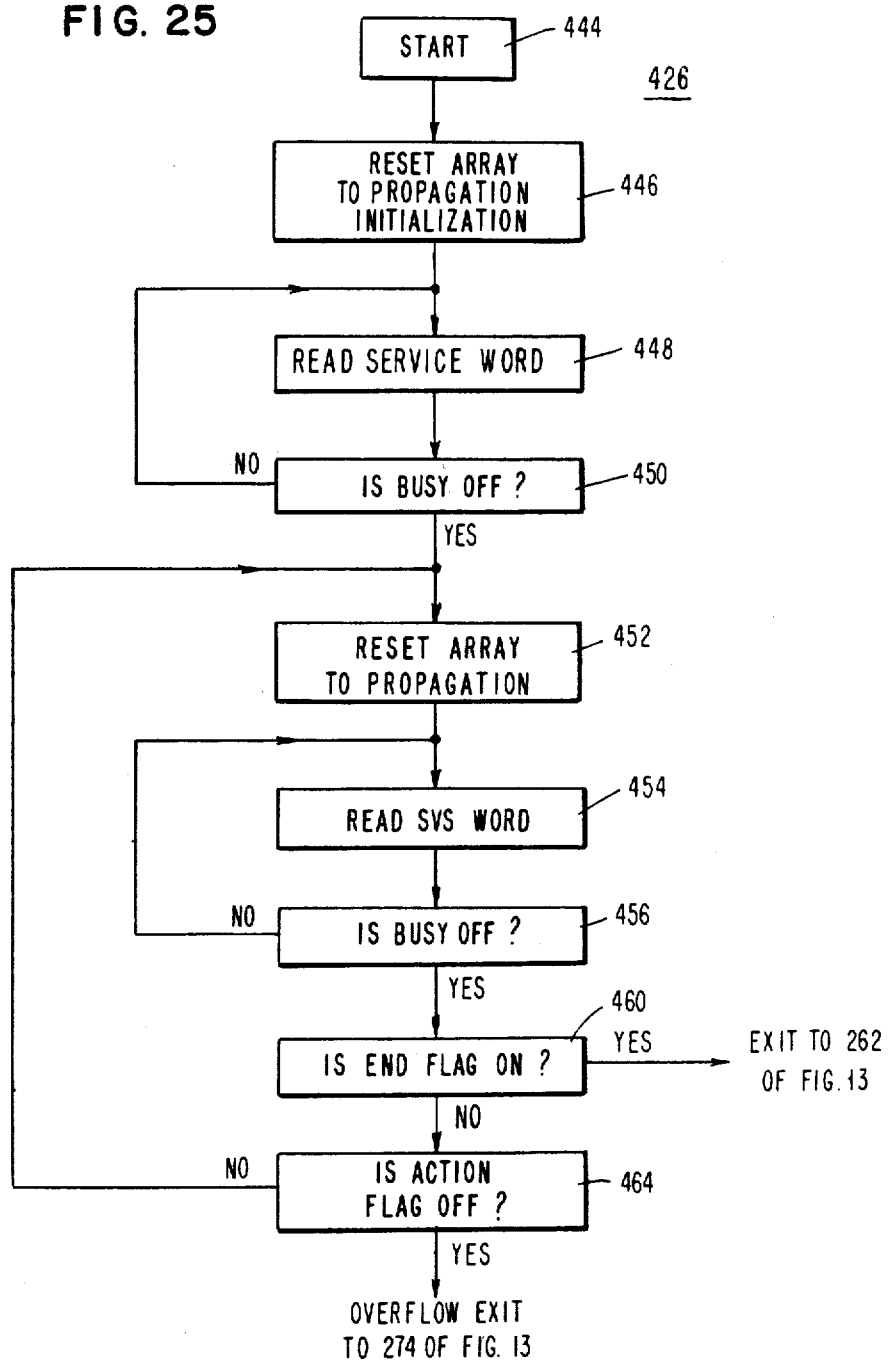

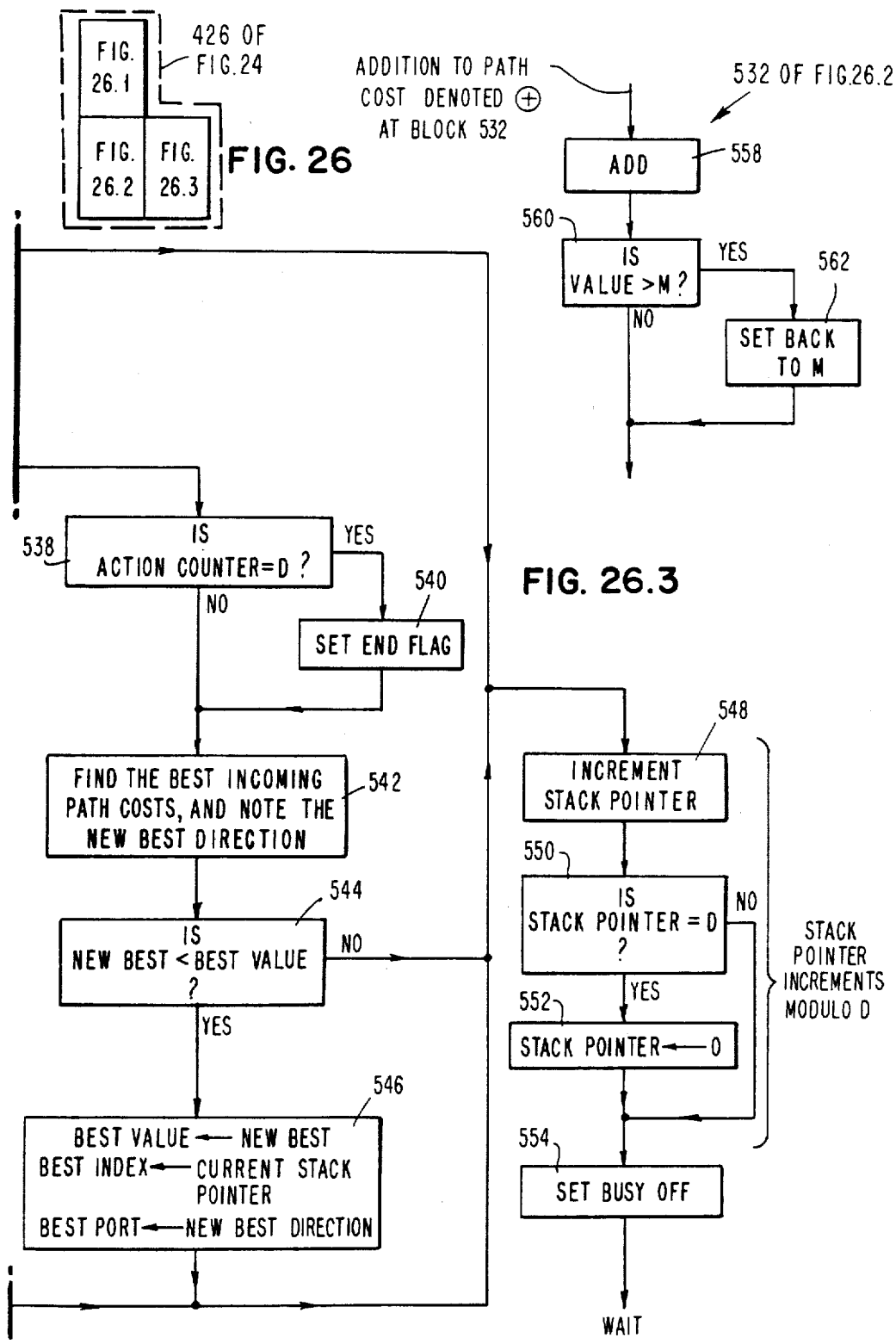

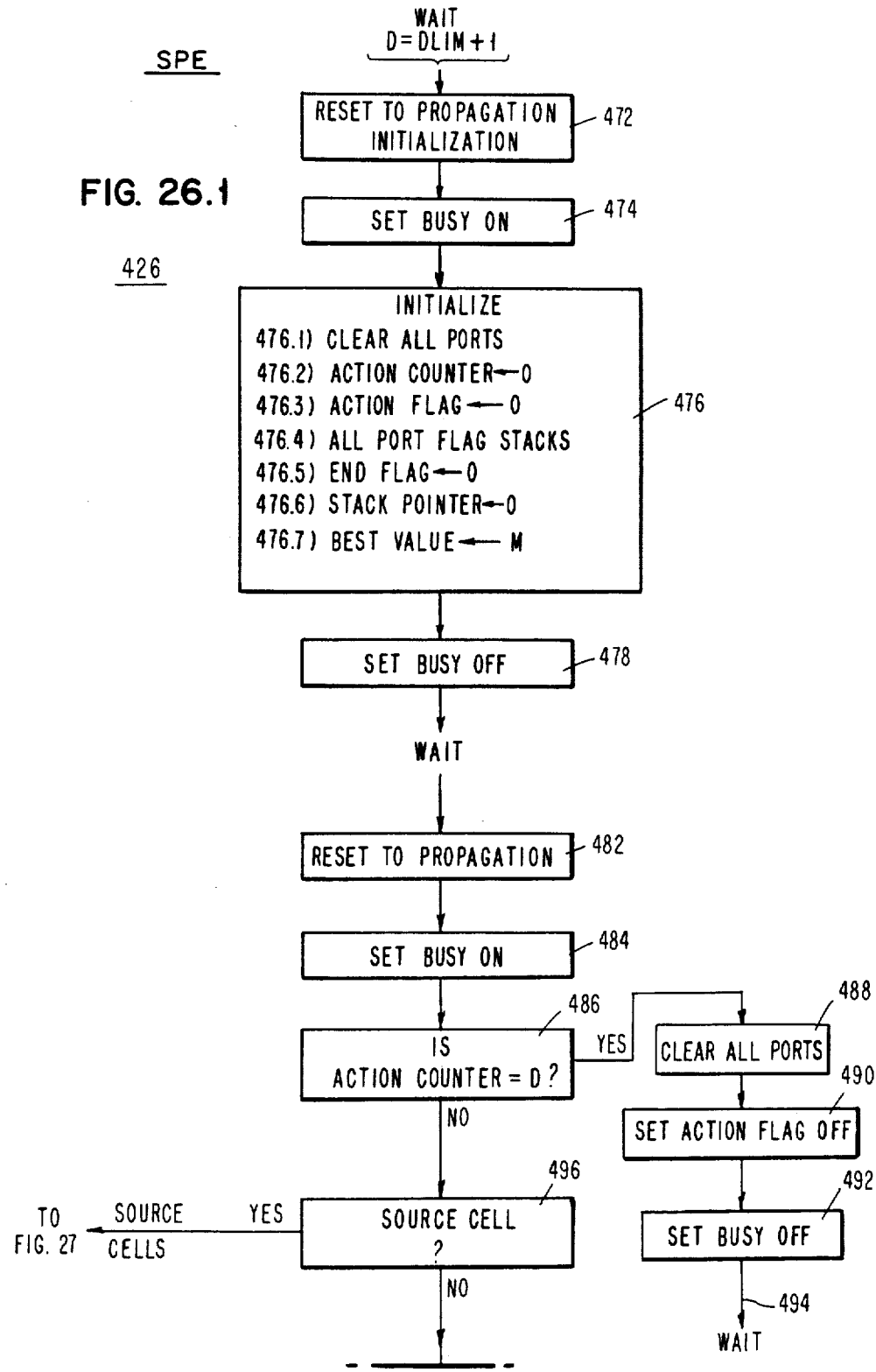
FIG. 26.1

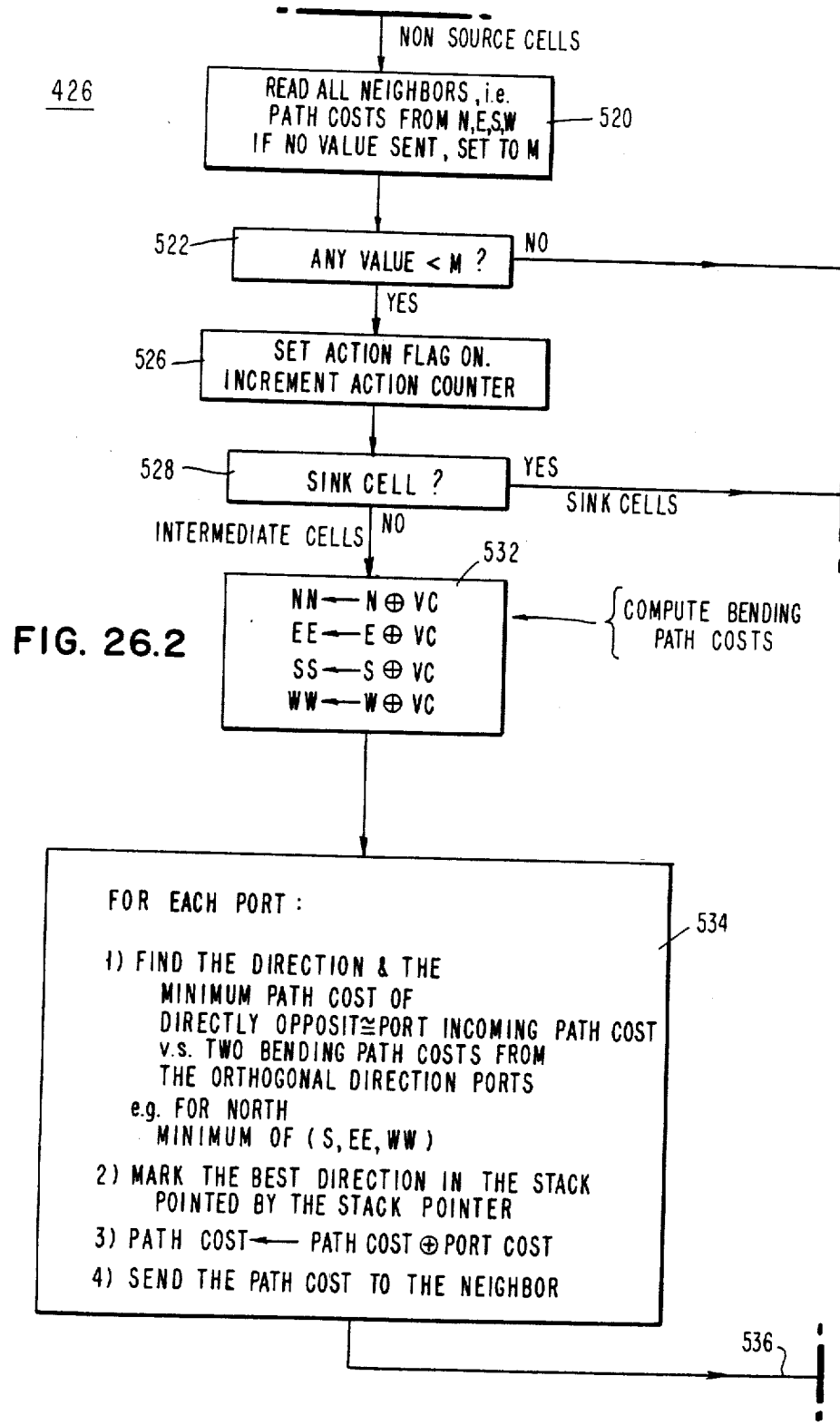
FIG. 26.2

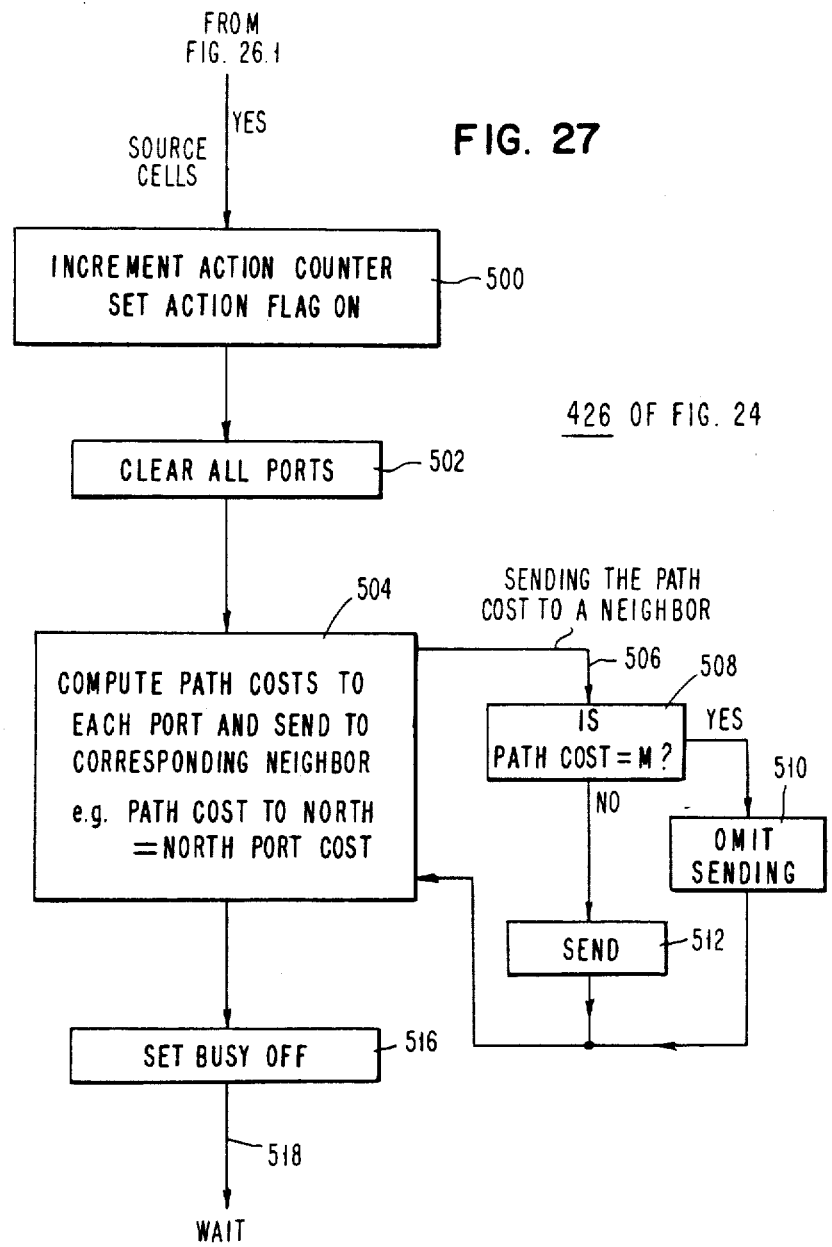

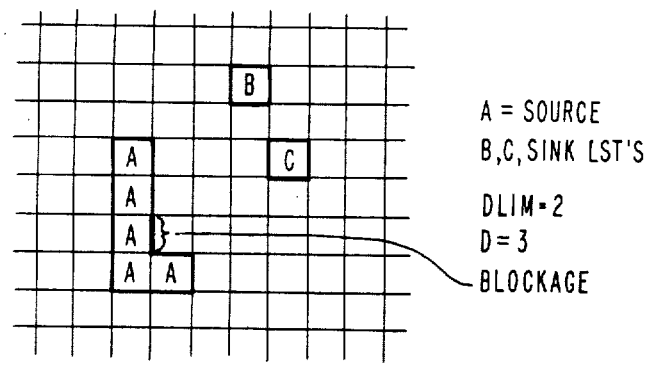
FIG. 28.1
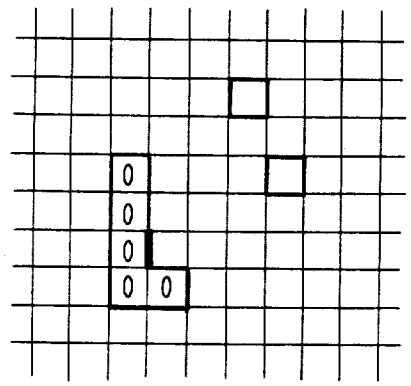
FIG. 28.2
1ST. PASS
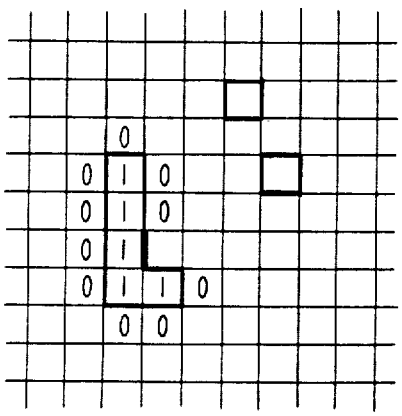
FIG. 28.3
2ND. PASS

FIG. 28.4

3RD. PASS

FIG. 28.5

4TH. PASS

FIG. 28.6

5TH. PASS

SINK C
FIRST REACHED

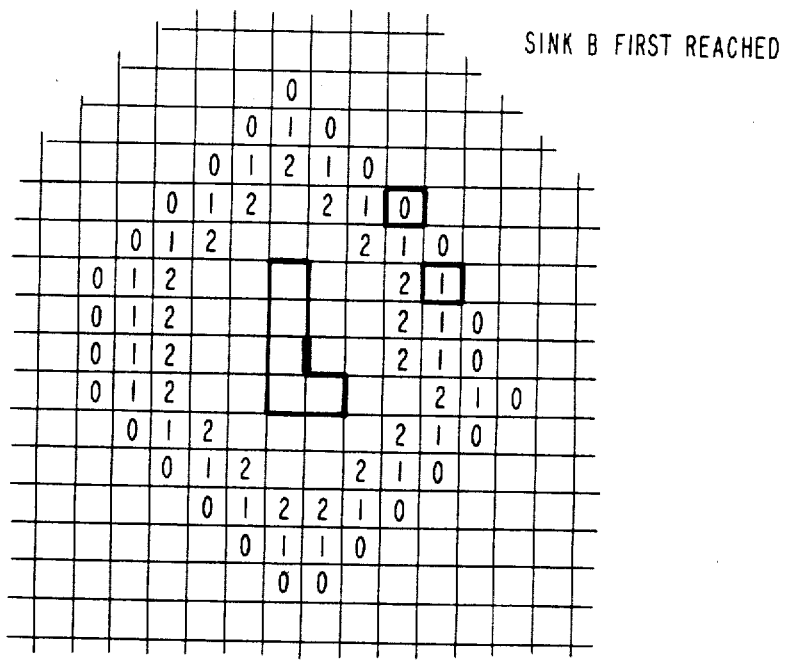
FIG. 28.7
6TH. PASS
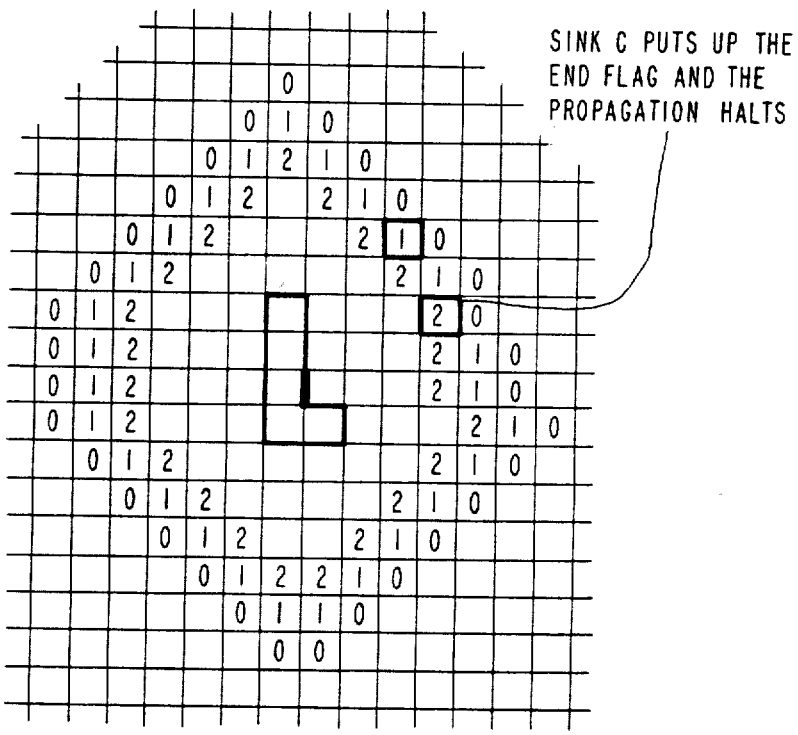
FIG. 28.8
7TH. & FINAL PASS

FIG. 29.1
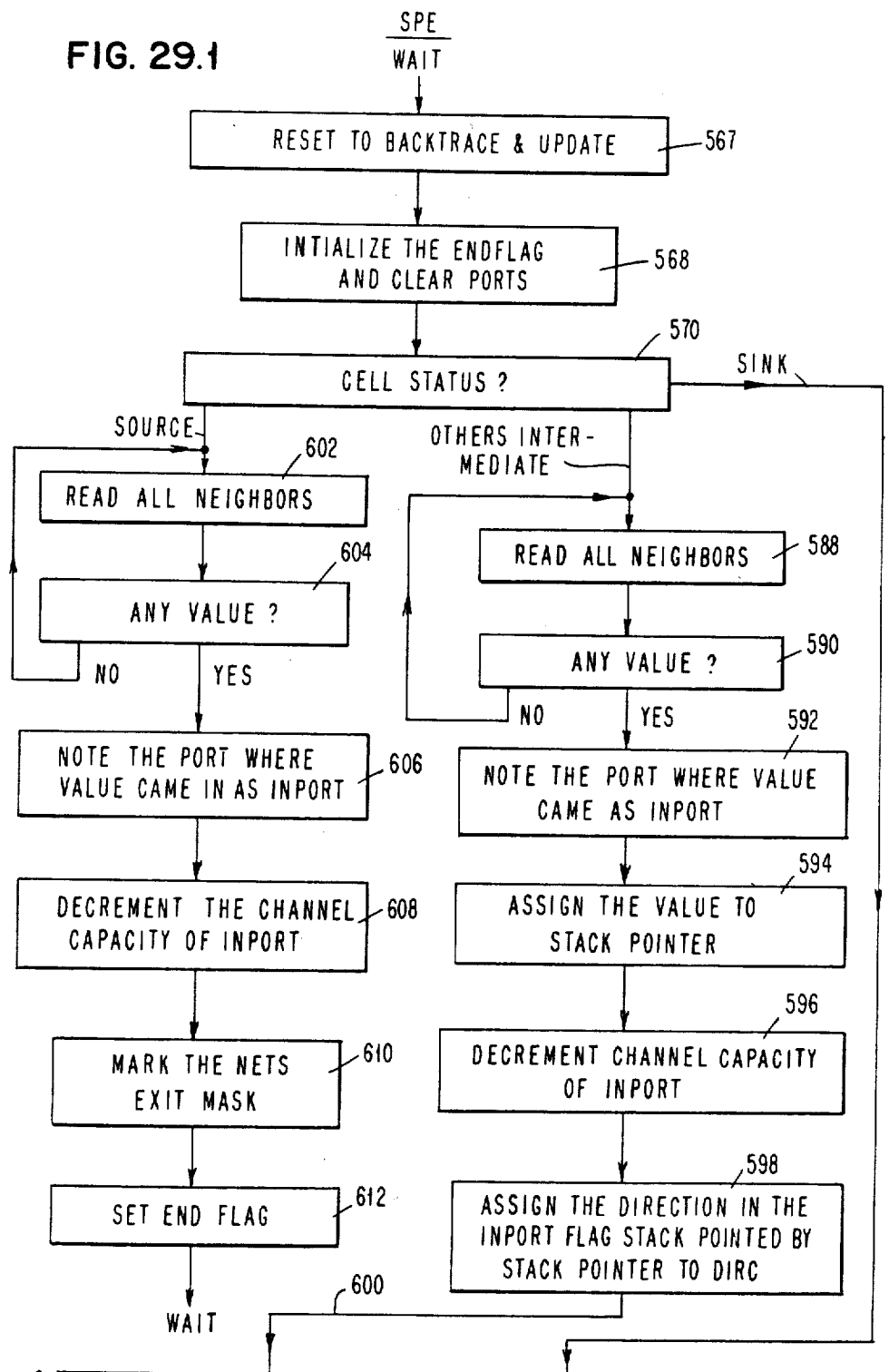

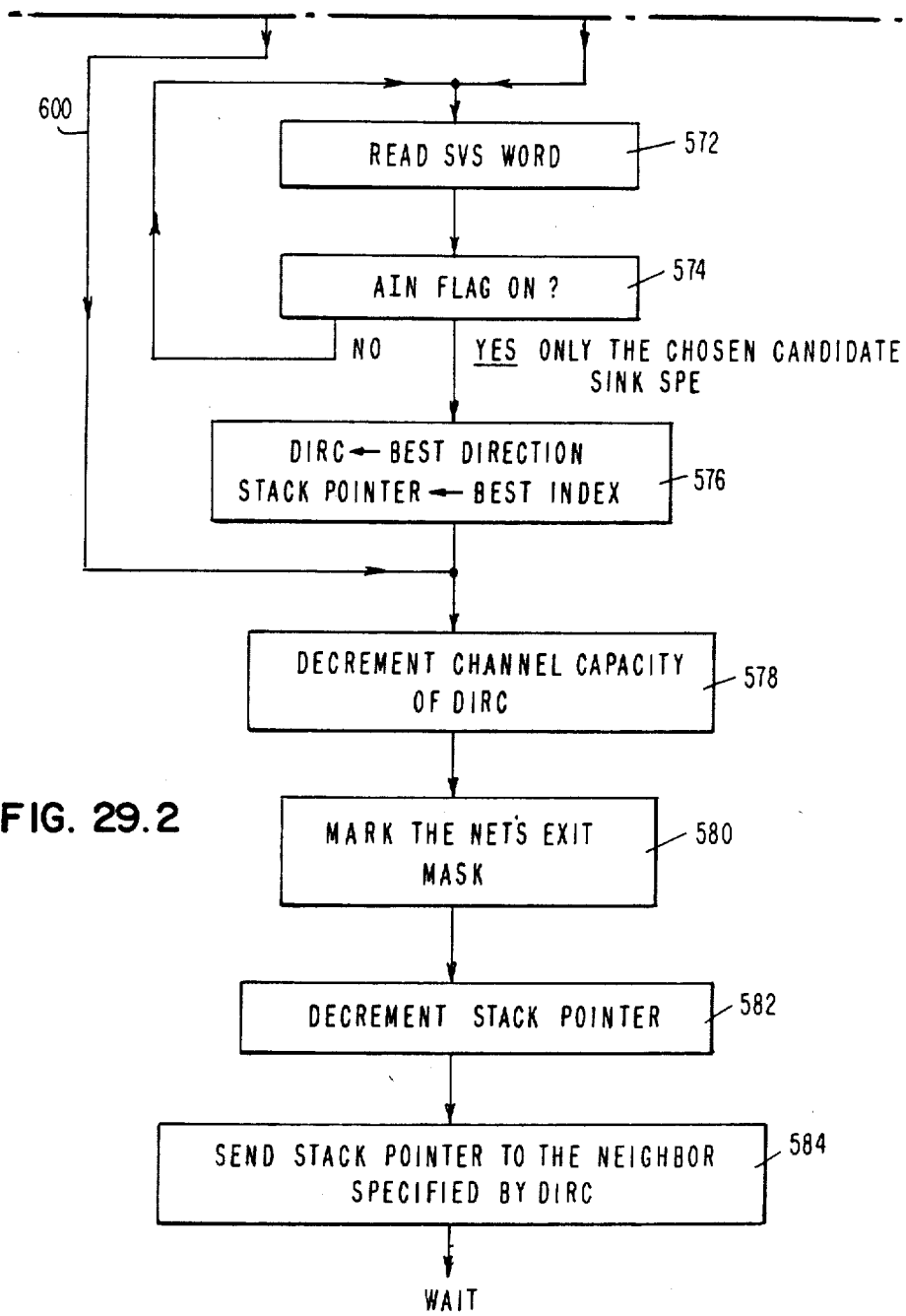
FIG. 29.2

CHIP/FRAME RELATION

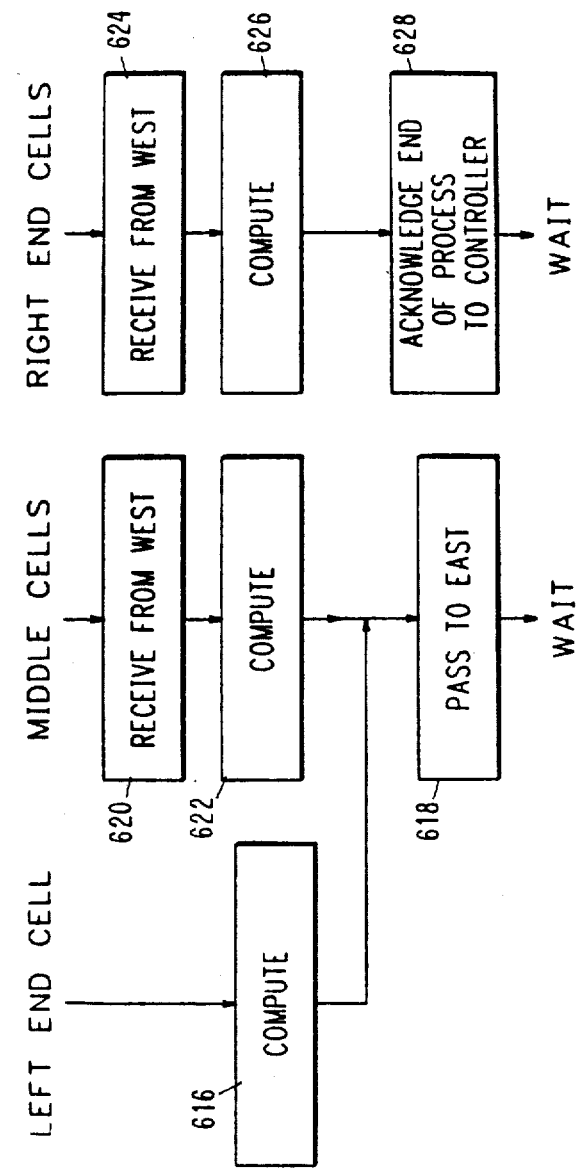

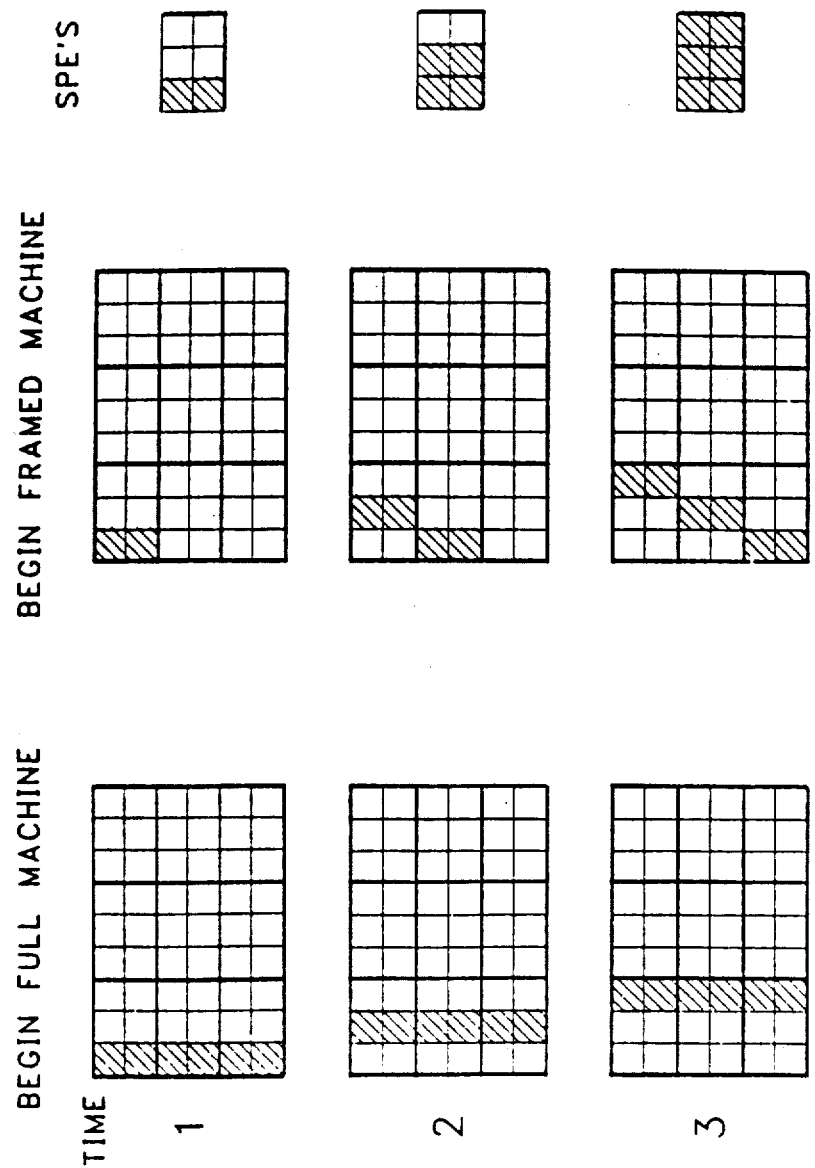
FIG. 32.1 SWEEPING PARADIGM

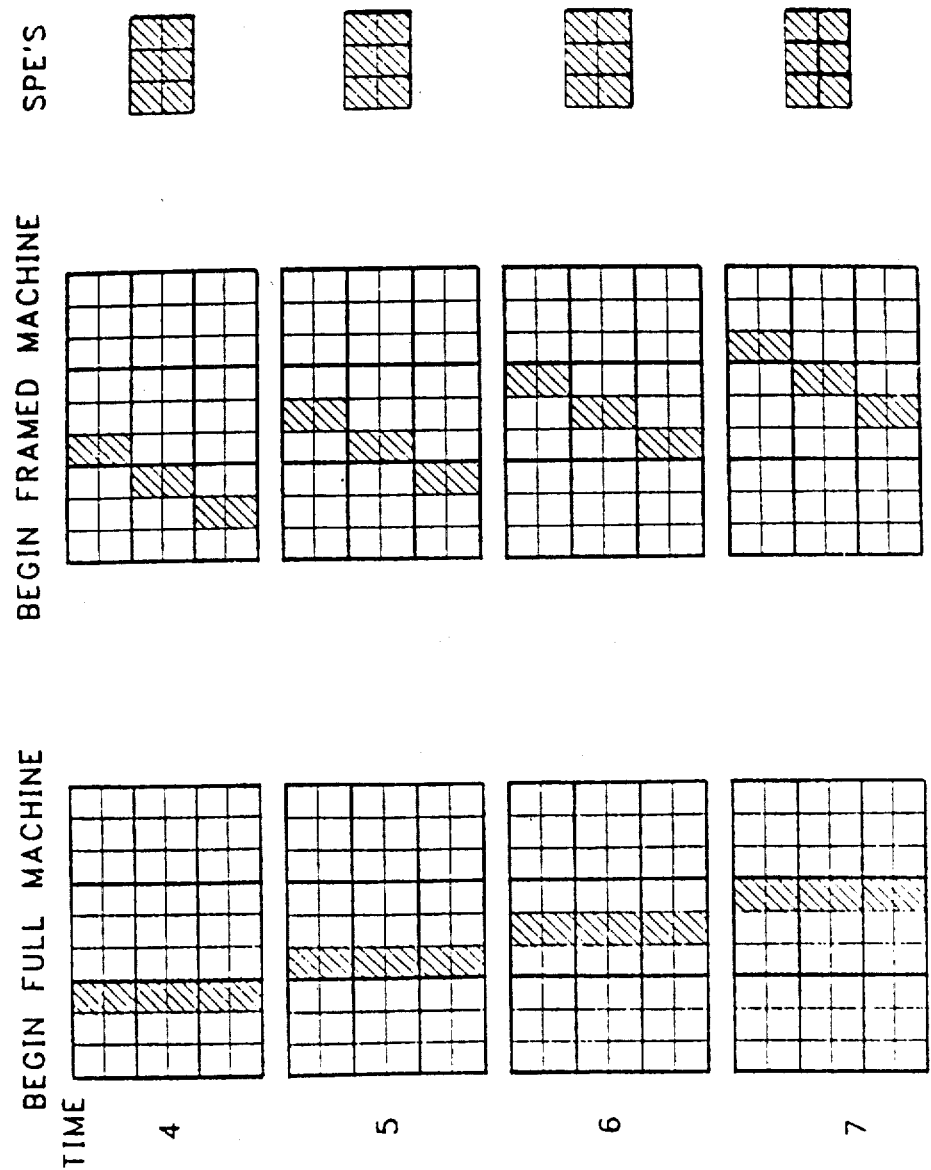
FIG. 32.2

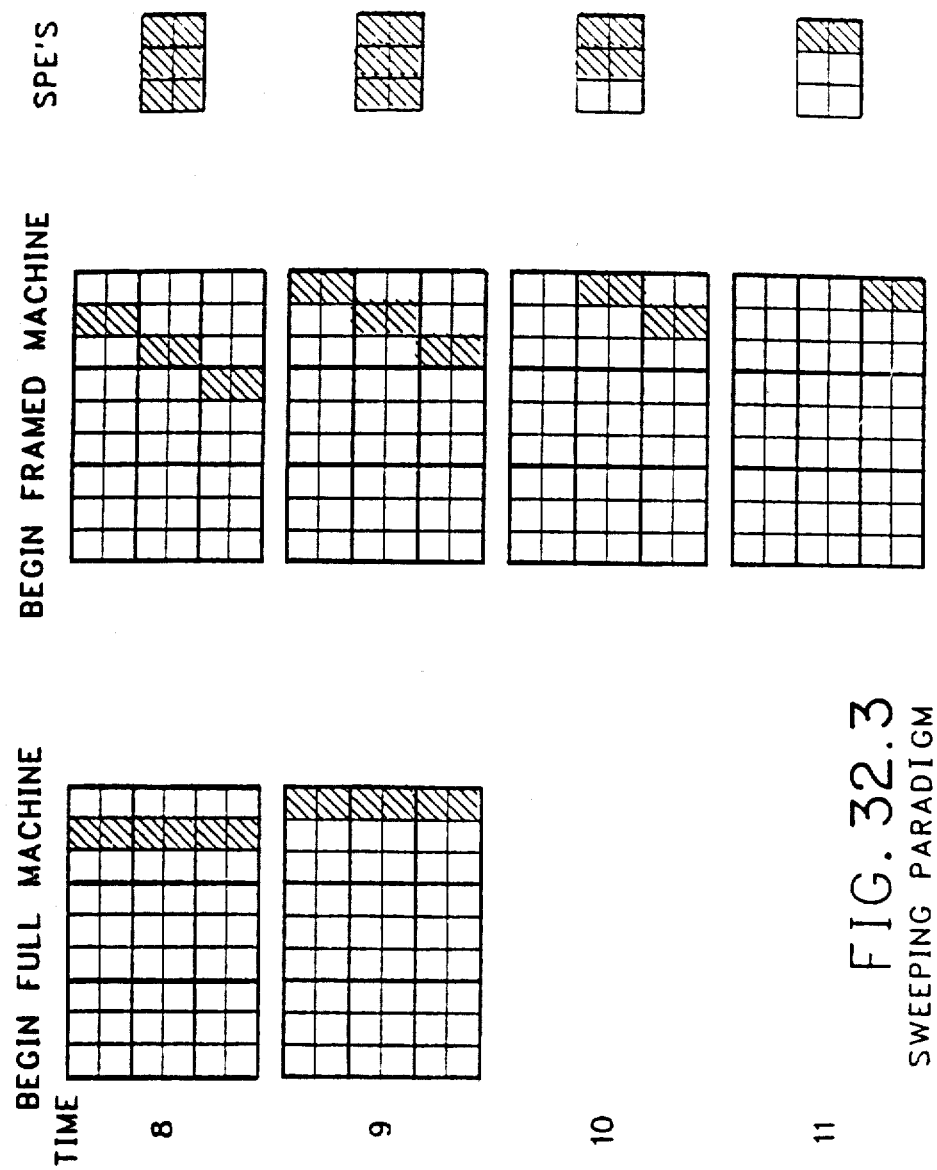
FIG. 32.3
SWEEPING PARADIGM

PARADIGM E

PARADIGM E
INDICATES WHEN THE CELL IS PROCESSED

HIGH SPEED MACHINE FOR THE PHYSICAL DESIGN OF VERY LARGE SCALE INTEGRATED CIRCUITS

This is a division of application Ser. No. 272,880 filed June 12, 1981 now U.S. Pat. No. 4,484,292.

TECHNICAL FIELD

The invention is in the field of physical design of large scale integrated (LSI) and very large scale integrated (VLSI) circuits, and especially the interconnection and wire routings between the circuits formed on a chip. In particular, apparatus is set forth for determining the wire routings in a LSI or VLSI circuit structure comprised of cells, wherein the cells are composed of electronic devices functioning as a logic gate: groups of cells may be interconnected to function as flip flops, shift registers and the like. A supervisory controller communicates with n, where n is an integer, identical multi-port processors, with one processor dedicated to each cell, for determining the wire routings between the respective cells. Each processor communicates simultaneously with its 4 adjacent neighbor processors to determine channel routings from one point to the next in the array of cells, wherein a channel routing includes vertical and horizontal paths. Following determination of global channel routings, exact vertical and horizontal tracks for the wire paths are assigned, and then overflow routing is considered. Timing analysis, placement, shape generation and checking may also be obtained from the apparatus by a judicious use of its parallel computation power in appropriate manners.

Current practice in the physical design of all LSI structures with less than 1000 cells requires the use of high speed computing machines for long periods of time, for example, 20 minutes to an hour of central processor (CPU) time. In the next generation of very large scale integrated (VLSI) systems, the computing time may take far more than 2 to 5 hours of CPU time for 5,000–50,000 circuit master-slice chips having 15,000–150,000 connecting wires. This could result in turn-around time of at least a day on a non-dedicated system. Considering the fact that wiring may have to be repeated several times for the same chip due to engineering changes, a significant reduction of this time is very beneficial. A reduction in total time spent in the physical design automation efforts, and in system development time, results in decreased production costs and other market benefits. Faster wiring provides a fast engineering change capability due to the decreased turn-around time. An interactive design capability in conjunction with this high speed wiring completes the total design in a shorter period.

Many of the LSI chips currently in use have symmetric configuration for the layout of components and wires, and these chips are termed gate array or master-slice chips. A master-slice chip consists of an array of active circuit areas on one plane with wiring channels running between these active areas in orthogonal directions on separate planes. Pins or vias running orthogonally to both planes are used to effect connections between the planes. The part of the physical design automation system which determines the appropriate routing of the various wires in the system is termed the wiring operation.

A careful analysis of the functions involved in the wiring operation indicates that many of the operations currently being performed in serial manner can actually be performed concurrently. The performance of the operation is hence limited by the incapability of the host machine to perform concurrent operations.

The wiring operation contains a few steps which are repeated a significant number of times, and these operations invariably involve a large number of instructions in the conventional CPU. Due to the frequency of these operations, the speed of wiring can be improved considerably if these specific operations are speeded-up. In view of these circumstances, the wiring calculations may be performed efficiently and economically by utilizing a special purpose high-speed machine having the characteristics of being capable of performing many operations in parallel and performing repetitive operations which slow the wiring operation performance of a CPU by specialized hardware implemented in each of a plurality of processing elements.

The VLSI physical design machine according to the present invention is array structure composed of a plurality of microprocessor-like special processing elements (SPEs) arranged in an n by n matrix corresponding to a master-slice chip image. That is, there is a SPE associated with each cell of the chip. Each SPE corresponds to a channel intersection and adjacent active components on the master-slice chip. Each SPE contains both logic as well as memory components, and hence is a microprocessor-like element. Unlike a conventional-general purpose microprocessor, each SPE has built into its hardware those specialized functions corresponding to the sequences of instructions on a general purpose machine which are performed repeatedly. Thus, the element can be designed to perform each sequence in minimum number of machine cycles, preferably one such cycle. By custom design, a SPE can be designed as a single VLSI chip with about 100 pins and a cycle time of 100 nanoseconds or less. Each SPE communicates only with its four adjacent neighboring SPEs in addition to the supervisory control unit.

The supervisory control over the array of SPEs may be either hierarchical or global. In the former, groups of local SPEs communicate with an element of a smaller array of controlling elements which in turn communicate among each other and to a high controlling mechanism. In the global scheme, all the SPEs directly communicate with a central supervisor which controls the loading and unloading of information as well as task assignment. The central supervisor must be able to broadcast as well as address individual or groups of elements.

BACKGROUND ART

There are several techniques known for the production of mass patterns for integrated circuits of standard cells, however, the following art set forth is not directed to the wiring techniques between cells of VLSI systems.

U.S. Pat. No. 4,093,990 to Koller et al sets forth an exemplary method of producing mass patterns for integrated circuits composed of standard cells. The cells are first grouped in a predeterminable number of cell groups in such a way that as few connections as possible extend between the groups, and the space requirement of the individual groups is equal.

U.S. Pat. No. 3,653,070 to Hill et al sets forth a method of producing art work for a logic circuit to be fabricated by printed circuit board techniques. The art work is produced by a data processing machine programmed to run a package routing, a placement routine and a routing routine in addition to check routines.

The following U.S. Patents and Defensive Publication set forth various techniques for producing mass patterns and the like for integrated circuits. These are U.S. Pat. Nos. 3,567,914; 3,575,588; 3,601,590; 3,603,771; 3,653,071; 3,653,072; 3,654,615; 3,968,478; and Defensive Publication No. P940,020.

There are several techniques known for utilizing rectangular digital logic arrays for performing transformations on data matrices for solving wave equations, image processing problems and the like. However, there is no array processing art known to the applicants directed to semiconductor component physical design and wire routing.

U.S. Pat. No. 4,215,401 to Holsztynski et al relates to digital array processors of the type having a plurality of identical interconnected cells which perform sequential transformation operations on data matrices under the control of a central processor and more particularly to unique forms of cell construction and interconnection between the processing cells. The array processor set forth is a single instruction multiple data flow (SIMD) machine, which communicates with its 4 neighbors by sequential shift registers, thus not allowing simultaneous access. Control is centralized rather than autonomous on an individual basis as required for VLSI design. Internal nodes in the array cannot be independently selected, that is, there is no independent X/Y select mechanism. Therefore, the array of procesors described, would not be useful in VLSI or physical design.

U.S. Pat. No. 3,979,728 to Reddaway sets forth an array processor, operative as the peripheral of a conventional computer. Each processing element is organized on a bit-serial basis, with single-bit registers and a bit-addressable store, and the array is controlled by a microprogrammed main control unit. Thus, Reddaway is a SIMD machine like Holsztynski et al. Reddaway selects one row and one column in the array at a time, rather than multiple column and row selection at a given time.

SIMD processing apparatus has been described in the SOLOMON computer (Slotnick et al., Fall Joint Computer Conference 1962, page 97; Gregory et al., IEEE Transactions on Electronic Computers, Dec. 1963, page 774). This apparatus consists of an array of relatively simple processing elements, each of which is arranged to perform arithmetic operations upon input data in a bit-serial manner. A development of this is the ILLIAC IV Computer (Barnes et al., IEEE April 1972, page 369).

An article entitled, "Automatic Gate Allocation Placement and Routing" by Stephan C. Hoffman in the Computer-Aided Design of Digital Electronic Circuits and Systems, North-Holland Publishing Company, 1979, sets forth algorithms used for automatic gate allocation, placement and routing for VLSI networks. The algorithms route one net at a time and do not consider the consequences of the current path route on the routability of future paths.

According to the present invention, apparatus is set forth determining the wire routings in a VLSI circuit structure comprised of cells, in which a plurality of routes for a plurality of nets is considered concurrently, with the consequence of a given path being considered relative to the routability of other paths by performing congestion estimates. This is accomplished by a supervisory unit communicating with an array of identical multi-port processors with one processor dedicated to each cell in a VLSI chip. Each processor operating in an MIMD mode communicates simultaneously with its 4 adjacent neighborhood processors, to concurrently perform congestion estimates and to determine channel routings from one point to the next in the VLSI array, wherein a channel routing includes vertical and horizontal paths.

BRIEF DESCRIPTION OF THE DRAWINGS

FIG. 2 is a block diagram of a physical design system according to the invention;

FIGS. 3.1 and 3.2, viewed with FIG. 3.1 on the left and FIG. 3.2 on the right, is a block diagram of the array I/O processor 34 of FIG. 2;

FIGS. 6.1 and 6.2, viewed with FIG. 6.1 on the left and FIG. 6.2 on the right, is a block diagram representation of the SPE 32 set forth in FIGS. 2 and 5;

FIG. 8 is a block diagram representation of the mail box flag mechanism utilized for communication between two SPEs;

FIG. 10 is a detailed flowchart of the wire routing logic block 230 of FIG. 9;

FIG. 13 is a detailed flowchart of the global routing logic block of FIG. 10;

FIG. 15 is a schematic diagram illustrating all of the plausible wire routes connecting two points in cells A and B;

FIG. 17 is a template pattern illustrating a congestion estimate for a net with 5 logic service terminals (LST);

FIGS. 20.1, 20.2 and 20.3 when viewed as shown in FIG. 20 is a detailed flowchart of the physical design system illustrating how the controller 20 and SPEs 32 of FIG. 2 logically proceed to determine a congestion estimate for the specific wiring paths;

FIG. 25 is a detailed flowchart of the controller operation for logic block 426 of FIG. 24;

FIGS. 26.1, 26.2 and 26.3 when viewed as shown in FIG. 26 is a detailed flowchart of logic block 426 of FIG. 24;

FIG. 27 is a detailed block diagram also directed to the logic block 426 of FIG. 24;

FIGS. 28.1-28.8 constitute the steps taken in an activity pattern relative to the propagation of path costs;

FIGS. 29.1 and 29.2 when viewed with FIG. 29.1 on the top of FIG. 29.2 is a flowchart of the SPE operation to perform the functions of logic block 435 in FIG. 24;

FIG. 31 is a flowchart for the paradigm for the row sweep action in the full size physical design machine;

FIGS. 32.1-32.3 is a time sequence of a sweeping paradigm of a framed machine, illustrating how the rows of successive frames are processed in a pipeline mode;

DISCLOSURE OF THE INVENTION

Method and apparatus is set forth for physical design of large scale integrated circuit structure comprised of an array of logic elements. A supervisory device communicates with an array of identical multi-port processing means, with one such processing means being dedicated to each logic device for determining the wire routing between the various logic elements. Each processing means communicates simultaneously with its 4 adjacent neighboring processing means to perform various computations to determine such things as channel routings from one point to another in the array, wherein a channel routing includes vertical and horizontal paths. Following the determination of optimal channel routings, vertical and horizontal exact paths are determined next, with overflow routings then being considered.

BEST MODE FOR CARRYING OUT THE INVENTION

Figure 1:
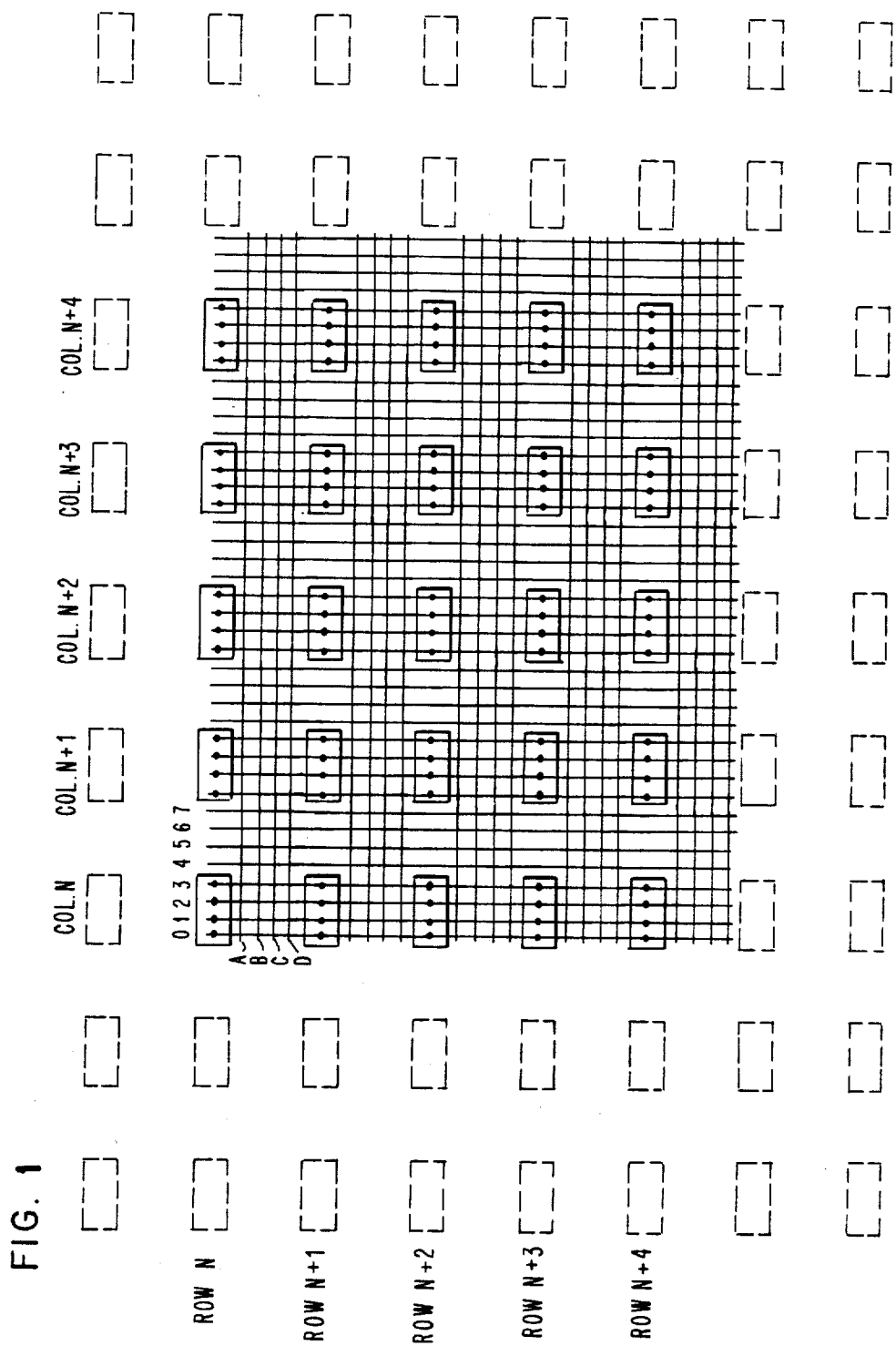
FIG. 1 is a schematic diagram of a master-slice chip having an n by n array of logic devices formed thereon.

A system of multi-port processors is set forth in conjunction with a supervisory unit, which is used to interconnect an array of logic devices that have been formed on a substrate. With reference to FIG. 1, an n by n array is illustrated, and the logic device at an intersection of a column and a row includes a plurality of terminals called logic service terminals (LST), for example, 4 terminals numbered 0, 1, 2 and 3. This logic device, and the other devices in the array, for example, may be a register, flip flop, gate network such as a NAND, OR, NOR or the like. For example, the device illustrated could be a three input NAND device or some other device that has 4 terminals.

The number of terminals is exemplary, as some logic devices may have more or less than 4 terminals. For example, in the case of an inverter, only two of the four terminals are used. Associated with each logic device there is a provision for horizontal and vertical wire tracks in successive layers. Directly above the logic service terminal is a layer of insulation. Above the insulation, vertical wires may be deposited as needed by the circuit. If any of the logic service terminals on the logic device need to be connected to the vertical conductors, a vertical pin or via is formed, thus joining a vertical wire through the insulation to logic service terminal. While the vertical wires are numbered from 0-7, it is to be understood that this number is only exemplary and that the number of vertical wires may be less or greater than shown. Another layer of insulation is laid down so that the horizontal conductors can be deposited on top of this second layer of insulation. These horizontal wires can then be connected to vertical wires by means of pins or vias inserted at the intersection of horizontal and vertical wires which penetrate the insulation between them and join the horizontal and vertical wires together. These circuit fabrication techniques are well known in the art, and are not described in detail, since the essence of the invention is in determining wire paths between the respective logic devices. Four horizontal wire tracks A, B, C and D are illustrated, but it is to be appreciated that more or fewer, such wire tracks may be utilized in the practice of the invention. A channel here refers to a plurality of wiring tracks associated with a logic device in the array. For example, the tracks 0-7 constitute a vertical channel of the chip illustrated in FIG. 1; and the tracks A, B, C and D constitute a horizontal channel. A device and its adjoining channel intersection has 4 boundaries, and such a bounded grid region is termed a cell of the array.

As previously set forth, a cell is identified by its row and column positions in the arrays. For each such logic device there is a special purpose multi-port processor (SPE) associated therewith. The operation of the SPEs will be described in detail shortly. Each SPE communicates with the supervisory machine which is called the "controller". The controller provides each SPE with information that it needs, and when each cell has completed its function as set forth by the controller, the controller then receives information from the cell. How SPEs determine the wiring paths connecting various logic service terminals will be described later.

As set forth above, each cell in the array is composed of horizontal and vertical channels and an active circuit component at each intersection of channels. Each channel has a specified number of wire tracks on which the signal wires must be routed between the respective circuit components to respective LSTs. Each cell has 4 boundaries with the neighboring cell, and the resulting bounded grid region is termed a cell. One SPE represents one such cell as set forth in the general scheme.

The most important step in wiring such a chip is the global channel allocation for every net to be wired. A net is defined as those terminal points that are to be made electrically common by wire connections. The global wiring routes all nets through available channels regardless of which specific track a given wire is to be assigned. The main constraint of the global allocation process is the channel capacity, that is, the available number of tracks at each cell boundary. The goal is to route all nets without violating the channel capacity and to minimize the total wire length. There are additional goals, such as to maximize the remaining channel capacity, i.e., to even out the track usage, if possible, to facilitate the follow-on processes of exact track assignments. The global wiring is accomplished utilizing a non-linear-cost maze running process which is to be described later. The global routing process finds a best cost route from the source wire to the sink points, within a detour limit (d) plus the shortest reachable distance.

Rapid advances in fabrication technology have made it possible to place tens of thousands of electronic circuits on chips measuring no more than a quarter of an inch per side. There are indications that the level of integration will keep getting higher at least in the near future. There remains, however, a gap between this sophisticated technology and the tools available to take advantage of this technology. Physical design refers to the technique by which the design of a digital system represented by interconnected logic gates is converted to patterns for a set of masks to be used in fabricating a chip or a set of chips for the system. Tools for physical design generally take the form of software packages aiding the various steps of the conversion. The three common separate, though by no means unrelated, steps are partitioning, placement and wiring. Partitioning refers to the process by which portions of a large design are allocated to different chips when a single chip cannot contain the entire design. The placement process places the components of a chip, commonly gates, within the chip. Often, the positions where these components may be placed are a set of well-defined slots, separated from each other by areas through which wires or metal segments may be run in order to interconnect the components. When such a structure takes the form of a rectangular array of slots, it is called a gate-array or a master-slice chip. The algorithms used to allocate the space between the components for the interconnection are contained in the wiring package.

The gap between physical design tools and the advancing technology arises due to the fact that the performance of the algorithms for partitioning, placement and wiring is not a linear function of the number of components on the chip but rather gets increasingly worse as the chip complexity increases. Algorithms which perform better in speed generally are less successful in producing good layouts, especially when the percentage of utilized space on the chip increases.

One way of improving the speed of algorithms without sacrificing wirability is to use faster machines on which the algorithms are executed. It is easy to wait for a new generation of high speed general purpose computers so as to execute the existing programs faster. It is more effective, though, to design a machine whose hardware takes advantage of some of the special characteristics of physical design algorithms. This will be illustrated by considering the wiring process.

Consider an array of computers arranged in a 2-dimensional matrix of size n×n. Each computer consists of a processor, a memory unit, one port to each of its adjacent computers (four, except at the boundaries) and a link to an additional computer which is called the controller. X- and Y-select lines make it possible for the controller to access any desired node or some subset of nodes in the array. Further, assume that the memory of each node computer carries the complete information about a corresponding circuit cell in an n×n sized master-slice chip. While such a conglomeration of computers would have been unthinkable just a few years ago, the advent of microprocessor makes such a scheme inexpensive and practical today. There are two ways how such an architecture can vastly improve the performance of wiring algorithms. First, the presence of a computer at each node makes it possible to exploit parallelism in the wiring algorithm. Second, frequently used functions can be hardwired as special instructions in the processing element of each node computer.

An 8×8 array of computers, for example, each of which consists of a commercial 8-bit microprocessor, 2 kilobytes of memory and auxiliary circuit enabling neighbor and controller communication can be utilized for the wiring function. The controller is also an 8-bit microprocessor with 48 kilobytes of memory, floppy and hard disk units, printer, terminal and a link to the host computer system of the facility. The following details the steps in performing the wiring. An 8×8 array can also be programmed to wire a chip having more than 64 components.

Global wiring is the name given to the phase of wiring in which wires are allocated to channels in the chip, without specifically assigning tracks within the channel. The latter assignment is accomplished subsequently by an exact embedding algorithm. Before starting global wiring, each node computes the total number of tracks available in each of four directions. It is also provided with a list of nets which have a terminal in that node. (A net is a set of two or more terminals which have to be connected together.)

(a) For each net to be wired, whether it has a terminal in that node or not, a node computes the likelihood of it being a member of some connection in that net in each direction, and adds an appropriate cost to the congestion estimate in that direction. The congestion estimate is a decreasing function of the distance of the node from a terminal node of the net.

(b) After step (a) has been completed for all nets, steps (c) through (g) outlined below are performed for the first net, and then iterated, net by net.

(c) For a given net, a node subtracts its own contribution to the congestion estimate for that net from the total remaining congestion estimate. It does this for each of the four ports in turn.

(d) Based on the number of unused tracks and the updated congestion estimate at each port, the node computes port costs for each of the four ports. The cost is an indication of the penalty for occupying a track in that direction. Thus, the penalty of going through a port which has only one remaining track will be heavier than one with many remaining tracks. This penalty alone cannot serve as the port cost because it penalizes a port with few remaining tracks even if there are not many remaining nets contending for use of that port. The needs of unwired nets is represented in the congestion estimate at the port. Hence a function of the remaining capacity together with the remaining congestion estimate serves better as a port cost function.

(e) Now comes the forward propagation phase. One of the terminal nodes of the net is called the source and all the others are called sinks. The source, in each of four directions, sends the port cost for the port in that direction to its neighbor in that direction. At the same time, all other nodes send an arbitrarily large value to its neighbors. At each subsequent time step, every node picks up the values coming in at its ports and determines the minimum of these values. A pointer is set to the direction from where this minimum came. For each of its ports the node adds the port cost as computed in (d) to the minimum value and sends the modified value to the neighbor in that direction. Once the node has sent out a meaningful value, i.e., a value that is not the arbitrarily large value described above, it resumes sending this arbitrarily large value at subsequent time steps.

(f) When some sink receives a meaningful value, it stops the forward propagation process by informing the controller. Since it is possible for more than one sink to be reached at the same time, the supervisor, either by polling the cells or by some other scheme, determines the sink cell that has the least minimum value. The backtrace now begins. The sink prompts the neighbor in the direction of its stored pointer. At each subsequent time step, a node that has just been prompted by its neighbor prompts another in the direction stored by it during the forward propagation phase. This process continues until the source is reached. Any prompted node decrements the channel capacity in the appropriate ports and records the entry and exit points against that net.

(g) All nodes which have recorded entry/exit points for the current net become sources for the next forward propagation. All net terminals remaining to be connected act as sinks. The process for a net terminates when no sinks remain for a net.

The process just described determines the shortest path between the source and any sink, choosing the path with the least cost if there is more than one. It achieves this in time proportional to the rectilinear distance between the source and the nearest sink. When the placement is good, this distance grows very slowly as the chip size increases. In fact, a reasonable estimate for this distance even for a 10,000 circuit chip is 5. However, the number of nets to be wired is approximately a linear function of the chip size, leading us to conclude that the time for the entire process as described is approximately a linear function of the chip size.

There are situations when the shortest path does not lead to the path with-least cost. Any deviation from the shortest path between a source and a sink is termed a detour. A better performance of the algorithm, from the wirability point of view, is obtained when one performs a deferential detour. In this concept, the nets which are laid down early are not necessarily laid in shortest paths. Rather, they are allowed to detour whenever they reach an area which should preferably be avoided so that future nets do not get blocked in. This can be achieved by the following modification to the above procedure.

Assume that the path with the least cost is desired, with a detour no larger than d. During the forward propagation phase, each node, instead of quitting (sending the arbitrarily large value to its neighbors) after sending one meaningful value, now quits after sending $d+1$ meaningful values. (Note that a blockage at a port could cause the port cost itself to be very high. As a result, if no sink is reached, the net is kept aside for wiring later. However, once a node starts sending meaningful values, it is not possible for it to send a higher value at any of the subsequent d time steps.) Each node also maintains a table indicating the direction from which it received the best value against the time step at which that value arrived. If there is a choice of directions, the direction at the previous step is preferred, whenever possible. (This simply helps in getting the shortest path whenever there are paths of different lengths having the same minimum total cost.) The backtrace process is initiated by the sink with the minimum cost prompting the neighbor in the direction stored against its last active time step, say t. While prompting its neighbor, it also sends the value $t-1$ to the neighbor. The neighbor in turn refers to its table and prompts its neighbor in the direction stored against the time step $t-1$, along with the value $t-2$. This process continues until, as before, the sink is reached.

Simple modifications to the above procedure can improve the time and space complexity of the above algorithm slightly. For brevity, these are not being indicated here. It is also possible to penalize turns (via usage) by maintaining one table for each of the four directions and computing the best cost (which now includes a via cost) and best direction for each outgoing port during forward propagation. The algorithm currently uses the maximum number of vias and the minimum number of vias allowed in a cell to determine the via cost.

Utilizing the above algorithm, on a small example using a machine as described above, the time taken was less than 2 seconds of real time. The program connected all the nets in the minimum Steiner connection when the detour limit, d was set to 0. On increasing the detour limit, the nets took longer paths, but the channel capacity remaining at the end of the run showed a uniform spread over the entire chip. This demonstrates the fact that when nets are allowed to detour, they do so in such a way as to make the wiring of future nets easier. This proves to be quite helpful for the exact embedding phase which follows global wiring. It was also observed that at the end as the channel demand reduced due to fewer remaining nets, the nets were wired with minimum Steiner length.

In order to make the wiring machine more useful in wiring larger chips, small hardware modifications may be made. The edges of the computer array can be connected in a wrap-around fashion, so that the nodes at the north edge had the nodes at the south edge as their north neighbors, the nodes at the east edge had the nodes at the west edge as their east neighbor, and so on.

There are two basic ways in which one could attempt to wire, say, a $24 \times 24$ circuit chip using an $8 \times 8$ computer array. In the first method, one simply partitions the bigger chip into larger partitions so that a $3 \times 3$ sized circuit array is represented in each node of the computer array. In the second, which is termed folding, the circuit partition is retained in the $24 \times 24$ form. However, various $8 \times 8$ frames of the chip are worked on at different points in time by the physical $8 \times 8$ sized computer array. It may be clear that the wrap-around connections allow every circuit cell in any contiguous $8 \times 8$ portion of the chip to be represented by distinct node computers in the array. The folding process performs better than the first method because it takes advantage of the relatively high locality in the distribution of node computation activity without sacrificing the resolution of the wiring process. A node computer must retain the circuit data for every eighth circuit cell in the horizontal direction and in the vertical direction. This suggests a requirement for increased memory requirement at each node. The process described here is more accurately a cut-and-stack process, rather than a strict accordion-type folding process. The latter process, while feasible, and while free of the wrap-around hardware requirement, carries with it the inconvenience of alternating directions for consecutive frames.

Extensive analysis of the folding process indicates that it is a highly cost-effective process. The time required to do forward propagation for a $24 \times 24$ chip on an $8 \times 8$ array machine is not 9 times as much as the time on a $24 \times 24$ array machine, but only about 4 times as much. This factor deteriorates to about 8 as the detour limit is increased to 10. Some examples were executed on the experimental machine using data on chips having 19×23 circuits. The real time for execution of the global wiring process for 293 nets increased from 46 seconds with d=0 to 160 seconds with d=10. The analysis also indicates that since nets tend to be rather local even on large chips, a machine with 32×32 node computers would be no worse than twice as slow as an arbitrarily large machine for a large VLSI chip for all rasonable detour limits. It must be remembered though, that the memory requirements at a node computer increases linearly as the number of frames being represented at the node.

The exact embedding process follows the global wiring process. In this phase, each node must allocate exact tracks to the nets which have been assigned to it by the global wiring phase. In order that the assignments be consistent (a track assigned at one circuit cell to a net must be the same as the track assigned to the net at the adjacent circuit cell), it is necessary for the nodes to communicate with each other. The algorithm begins by making a complete assignment for the circuit cell in the center of the chip. The tracks assigned to the nets which cross the boundary of the cell are sent to the appropriate neighboring processing elements, which accommodate this data in making assignments for its circuit cell. This process continues in a diamond shaped wavefront form until the tracks at the circuit cells at the corners of the chip have been allocated. While details of this process are not described here, it should be mentioned that the extensive lookahead ensures that the tracks assigned by one processor for a net will be one that is reasonably preferred by the adjacent unassigned cell. A wavefront propagation in the opposite direction, i.e., from the corner cell to the center cell can be incorporated at the end of the algorithm to accommodate any conflicts in the assignment.

FIG. 2 is a block diagram representation of the physical design machine according to the present invention. A host system, for example, an IBM 370 computer, 10 is connected to a mask generating machine 12 and to a system bus 14 via a serial I/O bus interface 16. A printer 18 may also be be connected to the interface card 16 to receive inputs from the system bus 14. A control processor 20 is connected to the bus 14 and to a console 22. A controller memory 24, is also connected to the bus 14. Direct access storage devices (DASDs) 26 are connected to the system bus 14 via a bus adapter 28. The central processor 20 communicates with a processor array 30 comprised of SPEs 32 via an array I/O processor 34. The processor array 30 is comprised of an n by n array of the SPEs 32 which are equal in number to the cells set forth in FIG. 1, or a submultiple thereof with the system of FIG. 2 accomplishing the wire routing of the cells.

All communications between the control processor 20 and the processor array 30 are accomplished by a memory mapping technique. That is, all communication from the controller 20 to the array 30 is accomplished by the controller writing into special memory addresses which are intercepted by the array I/O processor 34 and further routed to their final destinations. Likewise, the SPEs 32 in the array 30, communicates with the controller 20 by writing into their own special memory address which causes appropriate routing of the messages by hardware therein. The SPE to SPE communication is implemented using the same techniques as will be set forth in detail later.

The processor array 30 is composed of rows and columns of SPEs each of which communicates with its 4 adjacent neighbors, North, South, East and West, as well as with the controller 20 through special bus mechanisms. It is to be appreciated that any arbritrary number of rows N and columns M can be implemented in the practice of the invention.

Refer now to FIGS. 3.1 and 3.2 which form a detailed block diagram representation of the array I/O processor 34 which contains as a part the logic hardware to process the protocol of the system bus interfacing. The processor 34 includes special registers memory mapped from the controller 20 as well as other logic to drive and control the processor array 30.

All communications between the controller 20 and the processor array 30 SPE's 32 are transmitted to and from the selected SPEs only. The controller 20 selects the SPEs or a given SPE by setting the X and Y, column and row respectively, select bits. The controller 20 composes two bit vectors for an X select register and a Y select register where a logical 1 means the column and/or the row corresponding to the bit position is selected. An SPE considers itself selected if and only if there is a conjunction of both the column and row selection signals. Therefore, the controller 20, by writing into the memory mapped locations that is the X select registers and the Y select registers have the ability to select the group of SPEs corresponding to the cross-and-product of the two register contents. The SPEs in the array are complete slaves of the controller 20 in the sense that it is only the controller which can decide to which group of SPEs it wishes to transmit and/or receive information from. The SPEs, that are not selected by the mechanisms of X-Y coincident selection, cannot participate in any communication, be it data, control or address. If the controller wishes to communicate with all SPEs, say broadcast to all or listen from everyone, it merely sets both the X and Y select registers to all 1's before any further action.

The array I/O processor 34 is connected to the system bus 14, for provision of bidirectional address, data and system bus service signals. Data signals are provided to and from bidirectional bus 36, and to a data bus 38 and from there to the X select register 40, the Y select register 42, and data drivers 44. Data is provided to data bus 36 from the data bus 46 which receives X responses from column 1 through column m of the array via OR gates 48, 50 and 52 respectively. Y responses are provided from row 1 through row n of the array via OR gate 54, 56 and 58 respectively. Data from the array data bus from all SPEs is provided via OR gates 60, and service bus signals are provided from all the SPEs via OR gates 61.

Address signals are provided from the system bus 14 to an address bus 62 and from there to array I/O control logic network 64 and drivers 66. System bus and memory service signals are provided from the systems bus 14 to systems bus interface logic network 68 via bus 70.

The select signals provided to registers 40 and 42, are in turn provided via drivers 72 and 74 respectively as column and row select signals to the SPEs in the array, and data signals are provided from the drivers 44 to the SPEs in the array. Control logic signals are provided via a bus 76 from control logic 64 to drivers 78 as control signals to the SPEs in the array. The address signals on bus 62 are provided by the driver 66 to address all of the SPEs in the array.

Depending on the contents of the address signal bus 62 various types of operations are performed by memory mapped operations. Firstly, some portions of these signals constitute the actual memory location in each of the SPEs in the array where the local memory of every SPE is identically addressed, and the distinction as to which of these local memories are addressed is governed by the X select register 40 and the Y select register 42. Secondly, some portions of these address signals signify that the address is a special memory mapped location some of which reside within the processor 34 and some in the individual SPEs.

The array I/O control logic 64 under the supervision of the usual system bus interface logic 68 decodes the incoming address signals on bus 62 to control various data control signal paths within the processor 34 and in the array. The essential locations and the corresponding usages of address is set forth in detail later. How this decoding and controlling is performed is well known in the art and therefore will not be set forth in detail.

Table 1 below sets forth the logical functions performed by the array I/O control logic 64.

TABLE 1

| SPECIAL ADDRESS FROM ADDRESS BUS | ACTIONS PERFORMED BY THE ARRAY I/O CONTROL LOGIC 64 |
|---|---|
| X Select Register | Routes the data signals 38 from the data lines of the system bus into the X select register 40. |
| Y Select Register | Routes the data signals 38 from the data lines of the system bus into the Y select register 42. |
| DMA to SPE Memory | Routes portion of SPE memory address signal lines corresponding to the SPE local address among the address signal lines 62 to the array via the driver 66. Also, it routes appropriate control signals (read, write, local bus control, interrupt, etc. - all standard) to the array via the driver 44. These control signals which form part of logic 76 pertaining to the local memory accesses are generated from the signals 70 and 62 in a standard manner. Further, if the command is Read, the data output from the SPEs ORed via the array data bus 60 is routed to the data bus 36 which in turn is delivered to the controller via system bus 14. If the command is Write, the incoming data 36 from the system bus is routed to the array data bus via the data drivers 44 which is distributed to all the SPEs. |
| X Response Y Response Service Bus | These addresses are for read only operation from the controllers viewpoint. Upon recognizing these addresses the control logic directs the appropriate ORed bus signals for X and Y response and the service bus 61 on bus 46 to the data bus 36 which in turn are delivered to the controller. |
| I/O Registers | This register pair is in every SPE of the array. Further details of how the |

TABLE 1-continued

| SPECIAL ADDRESS FROM ADDRESS BUS | ACTIONS PERFORMED BY THE ARRAY I/O CONTROL LOGIC 64 |
|---|---|
| X Select Register | Routes the data signals 38 from the data lines of the system bus into the X select register 40. |
| Y Select Register | Routes the data signals 38 from the data lines of the system bus into the Y select register 42. |
| DMA to SPE Memory | Routes portion of SPE memory address signal lines corresponding to the SPE local address among the address signal lines 62 to the array via the driver 66. Also, it routes appropriate control signals (read, write, local bus control, interrupt, etc. - all standard) to the array via the driver 44. These control signals which form part of logic 76 pertaining to the local memory accesses are generated from the signals 70 and 62 in a standard manner. Further, if the command is Read, the data output from the SPEs ORed via the array data bus 60 is routed to the data bus 36 which in turn is delivered to the controller via system bus 14. If the command is Write, the incoming data 36 from the system bus is routed to the array data bus via the data drivers 44 which is distributed to all the SPEs. I/O Registers are connected in the array to array I/O processor through the ORing data bus and drivers will be described later. The control logic 64 then, depending upon read or write, either routes signals from bus 60 to data bus 36 or from 36 to drivers 44 respectively. Furthermore, upon writing it sets the AIN latch in the SPEs to logical 1, the description of which follows later. And upon reading, it resets to 0 the AOUT latch in the SPEs. These two set, reset operations are accomplished through appropriate control signals delivered to the array through the control signal drivers 78. |
| Reset Array | Write only command from the controller. The control logic energizes the reset line, which is one of the control signal lines of drivers 78. |

Figure 4:
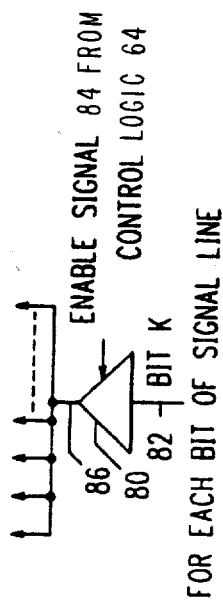
FIG. 4 is a schematic representation of the drivers 44, 66 and 78 of FIG. 3.2.

FIG. 4 is a schematic diagram representation of a driver 80 which is utilized for each individual bit in the drivers 44, 78 and 66 of FIG. 3.2. The driver 80 receives a bit K for each bit on the signal line on an input line 82, which bit is gated in response to an enable signal 84 from control logic 64 for providing the bit on an output line 86, with this bit being fanned-out to each SPE in the array. The driver 80 can be composed of a fan-out tree of drivers to share the driving load, as is well known to those skilled in the art.

Figure 5:
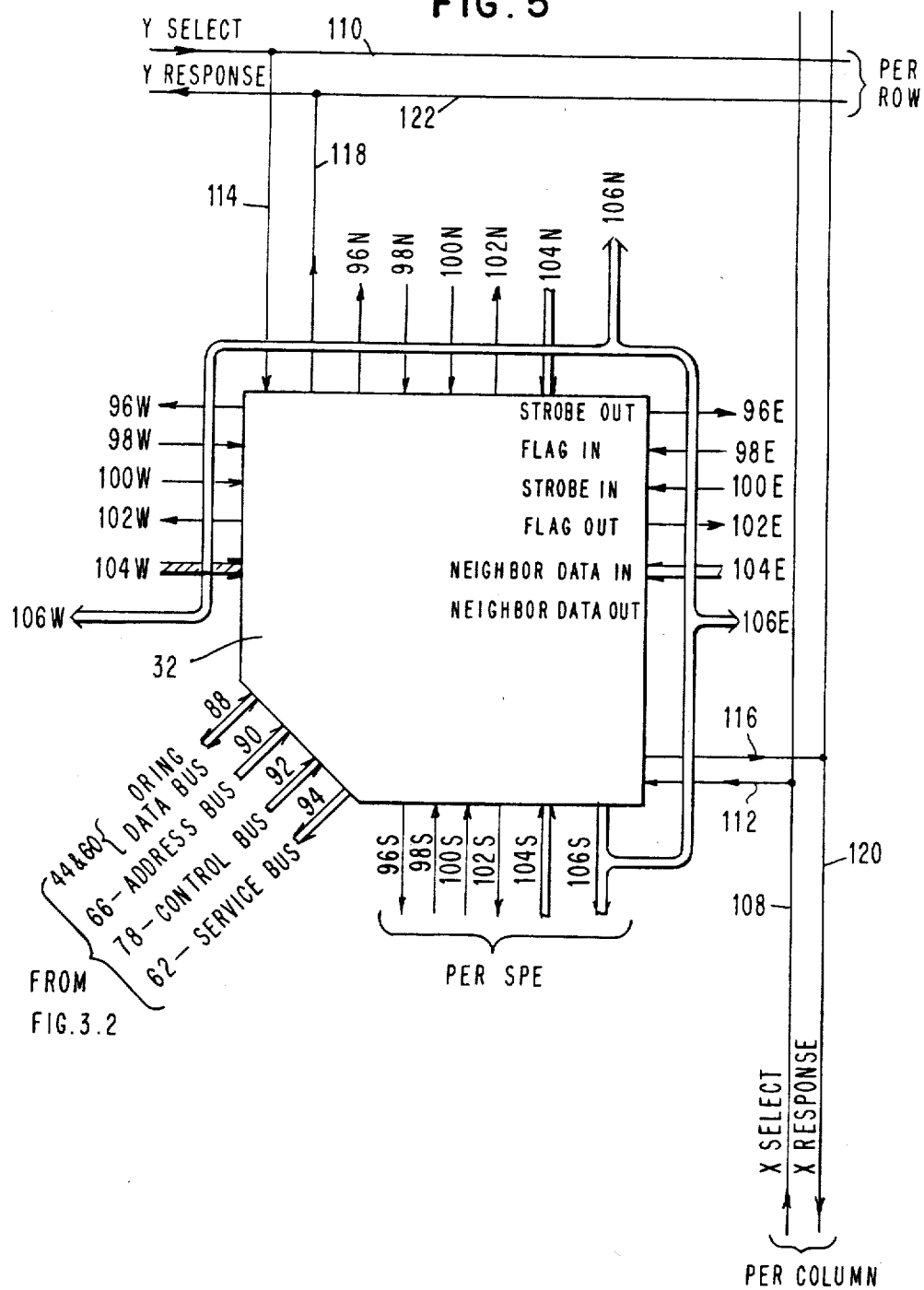
FIG. 5 is a schematic representation of a special processing element (SPE) 32 of FIG. 2, setting forth the control and data I/O to and from neighbor SPE's.

FIG. 5 illustrates SPE 32, including the control and data inputs to and therefrom to neighboring SPEs and the array I/O processor. The ORing data bus 88 is connected to the output of the drivers 44 and 60, the address bus 90 is connected to the drivers 66, the control bus 92 is connected to the driver 78 and the service bus 94 is connected to the input of the OR gate 62 of the processor 34 as set forth in FIG. 3.2.

Each SPE communicates with its adjacent North, South, West and East neighbors with certain communication signals being provided per SPE. Per SPE a Strobe OUT signal is provided on each line 96, a Flag IN signal on each line 98, a Strobe IN signal on each line 100, a Flag OUT signal on each line 102, neighborhood Data IN is provided IN on each line 104 and neighborhood Data OUT is provided on each line 106. X and Y select signals are provided on lines 108 and 110 respectively per column and row to all of the SPEs, with the X select being provided on line 112 to the SPE 32 shown, and the Y select being provided on line 114. X and Y response signals are provided on lines 116 and 118 respectively from the SPE 32 to X response and Y response lines for the array on lines 120 and 122 respectively. The neighbor communication lines to North, South, East and West neighbors are identical to all SPEs except for the SPEs at the North, South, East and West boundaries of the array. These boundary SPEs consider the cells opposite the array as their neighbors in the outward direction from the array viewpoint. The detail functional operation of the SPE 32 is set forth below relative to FIGS. 6.1 and 6.2 and flowcharts which follow.

Refer now to FIGS. 6.1 and 6.2 which is a current mode embodiment of detailed block diagram representation of the SPE 32. The control bus signal on line 92 is provided to SPE control logic network 124 via a control buffer 126, with the control bus signal being provided from the buffer 126 via lines 128 and 130 to AIN latch 132 and AOUT latch 134 respectively. The X select and Y select signals 114 and 112 respectively are also applied as inputs to logic network 124. The address bus signals on bus 90 are provided to an external address buffer 136. The ORing data bus line 88 is connected to buses 138, 140, 142 and 144 for connection to IN register 146, OUT register 148, data IN buffer 150 and data OUT buffer 152 respectively. The service bus 94 is connected to a service buffer 154 and to a service word 156 via a bus 158. The service word network 156 besides including the latches 132 and 134, includes a service latch 159. The service word 156 is connected to the SPE data bus 160 via a bus 161.

The Strobe IN signals on the respective lines 100 are connected to a North IN Flag latch 162N, an East IN Flag latch 162E, a South IN Flag latch 162S and West IN Flag latch 162W, respectively. These latches provide Flag OUT signals on the respective lines 102, with these signals also being provided to a bus 168 for application to a Flag buffer 170. The neighbor Flag IN signals on the respective lines 98, are also applied to the bus 168 for application to the Flag buffer 170, with the output of the Flag buffer being provided to the SPE data bus 160. The Strobe signals OUT are provided on the respective lines 96 from the SPE control logic network 124. The neighbor data IN signals on the respective 104 lines are provided to a North IN latch 172N, an East IN latch 172E, a South IN latch 172S and a West IN latch 172W. The outputs from these latches are provided to the SPE data bus 160. The data bus 160 is connected to the input of a neighbor data OUT buffer 180, with the neighbor data OUT buffer 180 providing the respective neighbor data OUT signals on the respective lines 106.

The SPE control logic network 124 is connected to microprocessor 182 via a bidirectional bus 184. The microprocessor 182 may, for example, be one of any number of commercially available microprocessors such as the Zilog Z80. The microprocessor 182 provides addresses to an address buffer 186 via a bus 188 and exchanges data with a data buffer 190 via a bidirectional bus 192. The output of the address buffer 186 is connected to the SPE address bus 194 which is also connected to a local memory 196, which for example may be a random access memory (RAM).

The address bus 194 is also connected to the output of the buffer 136 via a bus 198 and to an address input of the SPE control logic network 124 via a bus 200. The local memory 196 is connected to the SPE data bus 160 via a bidirectional bus 202. The registers 146, 148, and the buffers 150 and 152 are also connected to the data bus 160 via buses 204, 206, 208 and 210 respectively. The latches 172, 174, 176, 178 and the buffer 180 are connected to the data bus 160 via buses 212, 214, 216, 218 and 220 respectively.

The SPE control logic network 124 functions as the main data routing mechanism within the SPE 32, to the global controller 20 and to the adjacent neighbor SPEs. The global communication lines, 92 through buffer 126, 90 through buffer 136, 88 through I/O registers 146 and 148 and through buffers 150 and 152, and 94 through buffer 154 are all gated by the X-Y selection mechanism within SPE control logic 124.

Figure 7:
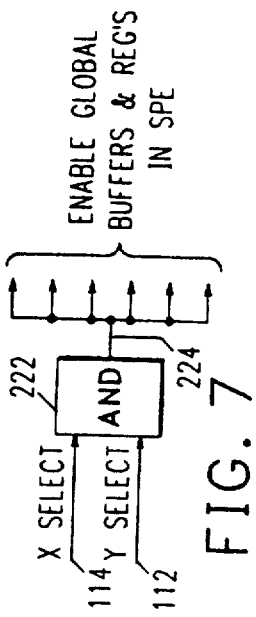
FIG. 7 (illustrates the selection mechanism in SPE control logic 124 in FIG. 6.1.

The X - Y selection mechanism within logic 124 is as illustrated in FIG. 7. An AND gate 222 receives the X select and Y select signals on lines 114 and 112 respectively, and upon detecting coincidence, an enable signal is provided on output line 224 that is distributed to all the global buffers and registers of the SPE 32 as set forth above. All global communications as set forth below are also goverened by this selection mechanism.

Returning to FIGS. 6.1 and 6.2, the reset signal, which is a part of the control signals on line 92 through the buffer 126 resets the microprocessor 182. The microprocessor 182 dictates the protocols of local buses 194 and 160. Therefore, some of the control signal lines 92 from the controller 20 via the array I/O processor 34, are dedicated to commercially specified local bus handling which is processed and/or routed via signal lines 184 to the microprocessor 182 by the SPE control logic 124 in a well known manner. These signals, for example, usually include bus acknowledge and bus request signals as well as others. The control signal lines 92 also include the usual microprocessor control commands such as, interrupt, reset and the like, as well as the SPE local memory read, write command lines, which signal functions are well understood in microprocessor technology. When the global request of the local bus is initiated by the controller 20 through the array I/O processor 34, the microprocessor 182 is temporarily interrupted and the buses 194 and 160 are given to the global tasks which take precedence over local tasks. Two of the control signal lines of 92, namely the lines 128 and 130 are dedicated to setting the protocol bits for the I/O register use through the global data bus 94. The signal line 128 sets the AIN latch 132 to a logical 1 and the signal 130 resets the AOUT latch 134 to logical 0. These actions are controlled entirely by the array I/O processor 34 when the global controller 20 writes or reads the SPE I/O registers as previously set forth.

Other global communications are accomplished by DMA methods both by the controller 20 and by the SPE's 32 as previously set forth. The actions of the SPE control logic 124 in response to the global commands from the I/O processor, is set forth below. When control logic 124 recognizes the global request for the local buses, the external address buffer 136 is enabled for providing the address to the bus 194, after a temporary interrupt for the duration of the task. Then, the control logic 124 decodes the address it receives from the bus 194 by way of the bus 200 and takes appropriate data routing operations as set forth in Table 2 below.

TABLE 2

| SPECIAL ADDRESS FROM THE ARRAY I/O CARD | ACTIONS TAKEN BY THE SPE CONTROL LOGIC 124 |
|---|---|
| DMA TO SPE MEMORY | Passes the Read/Write command to the SPE local memory 196, at the same time enabling the data IN buffer 150 onto the data bus 160 for WRITE operation; or enabling the DATAOUT buffer 152 for READ operation thereby routing the contents of the memory location onto local data bus 160 and buffer 152 to the array I/O processor. |
| READ FLAG (170) | Enables the flag buffer 170 routing the contents through the local data bus 160 to data out buffer 152 which is enabled to further deliver the data to the array I/O processor. |
| READ SERVICE WORD | Enables the service buffer 154 to route the contents of AIN and AOUT latches 132 and 134 along with the contents of service latch 159 to the array I/O processor via service bus 94. |
| READ OUT-REGISTER | Enables the OUT-Register 148 to the global data bus 88 and automatically resets the AOUT latch 134 (part of the service word) to logical 0 as mentioned before. Immediately after the Out-Reg. is read, the control logic 124 resets the register to logical zero. |
| WRITE IN-REGISTER | Latches in the incoming data bus 88 onto the IN-Reg. 146, and automatically sets the AIN latch 132 (part of the service word) to logical 1 as mentioned before. |
| READ NEIGHBOR IN LATCH 172 (N,E,S,W) | (Say North, all other directions processed in a similar manner). Enables North IN Latch 172N onto the data bus 160 at the same time enabling the data out buffer 152 onto the global data bus. Control logic 124 also resets the North IN Flag latch 162N to logical 0, thereby acknowledging to the North neighbor SPE that the data sent was read. Details of this flag mechanism is explained later. |
| WRITE TO NEIGHBOR (N,S,E,W) | Enables data-in-buffer 150 and the neighbor-data-out buffer 180, thereby routing the incoming data to the appropriate neighbors. The strobe signal action at this point is identical to SPE internally generated neighbor communication as explained later. |

TABLE 2-continued

| SPECIAL ADDRESS FROM THE ARRAY I/O CARD | ACTIONS TAKEN BY THE SPE CONTROL LOGIC 124 |
|---|---|

The SPE communicates with its adjacent neighbor SPE's through the data ports 104 and 106 respectively in each of the North, South, East and West directions. To insure the integrity of communications, the Flag latches 162(N,E,S,W) the neighbor Flag-IN on the lines 98, Strobe-OUT signals on the lines 96, Flag-OUT 102, and the Strobe-IN signals 100 are used. The use of these signals and latches and their actions are described later.

The following sets forth the data routing of the SPE control logic 124. Internal requests are issued from the microprocessor 182 in the form of DMA to the various SPE latches, registers and ports, as well as the SPE local memory 196. All of these requests are preceded by usual local bus protocol handled by the control logic 124 via bus 184 from the microprocessor 182. Table 3 below sets forth the actions taken by control logic 124 for internal data routing purposes.

TABLE 3

| MICROPROCESSOR 132 ISSUED SPECIAL ADDRESS LOCATIONS | ACTION TAKEN BY THE SPE CONTROL LOGIC 124 |
|---|---|
| READ/WRITE LOCAL MEMORY* | Enables address buffer 186 to route the address to the memory 196 via SPE address bus 194. Then enables the memory output onto the local data bus 160, which is read in by the microprocessor 182. Appropriate Read/Write command is also issued to the memory 196. |
| READ IN-REGISTER 146 | Enables IN Register 146 onto the data bus 160 which is read in by the microprocessor 182. Resets AIN latch 132 to logical 0 |
| WRITE OUT-REG. 148 | Enable data buffer 190 and routes the data from the microprocessor 182 onto data bus 160 and 148. Latchs the data on to Out-Register 148. Also sets the AOUT Latch 134 to logical 1. |
| READ SERVICE WORD | Routes the contents of AIN 132, AOUT 134 and Services Latch 159 comprising the service word onto the data bus 160, which is read in by the microprocessor 182. |
| WRITE SERVICE WORD | This action only writes onto the service latch 159 portion of the service word shown in FIG. 6. The service latch portion latches in a portion of local data bus 160. Data buffer 190 is enabled to put this data out onto the bus preceding the latching action at 154. The two bits in AIN and AOUT latches 132 and 134 cannot be modified by this command. The service word includes two signals: X-response 120 and Y- |

TABLE 3-continued

| MICROPROCESSOR 132 ISSUED SPECIAL ADDRESS LOCATIONS | ACTION TAKEN BY THE SPE CONTROL LOGIC 124 |
|---|---|
| | response 122 which are connected to the appropriate response ORing set forth earlier |
| READ FLAG | Enables the flag buffer 170, thereby routing the contents of IN-Flag latches 162(N,E,S,W) and the four neighbors's appropriate flag latches via the line 98, to buffer 170 and onto the local SPE data bus 160 which is read by the microprocessor 182. |
| WRITE TO NEIGHBOR (N,E,S,W) | Enables data buffer 190 and neighbor data out buffer 180, while sending a strobe signal on lines 96 to the intended neighbor. The strobe signal on lines 96 causes further action on the neighbor SPE as described later. |
| READ FROM NEIGHBOR | Enables appropriate neighbor IN latch 172(N,E,S,W) onto the SPE bus 160, which is read by the microprocessor 182. At the same time the appropriate IN-Flag latch 162(N,E,S,W) is reset to logical 0. |

FIG. 8 sets forth a neighbor communication mechanism which is known in the art variously known as a mail box flag protocol or a request and acknowledge protocol. The mechanism is one of the many possible methods which may be used to ensure the data integrity when two processors transfer data without the receiving processor anticipating the data at the time of transfer. The mail box flag mechanism operates on the same principle as the mail box mechanism for the AIN latch 132 and AOUT latch 134 set forth in FIG. 6.1. The units A and B shown in FIG. 8 can be either North-South neighboring SPEs or East-West neighboring SPEs, or to a generic extent may be representative of an SPE and the array I/O processor 34, insofar as the I/O registers 146 and 148 (FIG. 6.1) communication is concerned. With reciprocal symmetry in mind, the case is considered where unit A transmits to unit B.

The unit A includes the data bus 160, a sender buffer 180 and logic network 124. Unit B is shown as including a receiver latch 172 and IN flag latch 162 and the logic network 124 as well as the data bus 160. Communications between the sender buffer 180 and the receiver latch 172 are via the buses 213 and 104.

The operation of the mail box flag mechanism is according to the steps set forth below.

(1) Before sending the data to unit B, the unit A can ensure that the previous data transmitted to unit B has been read by unit B, by interrogating the IN flag latch 162 of unit B. This is accomplished by reading the service word in case of global read or by reading the flag buffer 170 in case of SPE neighbor. When a Flag-IN 98 bit value of logical 1 is sensed, this signifies that the neighbor has not read the previous data transmitted. Unit A can keep interrogating this bit until it senses a logical 0. If unit A does not care about the previous data it transmitted or if it is already sure, by sufficient passage of time, that the unit B is ready to receive another data word, it can directly proceed to step 2 below, omitting step 1.

(2) Unit A enables data onto the data bus 160 and enables the buffer 180, at the same time transmitting the strobe signal out to the unit B which directly controls two events in the hardware of unit B. Firstly, the strobe signal clocks the receiver latch 172 of unit B, latching in the transmitted data. Secondly, and at the same time, the IN flag latch 162 of unit B is set to logical 1, signifying a data word is transferred to unit B from unit A.

(3) At some time later, when the unit B anticipates or needs the data from the unit A, and if unit B wants to ensure that the data has been sent from unit A, it may interrogate its own IN flag latch 162 as previously set forth. Unit B can then keep interrogating this latch until the value becomes logical 1. If unit B is sure of the fact that the data must have been transmitted from unit A for any reason, it can proceed directly to step 4.

(4) Unit B enables its receiver latch 172 onto its bus to read, at the same time, resets the IN flag latch 162 to logical 0 signifying its readiness to receive further information from unit A.

Returning to FIGS. 6.1 and 6.2, while the SPE control logic 124 is in charge of routing the SPE internal and external data movements, the control logic 124 does so only by the command of either the array I/O processor 34 or the microprocessor 182. The actual processing of data and ordering of the data movement in the SPE is carried out by this microprocessor 182. That is, the calculations and functions to be carried out by the SPEs in conjunction with other SPEs in parallel, under the supervision of the controller, by programming means using various available instructions and data stored in the SPE local memory 196. Some of the special instructions contemplated, such as simultaneous 4 port communication and arithmetic and logical operations, are emulated by the commercial microprocessor standard instruction set. However, it is the intent of this invention that, recognizing the practicality and speed advantages of such special instruction sets operating on some special functional hardware logic, the SPE may incorporate some or all of the special hardware instructions of 4 port nature. Regardless of what instruction set is utilized, it is well understood in the programming art of digital processors that implementing a program is a skilled but routine art once the flow of functional operation is envisioned and specified.

The following sets forth a general description of the physical design process for the global wire routing. The following are system level generic operations which are essential to the system, with only the main system functions being described at this time. Functions such as system interrupt handling, automatic array reconfiguration, time sharing task, SPE program overlay mechanism and the like will not be described.

System reset is accomplished at the control processor 20 of FIG. 2 by a hardware switch which causes the processor to jump to a fixed address in a read only memory. The read only memory is programmed to load necessary controller and the SPE application programs from the DASDs into the negative memories 24 and 196.

All operations in the array are limited to the selected SPEs only. For broadcasting to all SPEs or the whole array operations, the X-Y select registers 40 and 42 of FIG. 3.1 contain a vector of all 1's. If any X-Y subset is desired for any operations, such subset vectors are composed by the controller and stored in the X-Y select registers 40 and 42, before any further action takes place.

Determination of responding SPEs is accomplished by the controller reading the memory mapped special location, the X-Y response lines. The controller first reads the X response of the entire array and finds what columns of the array are responding. For each responding column, the controller selects the column and all rows and reads the Y-response line to determine exact location of each responding SPE in that column. As the controller finds a responding SPE location it can perform operations on it such as reading a certain value in SPE memory or the I/O register and operate on them.

SPE memory loading is accomplished by the controller bringing the program or data from the DASDs or directly from its main memory and loading into all SPE memories simultaneously by the DMA mechanism previously described. In general, the common portion of data and program can be loaded onto any group of SPEs selectable as a cross product of the X-Y selection vector.

Communication using the I/O registers of SPE is distinguished from DMA into the SPE memories, in that the DMA into the SPE memory temporarily interrupts the SPE operations due to the SPE local bus usage for the DMA action, while the I/O registers can be used without disturbing the SPE local bus. The SPE is notified of data handling being put into the I/O register or read from there by the controller, through the AIN and AOUT Flag mechanisms previously set forth. The controller sets these status bits by simply reading and writing into the selected SPE I/O registers while it can observe the status by reading the service word as described earlier.

The SPEs are initiated by the controller writing data to special DMA address for resetting the array. The array I/O processor decodes this address and energizes the control signal line designated for reset which resets the selected SPE's microprocessors. When a microprocessor is reset, which takes the microprocessor to execute the memory location 0, the instruction in the location 0 causes a jump with proper index into the jump table that contains the beginning points of various programs stored in the SPE local memory. The proper index into the jump table can be DMAed to the fixed SPE memory location by the controller or it can be stored there by the SPE in anticipation of the next execution sequence beginning.

Intra array communication is carried out by sending and receiving the data between the neighboring SPEs. A mechanism of how the sending and receiving is accomplished was previously set forth. It is understood that each SPE contains a special memory location where the boundary status is stored. Thus, each SPE is cognizant of the fact that there is or is not a neighboring SPE in any specific direction. Whenever the program flowchart specifies a neighborhood communication, the SPE first confirms the existence of a neighboring SPE before the action of either transmitting or receiving. The boundary SPEs then simply omit the step of transmitting or receiving to the empty direction, in exception to general description in the flowchart.

A synchronization mechanism is achieved by the service word of the SPE being used to report all SPE status, the most important of which is the job completion status. Before beginning a task, all SPEs can set a prearranged bit position to be logical 1, signifying the busy status. Upon completion of the given task, the SPE reads the service word, resets the bit to logical 0 and stores back to the service word. The service bus being the ORing bus that ORs all the service words of selected SPEs to the array I/O processor, the bit will be a logical one as long as any of the selected SPEs are busy and will be a logical 0 only if all of the selected SPEs have completed the task. The controller thus determines the completion of all of the SPEs before it directs the array for the next subprocess.

The following is exemplary of a physical design process according to the invention. At the completion of the logical design, the physical design process set forth in FIG. 9 begins. The general steps taken are:

(1) The partitioning of the logic gates into a physical package such as chip, cards, boards, etc. as set forth at logic block 226.

(2) The placing of the components within each package is accomplished as set forth at logic block 228.

(3) The wire routing to the terminals of the logic elements in each package is then accomplished as set forth at logic block 230.

(4) The generation of manufacturing data is accomplished as set forth at logic block 232.

The placement and wiring can be a combined process in some applications. The final output of the physical design process serves as input to the actual physical realization of the logic packages at the manufacturing plant by a mask generation machine or other lithographic system such as indicated at 12 in FIG. 2.

Figure 9:
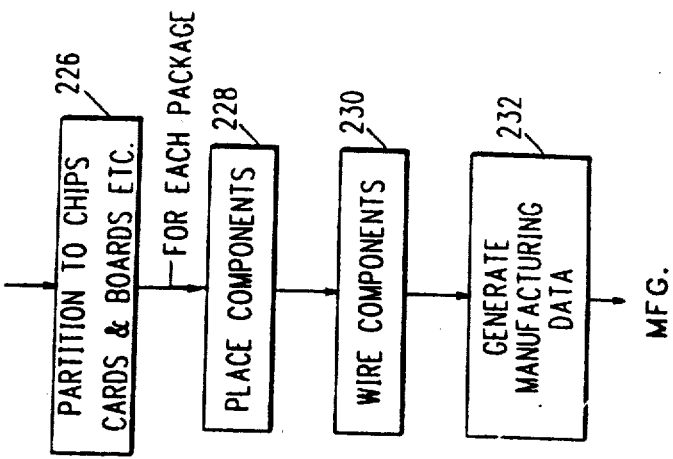
FIG. 9 is a flowchart of the physical design process according to the invention.

The wire routing process 230 of FIG. 9 is set forth in more detail in FIG. 10. The placement process for components 228 preceding this process determines what logic element is placed at what position of the chip, and what terminals of these logic elements are connected to what terminals of the other logic elements. Then, a global routing process is undertaken as indicated at logic block 234 to determine optimal channel routings between logic service terminals. Following this, an exact embedding of horizontal and vertical wires to tracks within the selected channel is undertaken as indicated at logic block 236. Following this determination overflow handling and checking is accomplished as indicated at logic block 238, with the process then returning to point 232 as indicated in FIG. 9. As a detailed example, a chip generically known in the industry as a master-slice chip or a gate array chip in the LSI/VLSI range is utilized.

Figure 11:
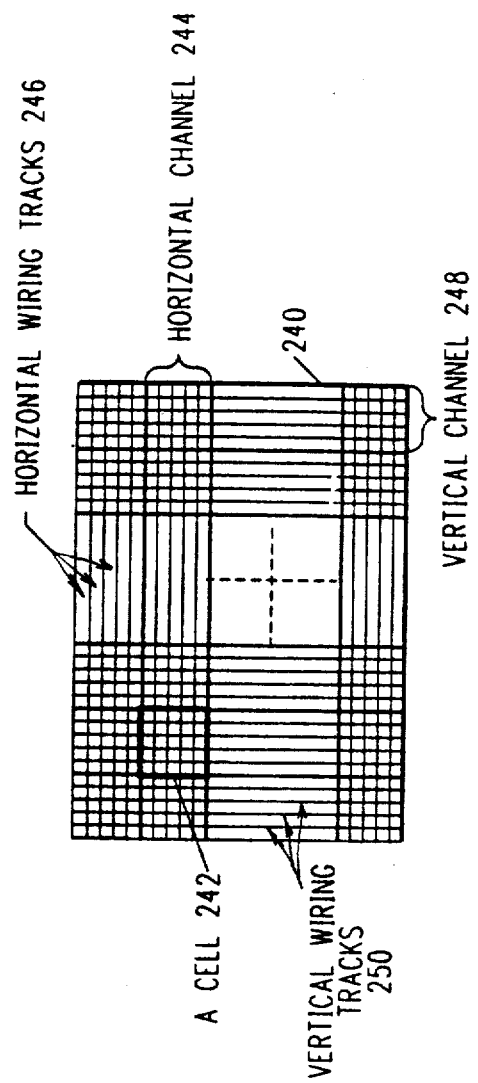
FIG. 11 is a schematic diagram representation of a master-slice chip illustrating a cell and horizontal and vertical wiring channels.

The master-slice chip 240 shown in FIG. 11 is comprised of rows and columns of cells 242. Passing through the cells are horizontal channels 244 composed of a plurality of wiring tracks 246 in the horizontal direction, and vertical channels 248 composed of a plurality of wiring tracks 250 in the vertical direction. The horizontal and vertical wiring channels are said to be in their respective wiring planes which are separated by an insulating layer as previously set forth. Active logic elements reside underneath these two wiring planes separated by yet another insulating layer.

Figure 12:
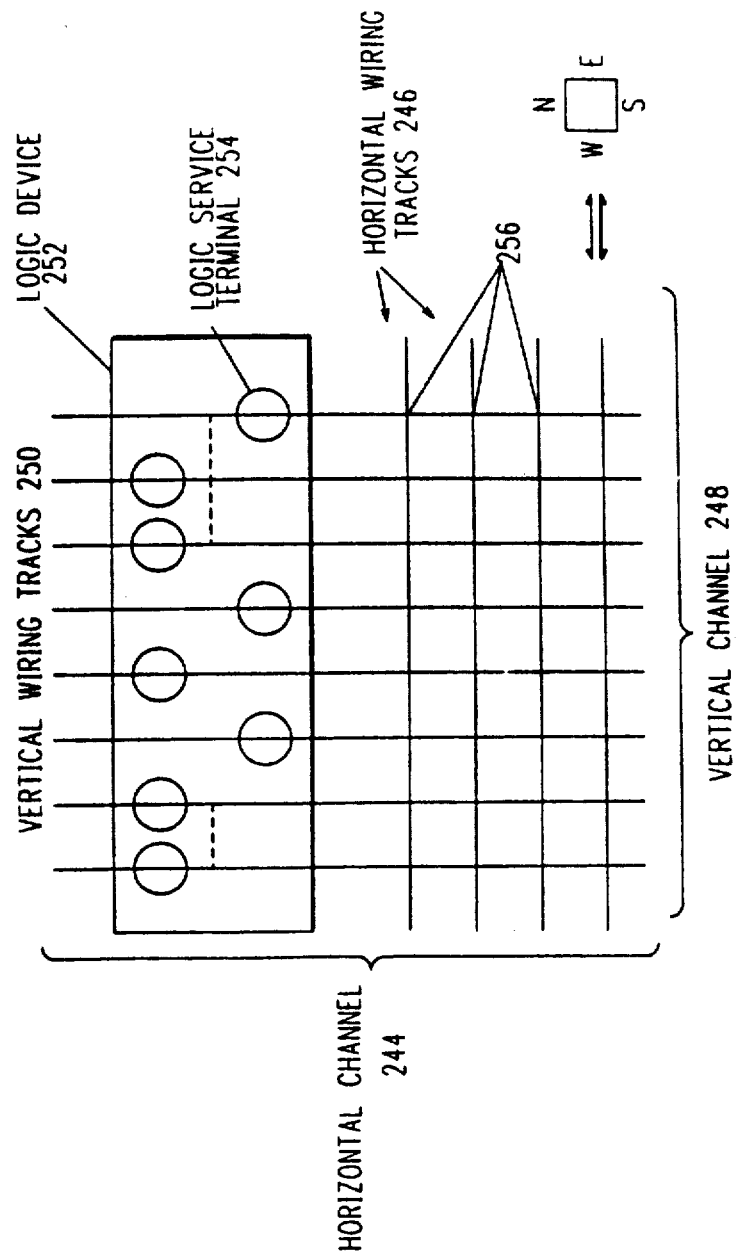
FIG. 12 is a schematic illustrating the details of a cell 242 of FIG. 11.

FIG. 12 shows in detail a cell 242 which can be construed as the combination of a logic device 252 and the corresponding horizontal and vertical channel intersection. The four imaginary boundaries of the cells are called N, E, S, W ports. The number of available wiring tracks on each port is called the channel capacity. The logic device 252 in each cell is a collection of active semiconductor logic devices that is personalized to perform the elementary logic functions such as AND, OR, NAND, NOR, NOT, EX-OR, latch, and the like.

Logic functions placed at the site dictate how the logic device is personalized, and this is not pertinent to the wire routing process. Depending upon what function is assigned to the logic device 252, however, there are fixed locations called the logic service terminals 254 along the vertical wiring tracks 250. Also some LSTs may be placed along the horizontal tracks 246, by means which are not pertinent to the method to be described, that must be connected to other cell LSTs similarly assigned. The personalization of the logic device, outside of the wiring process, may thus use some portions of the horizontal and vertical wiring tracks, which manifest themselves as blockages in the affected tracks. Therefore, the channel capacity in North and South ports may not be the same, and likewise in the East and West directions.

A net refers to the collection of LSTs in the placed cells to be made electrically common by connected wires laid along the wiring track. When a wire must change its direction it does so by changing the wiring plane by using a via programmed at the intersection 256 of horizonal and vertical wiring tracks.

Depending upon the chip or module technology and the given placement, the channel capacity of all the cell boundaries is fixed. The chip input-output pins connect to driver and receiver cells which are located at some designated position. Usually these cells are along the periphery of the chip, but many other arrangements are practiced.

The technology also dictates configurations of vias within a cell. The constraint usually manifests itself as a prohibition of certain adjacent vias being used along the tracks. More detailed analysis of how this constraint is handled can be found in the IBM Journal of Research and Development, July 1981, in an article entitled, "Number of Vias a Control Parameter for Global Wiring of High Density Chips" by D. T. Lee et al. Within a given cell, then, one can determine two numbers VIAMIN and VIAMAX, as a function of horizontal and vertical channel capacity of the cell, according to the theory taught in the above reference. A number VIAMIN refers to the minimal guaranteed number of vias that can be configured within the cell without violating the technology constraint. That is, if there were one less than VIAMIN vias configured in a cell, one can always add another via somewhere in the same cell without violating the constraint. The number VIAMAX refers to the maximum number of vias that can be assigned within the cell under the most advantageous configuration. That is, no more than VIAMAX vias can possibly be assigned to the cell, i.e., no more than VIAMAX bending wires can be routed through the cell.

Referring once again to FIG. 10, the wire routing process begins with the placement and a chip geometry data. The placement data, provided by 228, is a net list which provides, for each net to be routed: (A) the number of all LSTs, (B) the cell position of each of the LSTs and (C) the exact LST physical location within the cells. The chip geometry consists of information concerning the blockage status of each cell and the channel capacity of all the ports of all the cells.

The first and most important major step in the wire routing process 230 is called the global routing 234. At this step, the routes of all the nets are globally determined in cell resolution. The exact LST locations, the exact tracks of the route, or the exact position of the vias within the cells are ignored at this step. The follow-on step 236 then embeds the globally routed wire segments to exact tracks within the channels while satisfying the detailed technology constraints in fine resolution. Should any wire segment be left as an overflow from the previous two step procedure, an overflow handling step 238 is invoked. Current practice in the art is that most of the overflows are manually embedded causing a long delay in the total development time of the chip. It is a further aim of this invention to minimize the overflows and to automatically process at high speed, the overflows that do occur.

Refer now to FIG. 13 which is a flowchart illustrating the global routing process set forth in logic block 234 of FIG. 10. Net data, channel capacity and detour limit is provided as indicated at 258 to flowchart logic block 260 wherein the first step is undertaken to estimate the congestion at each port, that is each cell boundary of the chip, due to the anticipated use of tracks by the wire routes. The process then routes one net at a time as indicated at logic blocks 262, 272 and 276 or alternatively the order of nets to be wired may be determined by some other suitable procedure replacing the simple order of processing the nets as indicated at 262, 272 and 276. Before a net is to be routed, the congestion estimate contributed by the net is subtracted as indicated at logic block 264, thereby reflecting only the estimated congestion due to the nets that have not as yet been routed. With this updated congestion estimate and the channel capacity, a cost for a crossing (COST) is developed as indicated at logic block 266 for each of the cell boundaries. The cost for bending a wire in the cell, called the via cost is also determined for each cell during the process indicated at logic block 266. The process then continues as indicated at logic block 268 to determine the minimum cost route to connect the net by use of the processor array system. If the wiring process is successful as determined at logic block 270, the process continues to logic block 272 where the net number, I, is incremented. If the wire of net I is unsuccessful, the logic block 274 records an overflow, and continues to logic block 272 and 276 where the question is asked, "Are all nets done?" If the answer is no, the process returns to logic block 264 and continues as previously set forth for the next net. If all nets are done, the process exits as indicated at 278.

Figure 14:
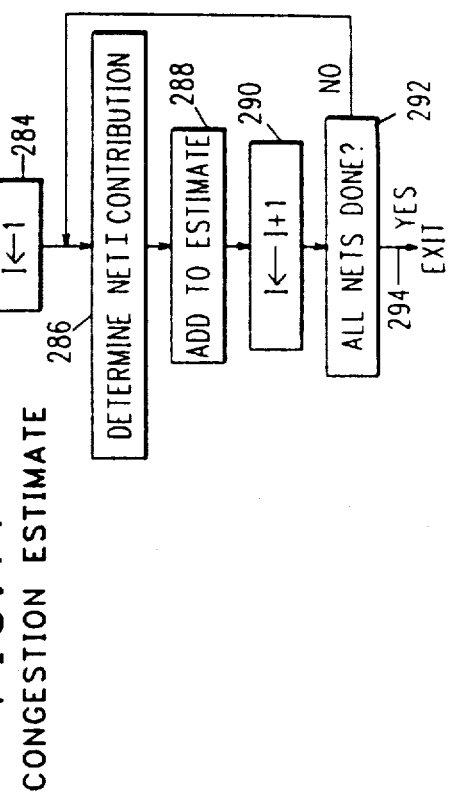
FIG. 14 is a detailed flowchart of the congestion estimate logic block of FIG. 13.

FIG. 14 depicts the general flow of the congestion estimation process 260 of FIG. 13. Net data is provided as indicated at 280 with the estimate being initialized to zero as indicated at logic block 282. The congestion estimate value of a given net is determined at logic block 286, wherein two reasonable assumptions are made. First, that the wire would be most likely to follow the shortest possible route, and secondly that two point connections would likely contain at most two bends rather than multiple zigzag paths. As indicated at logic block 288 the accumulation of values at every cell boundary takes place. It is noted that the same subprocess at logic block 286 is used along with subtraction replacing the 288, for the embodiment of 264 as indicated in FIG. 13. The logic block 290 and 292 together controls the sequencing through all the nets. If all the nets are completed, the process exits as indicated at 294.

FIG. 15 illustrates all the wire routes connecting two points in cells A and B, such that the two assumptions above are satisfied. The bounding rectangle 296 is defined as the minimum rectangle containing the two points, A and B. All shortest routes connecting the two points must lie within the bounding minimum rectangle 296. As is evident from the figure, the number of wire routes that pass through a given cell boundary varies in a specific way within the minimum rectangle 296. The number of routes decreases to #1 as the cell distance from the two points A and B increases along the horizontal and vertical channels. All of the cells in the mid portion of the rectangle contain only one route in either direction, as indicated by the #1.

Following the principles evidenced from FIG. 15, the congestion estimation due to a given net is accomplished as follows. It is understood that many other estimate values may be formulated and used as well as the method set forth below.

Figure 16:
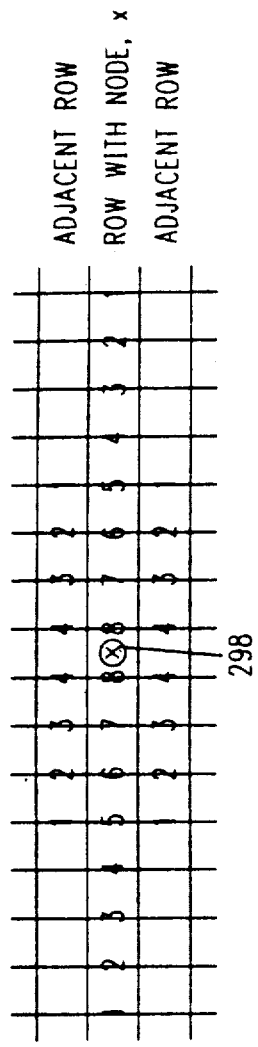
FIG. 16 is a template pattern of lookahead costs for a node X in a net to determine a congestion estimate.

FIG. 16 is a template pattern (T) of congestion estimate contribution for each, LST, X, of a given net, as indicated at 298. The congestion estimate contribution of a given net is determined, allowing for detour possibilities and emphasizing the inside of the minimum rectangle. The congestion estimate figure due to an LST of a given net, shown for horizontal cell boundary crossings with the vertical case being symmetric is illustrated. Another interpretation of these values can be given as reserving a horizontal berth to escape from the cell. Inside the minimum rectangle, a value of 1 is assigned at the cell boundaries that have 0 value. Outside the left and right edges of the minimum rectangle, all values are made 0. For all the net nodes at the left or right edge of the minimum rectangle, the edge value is restored to 4, that is a half strength for a possible detour route.

An example of a congestion estimate contribution calculated as just described for a 5-LST net is illustrated in FIG. 17. The LSTs are indicated by an encircled X as was done in FIG. 16. It is seen, that congestion estimates for any number of LSTs is accomplished in a similar manner as to that illustrated.

Figure 18:
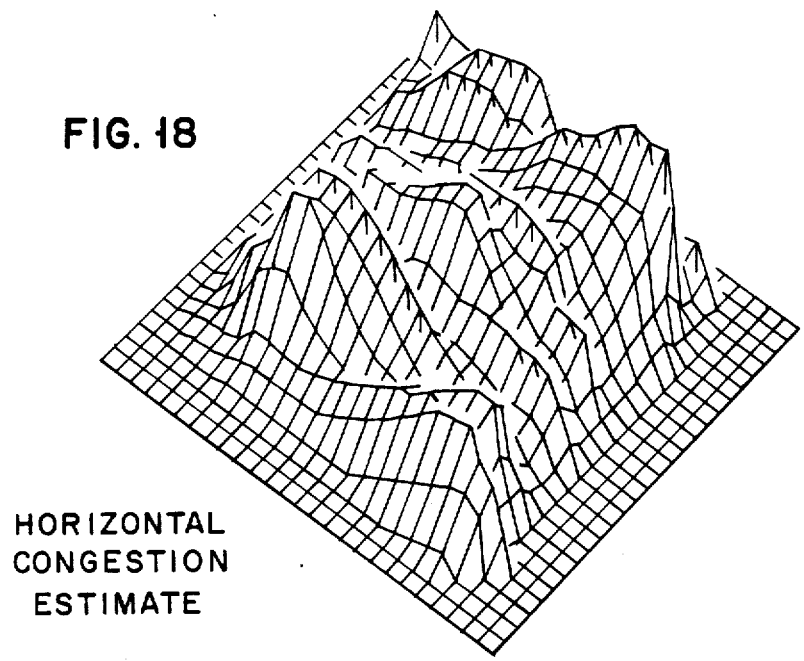
FIG. 18 is a three dimensional graphic example of a horizontal congestion estimate at each cell boundary as it appears inside the chip.
Figure 19:
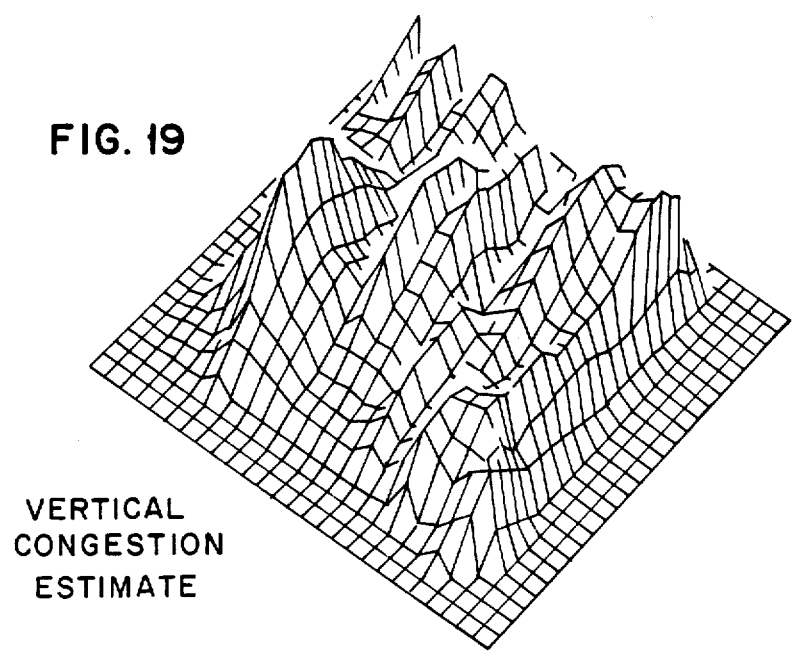
FIG. 19 is a three dimensional graphic example of a vertical congestion estimate at each cell boundary as it appears inside the chip.

FIGS. 18 and 19 are three-dimensional graphic illustrations of horizontal and vertical congestion estimates, respectively as they appear at each cell boundary. The vertical axis is drawn proportional to the congestion estimate value summed over many nets. This graphic representation is indicative of the value of congestion estimates as it appears after logic blocks 260 and 264 of FIG. 13.

In accordance with the explanation set forth above, the steps taken by the controller and the SPEs to perform the logic box 286 of FIG. 14 are set forth in the flowchart of FIG. 20. Each SPE contains its own horizontal cell position (XID) and vertical cell position (YID) in a specified SPE memory address. The controller contains for each net a minimum and maximum of the horizontal (Xmin, Xmax) and vertical (Ymin, Ymax) positions of net LSTs. Furthermore, each SPE representing a cell position in the chip, has stored in its memory a list of nets that have a LST in the cell.

For a given net, then, the horizontal congestion estimate and vertical congestion estimate process are carried out in succession. In the horizontal estimate the template (T) of FIG. 16 is created first and then the values are modified depending on the minimum rectangle area. The flowchart of FIG. 20 sets forth the horizontal process, and the vertical process is carried out in a similar and symmetrical way.

FIGS. 20.1-20.3 when viewed as shown in FIG. 20 is a flowchart representation for the physical design machine system which illustrates how the controller and SPE array logically proceeds in determining the congestion estimate of a given net. The controller enters logic block 302 where the aforementioned NETID, Xmin, Xmax, Ymin, Ymax of the net is broadcast to all SPEs. The condition whether to add or subtract the nets congestion estimate values is also broadcast at this time. The process then proceeds to logic block 304 where the DMA jump address for a horizontal template process is initiated. The process then proceeds to logic block 306 where it resets the array and waits for a while. This reset signal initiates all SPEs' logic block 340, the function of which will be described shortly. The logic functions described at 304 and 306 actually initiates the array at the proper program. The waiting period in 306 is taken sufficiently large to insure the SPEs to have time to set the busy bit in the service word. The logic process then interrogates the service word until the busy bit of the service word becomes logical zero, as shown in 310 and 314. After that, the process enters the logic block 318 for broadcasting the jump address to all SPEs by DMA, for the horizontal modification process. The process then resets the array and waits as indicated at 320. This reset signal initiates as shown by 322 to all SPEs to perform logic block 362 and on. The logic process then proceeds to logic block 324 to read the service word from all of the SPEs in the array until the busy bit becomes zero, as shown in logic blocks 324 and 328. After this, the process repeats an analogous sequence of steps to 304-328 for the vertical congestion estimate of the given net.

The standard operations shown at 304, 306, 310, 318, and 320 are what were described earlier as resetting the array.

Summarizing for the controller actions, the subprocesses 304, 306 and 310 refers to the template generation for the horizontal congestion. The subprocesses 318, 320 and 324 accomplishes this modification relative to the previously described minimum rectangle.

The SPEs are in a wait mode as indicated at 338, until it is reset by the controller by the action of reset logic block 306, which initiates logic block 340 to begin the horizontal template process. The process then proceeds to logic block 342 to set the busy bit of the service word to logical 1. The SPE then initializes the value of the variable TEMP to zero and sets the logical variable called LST-Neighbor to logical zero, 344. The actions of SPE now take on different courses depending on whether the LST of the net is in the cell, the SPE is representing or not. If the cell contains an LST of the net, the SPE marks its logical variable LST to be 1, and if the cell contains no LST, the variable LST is set to 0, as shown in logic blocks 348 and 350, respectively. Only the SPEs whose LST value is 1 now assigns TEMP value of 8 and sends to its neighbors appropriate values as shown in logic block 354. All SPEs, then repeat actions of 356, 358 and 360 or 332 and 334, until a further reset from the global controller at logic block 362. The logic process proceeds to logic block 356 to read from all neighbors, and then to logic block 358 where the question is asked, "Whether any value is received?". If the answer to this question is no, the process proceeds to logic block 366 to set the busy bit off, and proceeds to logic block 356 again. Thus, an SPE repeats attempting to receive from neighbors as long as no value is at each received failure of reception, it resets the busy bit to zero. However, as soon as any value is received from a neighbor (the yes branch out of 358), the SPE sets the busy bit to one in logic block 332 and proceeds to perform actions of logic block 334. Upon completion of the logic block 334, the process returns to the logic block 356 for a repeated attempt at receiving a value from a neighbor.

The template is generated essentially by subprocesses 354, 356 and 334, until none of the SPEs is receiving any value from the neighbors as set forth at logic block 360. Upon reprompting from the controller at logic block 320, each SPE starts the modification process at logic block 362. The values just developed as the variable TEMP is intended for the congestion estimate of the West port of each cell. Logic block 374 modifies the value to zero if the cell is beyond the left boundary of the minimum rectangle as previously described, whereas logic block 380 sets it to 4 if the cell is next to the boundary LST. Logic block 384 sets it to 0 if the cell is above the minimum rectangle, logic block 390 sets it to 0 if the cell is below or to the right of the minimum rectangle. Logic blocks 400 and 402 set the value to either 4 or 0 depending upon whether the cell at the right side of boundary contains an LST or not, respectively. The logic block 398 marks the internal values, inside the minimum rectangle, to 1 if it was 0. After the TEMP values are thus modified, the SPE process either adds in logic block 406 or subtracts in logic block 408, the TEMP value from the total West port congestion estimate. The same TEMP value is then transferred to the West neighbor for its use of the same TEMP value as the East port contribution from the given net, as shown in logic block 410. The process then receives the value sent from its East neighbor 412, and either adds in logic block 416 or subtracts in logic block 418 the values just received from its East port congestion estimate. The logic process then proceeds to logic block 420 to set the busy bit to zero which marks the completion of the horizontal portion of the congestion estimate, and the SPEs await, as indicated at line 422, prompting for the symmetrical vertical process or some other process from the controller.

The process performed by the controller in conjection with the SPEs of the array shown in logic blocks 310, 314, 324, 328 of the former and 342, 360, 332, 364 and 422 of the latter, is what was termed the synchronization mechanism set forth earlier.

Returning briefly to FIG. 13, the subprocess at logic block 266 is now set forth in greater detail. The PORT COST of a cell boundary is developed according to the following theory, as a function of the channel capacity and the congestion estimate value of that port. These port costs when accumulated along a path together with the VIA COST, the cost of bending a wire on route, if any, constitute the cost of a wire route.

Background theory for the preferred embodiment of port costs assumes several objectives.

(a) Channel capacities being equal, the port costs should be proportional to the congestion estimate of the port.

(b) If the channel capacities of the port is zero, the cost should be infinite.

(c) The congestion estimate should affect the cost with diminishing sensitivity when there are larger numbers of tracks available.

Figure 21:
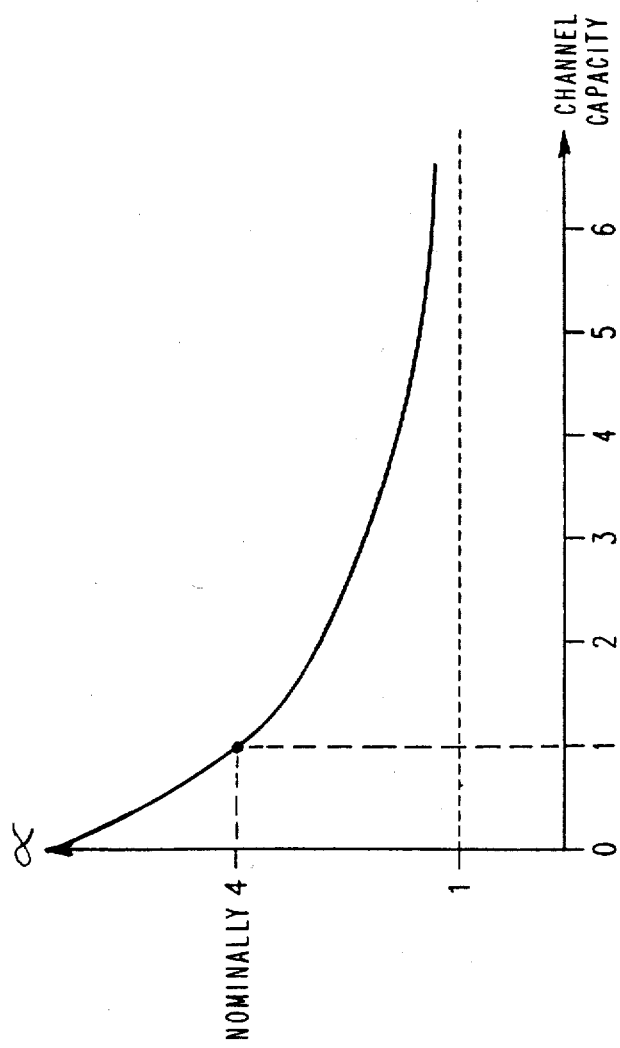
FIG. 21 is a graph which is helpful in understanding the derivation of a congestion estimate.

(d) Given the same congestion estimate at every port, the meaning of PORT COST assigned to ports with different channel capacities can be illustrated as follows. Let the PORT COST for the channel capacity (C) be $\alpha$ times the PORT COST (P) of channel capacity C+1. ($\alpha$ may be 1, 2, 3, 4 .... etc.). A length (L) path going through only the ports whose capacity is (C) incurs the total cost of $\alpha$PL. Whereas a path consisting entirely of ports with one more track (C+1 tracks) can be as long as $\alpha$L and still be of same cost. In another view, the $\alpha$ also implies that one would prefer a path with ($\alpha-1$) if the detour path passes ports of C+1 tracks to replace one passage through a port of C tracks. A preferred choice of $\alpha$ is then, a diminishing function of the channel capacity, i.e., if the number of tracks is small, $\alpha$ is high (in fact, $\alpha = \infty$ if there are no tracks), and if there are many tracks available $\alpha$ tends to be 1, meaning that there is no reason to detour when there are many tracks available. The desirable trend of $\alpha$ as a function of the channel capacity is shown in FIG. 21. This desirable trend of $\alpha$ can be achieved qualitatively by many mechanisms, for example:

$$\alpha = \frac{1}{C - \beta} \text{ where } 0 \leq \beta < 1 \text{ and} \quad (1)$$

$$C > 0$$

$$\alpha = \frac{\beta + 2^{-C/\delta}}{\beta + 2^{-(C+1)/\delta}} \text{ where } 0 \leq \beta < 1, \quad (2)$$

$C > 0$ and $\delta$ is a small number, etc.

(e) The PORT COST should be high when the demand is higher than the supply, and very little when the supply is higher than the demand. For a given congestion estimate value of CE, (CE÷16) is used to approximate the demand.

Using the above reasoning, the PORT COST, PC, calculation takes the form as follows:

$$PC = \infty \text{ if } C = 0 \quad (1)$$

$$PC = CD + CE \times 2 \exp\frac{CE}{16} - C) \times 1 - 1) \quad (2)$$

if $$\frac{CE}{16} \leq C; \text{ excess supply case.}$$

$$PC = CD + 4.5 \, CE \text{ for } C = 1, \quad (3)$$
$$CD + 1.5 \, CE \text{ for } C = 2,$$
$$CD + 0.5 \, CE + CE \times 2 \exp\left(\frac{1-C}{2}\right) \text{ for}$$
$$C \geq 3 \text{ if } \frac{CE}{16} > C; \text{ excess demand case,}$$

where 2 exp A denotes 2 to the power of A.

Figure 22:
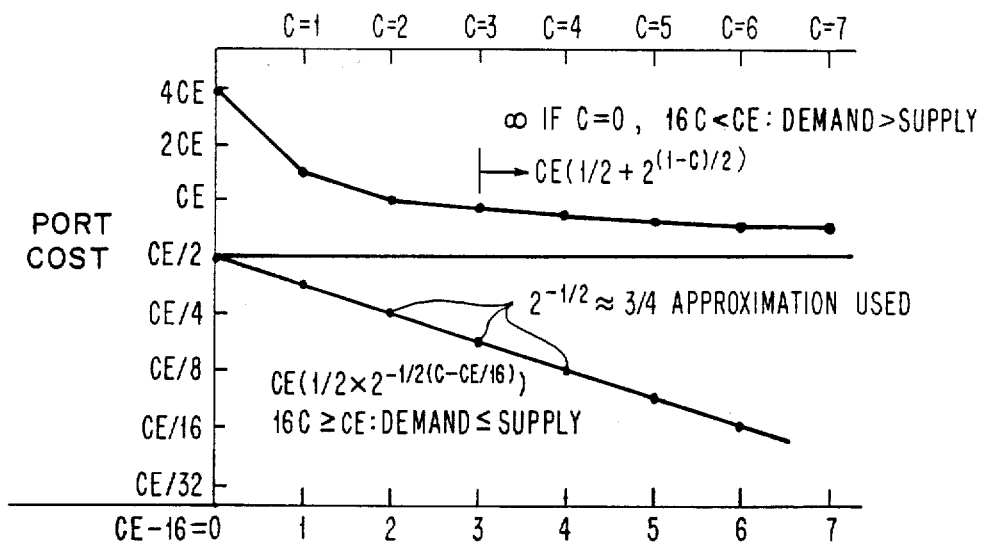
FIG. 22 is a graph which is helpful in understanding port cost in a congestion estimate.
Figure 23:
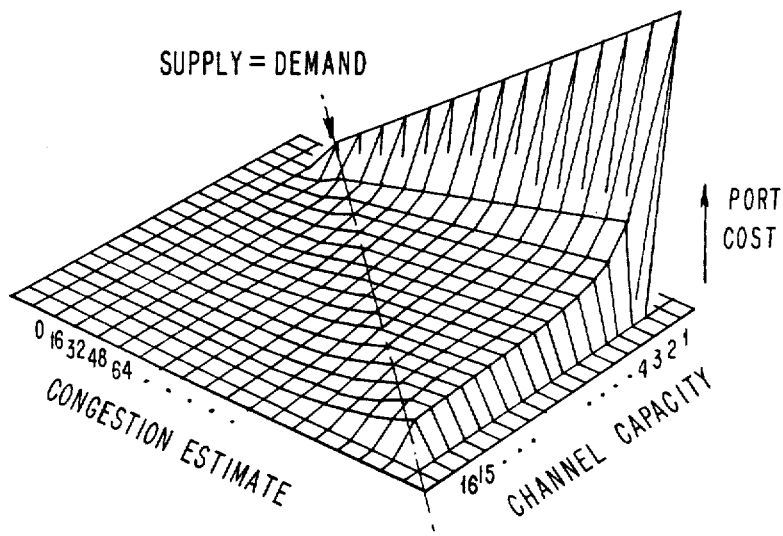
FIG. 23 is a three dimensional graph illustrating port cost.

FIG. 22 shows pictorially the PORT COST as a function of the CE and C whereas FIG. 23 presents another qualitative view of the PORT COST in the vertical axis as a function of the two variables.

Another term may be added to the PORT COST. This term might take the form of the direct distance cost, a fixed quantity for crossing a cell boundary everywhere, or might represent some measure of the internal cell complexity. This parameter is denoted as CD in the above equations. The PORT COST calculation is done in every SPE in the array upon prompting by the controller. The exact flowchart of the process is straightforward and hence omitted.

The via cost, VC, of a cell is calculated as a function of Vused, the number of vias already used in the cell. The function also makes use of the cell specific parameters, Vmax and Vmin, explained earlier. Each cell, or the corresponding SPE calculates the via cost when prompted by the controller as follows.

(a) Vused<Vmin: VC is almost zero, but a small value may be assigned to serve as a tie breaker. VC=Vused may be used for this purpose.

(b) Vused=Vmax: VC=∞

(c) Vmin≦Vused<Vmax: Exponentially growing function of Vused, such that VC becomes infinity at Vused=Vmax. The infinity is implemented as a maximum computer word value which is $M=(2\ exp16)-1=65,535$ in the current embodiment. Therefore, the VC for this case is computed as $$VC = max(Vused, Mx2exp(-\delta x(Vmax-Vused)))$$

where $\delta$ is a small constant less than or equal to 2.

Returning once again to FIG. 13, the main processing step 268, wire net I, is set forth in detail below. At the outset, the following values are developed in each SPE.

(a) The net to be wired (NET I).
(b) Current port costs for all 4 ports.
(c) Current via cost for the cell.

Besides, the SPE contains in its memory, the following values, corresponding to the cell, or global constants stored earlier, including others.

(d) Detour limit (DLIM).
(e) Current channel capacity of all 4 ports.
(f) Current congestion estimate of 4 ports.
(g) Vmin, Vmax, Vused and CD for the cell.

Figure 24:
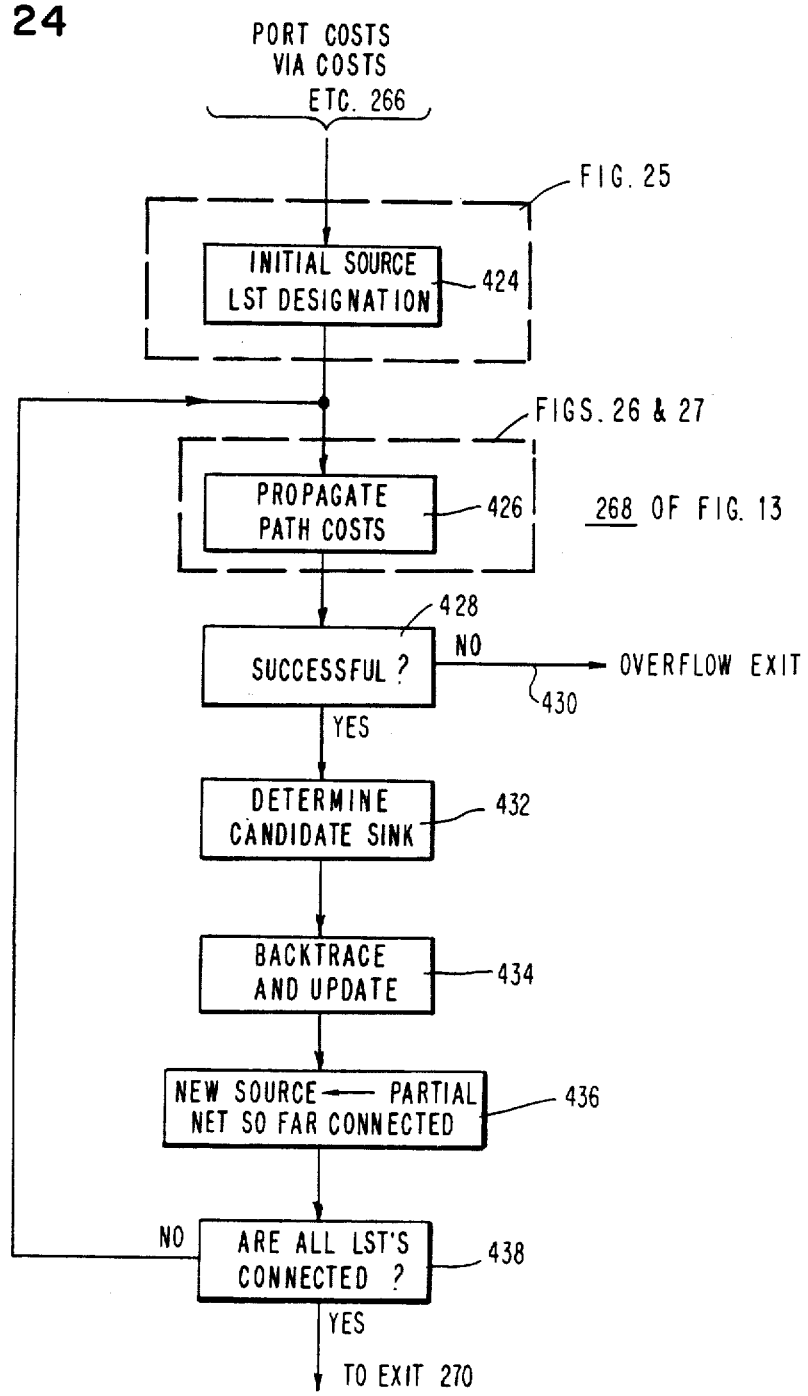
FIG. 24 is a detailed flowchart of logic block 268 of FIG. 13.

FIG. 24 is a more detailed flowchart of logic block 268, wire-net-I, depicting the global routing process of FIG. 13. As previously set forth the port and via costs are provided from logic block 266 to 268 to begin the global routing of a given net from a designated source. The source refers to that part of the net that is connected already in the process. Initially, then, usually one of the LSTs of the net is selected to be the initial source as designated at 424. Sometimes, the net may have a portion already partially routed previous to the global wiring process, in which case, the entire partial net serves as a source. An arbitrary LST can be selected as the initial source. However, different schemes may be utilized in selecting the initial source to enhance the general wirability. The remaining LSTs of the net are considered the sinks. The logic process continues to logic block 426 to propagate PATH COST, and then to logic block 428 to determine if the propagation was successful. If it was not successful, there is an overflow exit at logic line 430 and if it was successful, the logic process proceeds to logic block 432 to determine which of the reached sink would be connected to the source. The logic process then proceeds to logic block 434 to initiate a back trace and update from the sink to the source. The logic process then proceeds to logic block 436 to append the total newly connected route to the source. The logic process then proceeds to logic block 438 to determine if all LSTs are connected. If no, the process loops back to the logic block 426. If all LSTs are connected, the logic exits to logic block 270 of FIG. 13.

At each pass through subprocesses 426 through 438, an additional LST is connected to the already connected portion of the net until all LSTs are connected. Logic blocks 426 through 434 determine the least cost path from the entire source to any of the sink LSTs, and connects the LST through the path. The length of the path is controlled to be within a differential detour limits (DLIM) of the shortest reachable distance from the source to the sinks. Once a LST is connected to the source, the entire partial route including the newly connected LST becomes the new source as indicated at logic block 436 and the new paths through logic blocks 426 through 434 are repeated until all LSTs of the net are connected. If no more LSTs are connectable from the source, an unfortunate overflow situation is encountered at logic block 428, entailing an overflow exit at line 430 which is then handled in another manner.

The manner by which the various estimates and costs are computed, the choice of the detour limit (nominally, in the range from 0 to 15 or so, depending upon the chip size and complexity), the order of nets wired and the initial source selection, all contribute to the successful wiring of all the nets. However, once these are determined, the machine disclosed determines the true best cost route within the given constraints rapidly and effectively. For all practical purposes, the known state of the art methods can only find some feasible route which may not have the best cost. The employment of the above named parameters is possible due in large part to the speed of parallel processing in the array. Therefore, the overflow exit 430 is to be an exceptional event in the process.

The subprocess 274 set forth in FIG. 13 is used to handle the overflow situation. One way to handle this situation is to record the overflow and proceed to the next net as illustrated. Then at the end of the total global routing, another process for the overflow handling can be initiated. Alternatively, the subprocess 274 can be replaced with in-situ overflow handling subprocess, that may modify some of the previously routed nets and retry the current net routing.

The controller initiates the passes through the subprocesses 426-436 of FIG. 24, normally one less time than the total number of LSTs in the net, to connect all the LSTs.

FIG. 25 is the flowchart of the main subprocess 426 (propagate path costs) of FIG. 24 for the controller. The process starts at logic block 444 and proceeds to logic block 446 to first reset the array for propagation initialization. Then the process waits in the usual manner as shown by 448 and 450 until the busy bit is off. The logic process proceeds to logic block 452 to reset the array for propagation. The logic process then waits until the busy bit is off, in the usual manner. If the busy bit is off, the process proceeds to logic block 460 to determine if the End Flag is on. If the End Flag is on, the process exits to logic block 262 of the FIG. 13. If the End Flag is not on, the process then proceeds to logic block 464 to determine if the Action Flag is off. If the Action Flag is not off, the process returns to logic block 452. If the Action Flag is off, the logic process makes an overflow exit to logic block 274 of FIG. 13.

FIGS. 26.1, 26.2 and 26.3 and 27 are the detail flowcharts of the propagate-path-costs subprocess 426 of FIG. 24, for the SPEs in the array. At logic block 472 the SPEs are reset to propagation initialization, and the logic process proceeds to a logic block 474 where the busy bit is set on. Propagation initialization then takes place at logic block 476, with the pertinent variables and flags to be used in the propagation step being set forth in this logic block. Initially, all ports are cleared by reading all neighbors and ignoring the neighbor content, 476.1. This makes all ports ready to receive information from the neighbor by resetting the port mailbox flag mechanism. For each port there is assigned a stack, 476.4, of flag values whose length $D=1+DLIM$, the detour limit, and is indexed by the stack pointer, 476.6. The valid indices are 0 through (D−1). The stack contains, for the given outgoing port, which of the incoming port contains the best cost path at the time indicated circularly by the stack pointer.

All SPEs participate in the propagation of path cost for the duration of at most D times, once the valid path cost is first received. The action counter, 476.2, is used to stop the SPE participation after the duration. The Action Flag bit, 476.3, is one of the service word bits used to indicate to the controller that the SPE is still within the duration of active propagation. The End Flag, 476.5, is another bit of the service word, which when set to logical 1 indicates to the controller that the cell (only the sink cells) with LST of net has received path costs from somewhere for the specified action period (D), i.e., all paths from the source to sink within the detour limit has been traversed. The Best Value for use of the sink cells, is initialized to M, the number representing infinity.

Return briefly to FIG. 25. After the initialization 446, the controller prompts the propagation at logic block 452. Each prompting of the propagation lengthens the developing paths by one cell pitch. The controller checks if all SPEs finish this one cell propagation and further check in logic block 460 to see if the End Flag is on. The End of Flag on signifies that all paths from source to sink within the detour limit have been traversed. If the End Flag is still not on, the controller checks, logic block 464, to see if any SPE is still within the active D propagation cycle and if so, prompts another propagation cycle, logic block 452, to the array. If, however, no SPE is in the active period an overflow is detected and appropriate action is taken, such as shown at logic block 274 of FIG. 13. Each pass through the propagation, 452, causes the array to process one additional length, in cell pitches, of the path.

After the SPEs complete the propagation initialization, the actual propagation action repeats as set forth above, from logic block 482 through 494, 516, or 554, as many times as the controller keeps reprompting the propagation. At each such passage, an SPE first checks whether the Action Counter value equals D, in logic block 486. If the Action Counter value is D, the logic process proceeds to logic 488 to clear all ports, and then to logic block 490 to set the Action Flag off. The logic process then proceeds to logic block 492 to set the busy bit to off and then proceed to wait as indicated at 494. If the Action Counter value is not D, the logic process proceeds in different courses depending on whether the SPE represents a source cell or not (logic block 496). Then the source cell SPEs proceeds to FIG. 27, block 500 to increment the Action Counter and to set the Action Flag on. Following this the logic process proceeds to logic block 502 to clear all ports and then proceeds to logic block 504 to compute path cost to each port by simply assigning the port cost directly to the path cost for all four ports which are then sent to corresponding neighbors. The source cell SPEs then sets the busy flag off and waits (usually for the next pass through propagation). When a path cost is 'sent' to a neighbor, it is meant that the actual sending of the value occurs only if the path cost is less than M, the value representing the infinity, as illustrated by logic blocks 506, 510 and 512. This applies in all cases when 'sending' a path cost to a neighbor as set forth below.

Return to FIG. 26.1. If the SPE does not represent a source cell, the process proceeds from logic block 496 to logic block 520 of FIG. 26.2 to read all neighbors, i.e., path cost from N,E,S,W. If no value is sent from a neighbor the value is set to M. The logic process then proceeds to logic block 522 to determine whether any value other than M is received. If no finite value were received, the process proceeds to logic block 548 of FIG. 26.3. If any finite path cost was received the process proceeds to logic block 526 to set the Action Flag on and to increment the action counter. The logic process then branches at logic block 528 to either logic block 538, in case of sink cells, or to logic block 532, in case of intermediate cells. The SPEs representing the intermediate cells, then compute bending path costs, as shown in logic block 532. The bending path cost is simply the sum of the via cost and the received path cost. The summary action represented by ⊕ (or ADD ) in logic block 532 is set forth later. The logic then proceeds to logic block 534 where for each port, the following actions are taken:

(1) Find the direction of the minimum path cost among the path cost of directly opposite port, versus two bending path costs for the orthogonal direction ports, e.g., for North port, the minimum of (S, EE, WW).

(2) Record the best direction into the stack pointed by the stack pointer.

(3) Add the outgoing port cost to the path cost.

(4) Send the path cost to the neighbor.

The logic process then proceeds from logic block 534 to logic block 548 on FIG. 26.3. As previously set forth, the actions of sink cell SPEs branch from logic block 528 to logic block 538 where the value of the Action Counter is checked against D. The End Flag is set on at logic block 540 if the Action Counter equals D. The sink cell SPEs then proceed to logic block 542 to find the best incoming path cost and note the new best direction. The logic process then proceeds to logic block 544 where the new best value is compared against the best value stored earlier. If the earlier value is no worse, the process directly proceeds to logic block 548. If the new best value is better, the process proceeds to logic block 546 to update the best value, the best index, and the best port. The final action taken by the SPEs still active is to increment the stack pointer module D, as shown by logic blocks 548, 550 and 552. The process then sets the busy bit off and waits.

Logic blocks 558, 560 and 562 are a more detailed version of logic block 532 where the values are added in logic block 558 and checked at logic block 560 to determine if the resultant value is greater than M. If the value is greater than M, it is set back to M at block 562. This modified addition is caused by the infinity representation conversion, for any number added to infinity results in infinity.

The SPEs that represent the source cells basically pass appropriate port costs onto their neighbors as the path costs, for the duration of D number of passes. The Action Counter is incremented at each pass and when it reaches D, as set forth at logic block 486, the source SPE ceases to participate in the propagation and lowers the Action Flag. An intermediate cell basically waits until the first valid path cost has been sent to it from one or more of the neighbors to participate in the propagation. The SPEs representing the intermediate cells and the sink cells increment their stack pointers as set forth in logic block 548, at each pass. This variable is actually incremented in a circular fashion by the mechanism of logic blocks 548, 550 and 552. The non-source cells, while they are active, by virtue of first having received a valid path cost from a neighbor, as set forth in logic blocks 520 and 522, sets the Action Flag, on, and increments the Action Counter. The Action Counter value is used to self-terminate, as set forth in logic block 486, the active period, as set forth in logic block 490, in the same manner it was set forth for the source cells. Any sink SPE raises the END flag, as set forth at logic block 540 to signal its termination of the active period which causes the end of the total propagation phase.

Two assertions arising from the nature of these actions are:

(1) Once a cell (SPE) becomes active, it remains continually active for up to D passes, (i.e., the yes branch from logic block 522.)

(2) The best path value any port of any SPE receives is a non-increasing function of the number of passes.

During the active period, the intermediate cells further process, as set forth in logic blocks 532 and 534, where first, the incoming path costs N,E,S,W, correspondingly from North, East, South, West ports are added to the via cost VC to develop NN, EE, SS and WW, the path cost of bending within the cell. The circled addition set forth in logic block 532 is carried out as shown in logic blocks 558, 560 and 562 as previously set forth. That is, if the values exceed M, which represent infinity, it is set back to M. In logic block 534, for each outgoing port the SPE determines the best incoming path direction and the cost, records the direction in the stack and sends the updated path cost to the neighbor. It is understood that by mention of sending the path cost to a neighbor, at all description, as set forth herein, it is meant that the path cost is sent only if it is less than the infinity, M, as shown in logic block 508. Taking the North port for example:

(1) The best path cost is determined by comparing the values S, EE and WW. The latter two represent costs for paths which must bend within the cell to go out through the North.

(2) The winning direction (incoming direction S,E or W, in case), is recorded in the North port flag stack pointed by the current stack pointer.

(3) The North port cost is then added to this best path cost to be given to North neighbor as its incoming path cost.

(4) The updated path cost is then sent to the North neighbor.

Similar and appropriate direction adjusted operation is performed for all other ports.

A sink cell during the active period, further performs the actions set forth in logic blocks 542, 544 and 546. The sink cell finds the best of incoming path costs, N,E,S,W and notes the winning direction as set forth in logic block 542. If the new best path cost is better than the old best value the Best Value, Best Port, Best Index are updated as shown in the subprocess as set forth in logic block 546.

The total number of passes the controller prompts the array for propagation is DLIM plus the reachable distance between source and sink plus one.

FIGS. 28.1–28.8 illustrate an example of the steps taken in computing the propagation of path cost. The cells marked A are the source cells, depicted as a partial net. The cells B and C are two additional LST's of the net. The reachable distance from the source to sink is four cell pitches, connecting A to C. The $4+2+1=7$ total number of passes are set forth in the FIGS. 28.1–28.8. The numbers in the cell represent the cell's action counter at the beginning of the passes. The activity pattern starts out from the source, progresses outward in wave-like fashion, gradually forming an activity band of cells with thickness $D=3$ by the third pass as set forth in FIG. 28.4. The band of activity proceeds out until the nearest LST (C) has been active $D=3$ times as shown in FIG. 28.8. The SPE at C raises the END flag which effectively halts the path cost propagation process.

As set forth above, it is to be appreciated that the ORing bus structure, illustrated in FIG. 3, from array to the controller via the array I/O processor, is gainfully employed in controllerarray communications. Especially the service word, ORed from all SPEs to the array enables the controller to recognize the following:

(a) Busy bit: if any SPE is busy it remains on. Only when no SPE is busy, the busy bit goes off.

(b) The action flag bit: as long as any SPE is participating in the valid propagation phase, the action flag bit stays on.

(c) END flag: any of the sinks raising this bit commands the controller to stop the cost propagation process.

Returning briefly to FIG. 24, when the path cost propagation phase set forth in logic block 426 is successfully terminated, the controller initiates the subprocess set forth in logic block 432 which determines which of the reached sink cells (in case more than one are reached at the time of the halt, e.g., both D and C are reached as set forth in FIGS. 28.1–28.8) is to be connected to the source.

The candidate sink cell to be connected to the source, which is the partially connected portion of the net so far into the net routing, is the sink that contains the best of the BEST VALUE The sink cells whose Action Flag is ON, all participate in this phase and the controller, by polling them, determines which of these would be the candidate. This is accomplished by the sink SPEs which have been reached (whose action flag is ON) raising their XY response lines, and then the controller selecting the responding rows and columns one at a time and interrogating their best values to find the minimum. Once the candidate sink is thus determined the controller informs the chosen SPE of its status.

The back-trace and update process set forth in logic block 434 of FIG. 24, then connects the chosen candidate sink to the source. The controller prompts the array, initializes appropriate flags and informs the candidate sink via the I/O register communications (i.e., the flag mechanism of the AIN latch), to initialize the back-trace.

FIGS. 29.1 and 29.2 when viewed with FIG. 29.1 on the top and FIG. 29.2 on the bottom is a flow chart indicative of the respective SPE programs in the array. The controller terminates the back-trace process when it detects the END flag going up. The END flag, a designated bit in the service word is initially down and is used by the source cell SPEs to signal the end of the back-trace. The actions of the controller for the back-trace routine is straightforward and the detail flowchart is not shown.

In the course of the back-trace the cells that lie on the route of the path all mark themselves as part of the net and update the channel capacities and the number of used vias if any. The manner by which the cells record as being part of the net is through the use of the EXIT mask associated to the net ID. The EXIT mask is a four bit variable where each bit represents the corresponding directions N,E,S,W, respectively. The EXIT mask associated to a net signifies that the net passes through the cell, and is connected through the ports that correspond to the bits set as 1 in the EXIT mask.

The SPEs, when prompted by the controller, first reset the END FLAG to zero and clear all ports at logic block 568. The SPEs then perform specialized actions depending upon the cell a given SPE represents. This is determined at logic block 570 relative to cell status: a source, a sink, or an intermediate cell. The sink cell SPE then proceeds to determine if the cell is a candidate sink. This is accomplished by reading the service word as indicated at logic block 572 until the AIN flag bit becomes 1. Once the AIN bit is read as ON, the process in the candidate sink SPE proceeds to logic block 576. The controller sets the AIN flag bit of the candidate sink by uniquely selecting the cell and sending an arbitrary word to the cell I-register, which sets the AIN flag as previously set forth relative to the SPE block diagram.

The SPE of the candidate sink cell then initiates the back-trace by first copying the Best Direction into the direction to back-trace (DIRC) and Best Index into the stack pointer as shown at logic block 576. The back-trace outgoing ports channel capacity is decremented to indicate the usage of a track by the net, as set forth at logic block 578. The nets EXIT mask is modified by setting the bit corresponding to the DIRC, as indicated at logic block 580, stack pointer decremented, in a circular manner (i.e., if −1, reset to D −1) as indicated at logic block 582, and finally, the stack pointer is sent to the neighbor indicated by the DIRC, as set forth at logic block 584.

The intermediate SPEs read all their neighbors as indicated at logic block 588 until some valid data is passed to them. If a value is received, which is a stack pointer value, it notes the incoming direction as IN-PORT, as set forth at logic block 592, and assigns the value received as its stack pointer as indicated at logic block 594, and it decrements the INPORT channel capacity as set forth at logic block 596. The outgoing direction for the back-trace is determined as set forth at logic block 598, by looking up the stored direction in the INPORTs flag stack pointed to by the stack pointer, and then the proceeds to perform the logic blocks 578 through 584 as previously set forth. When the EXIT mask is marked as set forth at logic block 580, the IN-PORT bit as well as the DIRC port bit, are set to 1.

For a source cell, all neighbors are read as indicated at logic block 602 until a value is received. If a value is received, the process proceeds to logic block 606 to note the port where the value came in as the INPORT. The source cell which receives the value from its neighbor, then updates the channel capacity of the INPORT as indicated at logic block 608, and marks the net exit mask as indicated at logic block 610 and raises the END FLAG at logic block 610.

This action effectively terminates the back-trace process as indicated at 434 of FIG. 24. The nets thus far connected, that is the cells whose exit mask for the net is non-empty (not all zeros), now set themselves as the new sources to repeat the propagation and back-trace controlled by the controller as long as there remains LSTs of net to be connected. This completes a description for the global wiring of a given net.

There are many useful variations that may be utilized to set forth an effective global wiring process utilizing the array of processors and the system described herein. It is possible to wire more than one net simultaneously when it is known that the active cells for two or more nets do not overlap one another. Another variation is, rather than a whole net at a time, various parts of a plurality of nets may be completed in an interleave mode where one connection of one net is followed by another connection of another net, depending upon local congestion measurements.

The discussion above assumed that the processor array is at least as large as the chip in question, in its horizontal and vertical cell dimensions. A useful method utilizing a special purpose time sharing of SPEs for handling larger size problems than the array size, is set forth hereinafter. Although the processor array must be a reasonable size to be practical, it is possible in principle to utilize a small array to emulate without much penalty, a machine representing chips of a size much greater than the given machine. Regardless of the size of the array, it is natural that problem chips of bigger size than the machine would be put to task. The mechanism described here provides a novel solution to this end.

Referring back to FIG. 11, denote by M and N the number of cells of the chip in horizontal dimension and vertical dimension, respectively. Further, denote by m and n the number of columns and rows, respectively, of the processor array of SPEs of FIG. 2. Relative to FIG. 30, let $M=Qm+r$ where $0 \leq Q$ and $0 \leq r < m$; and $N=Sn+t$ where $0 \leq S$ and $0 \leq t < n$. The chip is to be partitioned, conceptually, into FRAMES that are the same as the machine size, N rows by M columns of cells. Thus, there will be $(Q+1)$ FRAMES horizontally and $(S+1)$ FRAMES vertically, of which the first S by Q FRAMES are the full sizes and the last in each dimension are possibly partial sizes to accommodate the leftover cells r and t, in each dimension.

The machine array boundaries as shown in the FIG. 2 correspond with the boundaries of the FRAME of cells in the chip. The end around connections of the neighborhood at the boundary cells make possible the communication between adjacent cells at the frame boundaries on the chip. Each SPE of the machine, then, represents, not just one cell of the chip, but up to $(Q+1) \times (S+1)$ cells regularly spaced over the entire chip.

The end around neighbor connection of the array is not strictly necessary to implement the FRAME concept. The FRAMES can be thought of as folded in accordion style in both dimensions. One disadvantage of folding in such manner is that the cell indices in alternating frames are reversed, thereby necessitating an extensive programming overhead to account for this direction reversals. Yet another disadvantage is that on a one direction sweep operation, pipelining of many frame's worth of sweeping is not possible under this arrangement.

Conceptually, then, the chip is considered to be superimposed on the array of frames each of which is identical in size to the machine processor array. The chip is lined up against the left and bottom edges of these frame arrays which is the origin of the X and Y coordinates. Each frame has a frame ID, called FID that is in the range of $$0 \leq FID < (S+1) \times (Q+1)$$

The horizontal and vertical cell coordinates relative to a frame (also relative to the machine array) are called FXID and FYID, respectively. The translation of chip cells XID and YID to the frame relative values are developed by:

$$FID = (Q + 1) \times \left\lfloor \frac{YID}{n} \right\rfloor + \left\lfloor \frac{XID}{m} \right\rfloor \qquad (1)$$

$$FXID = XID \bmod m \qquad (2)$$
$$FYID = YID \bmod n, \qquad (3)$$

where $$\left\lfloor \frac{x}{y} \right\rfloor$$

denotes the quotient and x mod y denotes the remainder, respectively, of x determined by the relation, $$XID = FXID + m \times FID \bmod (Q + 1)) \qquad (4)$$

$$YID = FYID + n \times \frac{FID}{Q + 1} \qquad (5)$$

Figure 30:
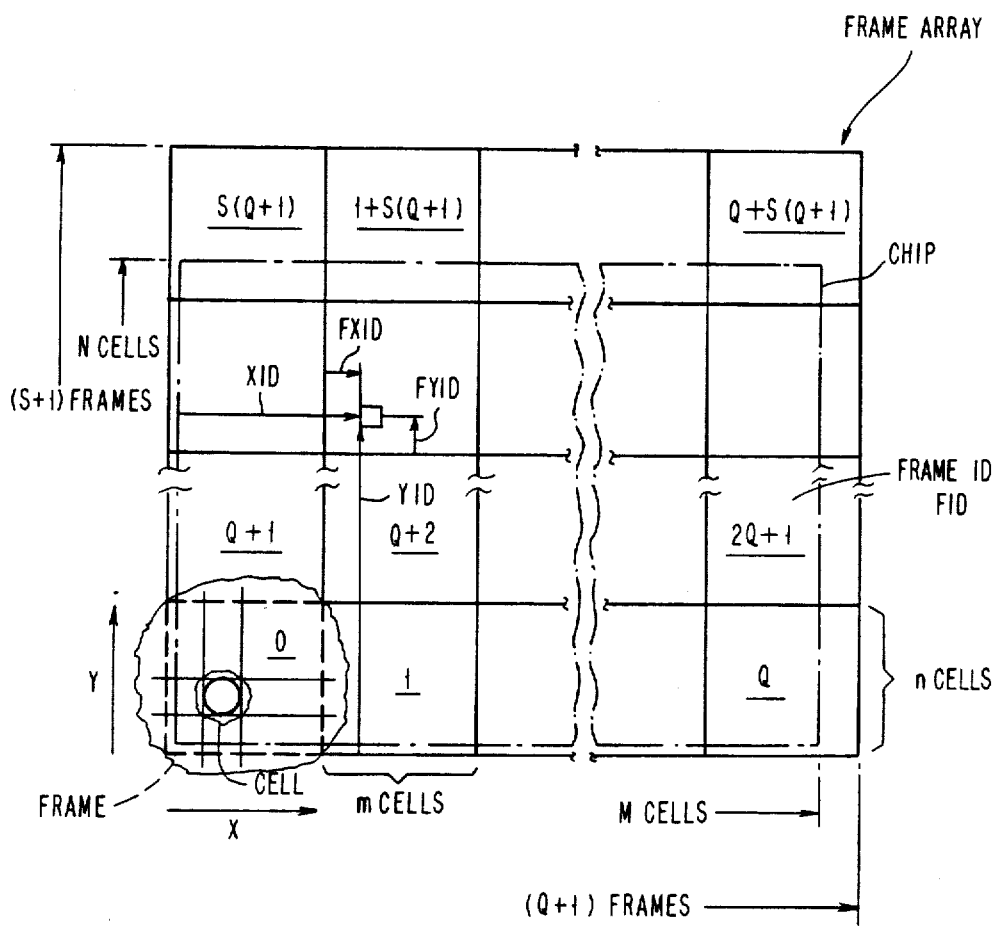
FIG. 30 is a schematic diagram of a masterslice chip illustrating the chip/frame relation.

FIG. 30 depicts the chip frame, frame ID, FXID, FYID, XID and YID of the cells.

The quotient and remainder of the divisions that occur above can be rather trivial microprocessor operations of simple shifting when n, m, and (Q+1) are some powers of 2.

Having shown how the references are converted from the chip's point of view and that of the FRAMES, the modifications to the embodiment of various processes disclosed earlier are set forth below.

Each SPE of the machine allocates its local memory, 196 of FIG. 6, into common area and the rest that are equally partitioned to each frame of the chip. All common data such as the aforementioned detour limit, stack pointer, current net ID, etc., and the SPE program reside in this common area. All cell specific data, such as the cell ID's, congestion estimates, the net data, the port costs, via-related values, etc. are then stored in the corresponding frame area of the memory. Accordingly, the overall memory requirement of the whole machine would be almost the same as the large machine of the same size as the chip, even though the number of processors are smaller. Each SPE simply requires more memory space to hold data for all the cells it represents.

Therefore, the controller as well as neighbors must specify what frame's data is being sent to the SPE at the time of the data transfers, unless the data is of framewise common nature. Also, whenever the data is received by an SPE, it stores the data in the proper partition of the memory corresponding to the accompanying frame number it received with the data.

To actually communicate to a cell, the controller must first convert the cell ID (XID, YID) into the frame relevant parameters (FID, FXID, FYID) and select FXID, FYID on the horizontal and vertical selectors, respectively, before the transmission of data and frame number FID to the SPE.

For a cell to communicate to a neighbor, the frame number accompanying the data would be the same if the neighbor is in the same frame as the cell. Thus, only the SPEs at the boundary of a frame communicating to neighbors outside the frame need adjust the receiving neighbor's frame number. If the data in the SPE is of the frame number $FID = k(Q+1) + l$ where $0 \leq k \leq S$ and $0 \leq l \leq Q$, the neighbor's frame number is computed as FID', as given below.

WEST: FID' = FID if FXID ≧ 1
FID' = FID − 1 if l ≧ 1 and FXID = 0
FID' is non-existent (i.e., no West neighbor) if FXID = 0 and l = 0
EAST: FID' = FID if FXID < m − 1
FID' = FID + 1 if l < Q and FXID = m − 1
FID' is non-existent if FXID = m − 1 and l = Q
NORTH: FID' = FID if FYID < n − 1
FID' = FID + (Q + 1) if k < S and FYID = n − 1
FID' is non-existent if FYID = n − 1 and k = S.
SOUTH: FID' = FID if FYID ≧ 1
FID' = FID − (Q + 1) if k ≧ 1 and FYID = 0
FID' is non-existent if k = 0 and FYID = 0

The above conditions on neighbors' existence is in addition to the active cell area status discussed earlier.

Using the frame concept, all of the previously described system is modified to accommodate the framed structure. Most of these transforms in programs are implementable by a skilled person in the microprocessor programming art. Some of the performance consequence of the framing and some of the preferred embodiment of very general paradigms are disclosed hereinafter.

(Paradigm A)

Cell sequential operations: Operations accomplished one cell at a time such as the back-trace of the global routing does not significantly change. The performance is essentially the same as the chipsize machine, except the overhead of computing and transmitting the frame ID for each data transfer.

(Paradigm B)

Horizontal (or vertical) sweep operations: In many occasions, e.g., logic block 236 of exact embedding FIG. 10, during the course of physical design process, there arises the need for performing computations either in row order or column order and in either increasing or decreasing order of indices. FIG. 31 illustrates a flowchart of the paradigm for the full size machine.

The left end cell computes as indicated at logic block 616, with the results passed to its East neighbor as shown in logic block 618. The middle cells receive information from the West as indicated at logic block 620, with computations being based on this information being performed at logic block 622. The results of the computations at logic block 622 is passed to its East neighbor as shown in logic block 618.

The right end cells receive information from the West neighbor as indicated at logic block 624, with computations being performed on this information as indicated at logic block 626. At the completion of the computation the controller is notified as indicated in logic block 628.

In a framed machine of reduced size, the full parallel processing of all the rows shown in the FIG. 31 is not possible. However, the SPEs can process the rows of successive frames in a pipeline mode, up to m frames in a pipe. FIGS. 32.1-32.3 illustrate the concept in timed steps. On the left side the busy SPEs on the full size machine for the chip with (M=9, N=6) is shaded for each time step. On the right side of the frame the smaller machine of m=3 columns by n=2 rows is used for pipelined sweeping. The machine SPE's busy status and the corresponding cells on the chip is shaded. In all, the frame is shown in bold lines for reference. In general then the total sweep time for the full size machine is M, and the framed machine is $$M \times \frac{N}{nxm},$$

asymptotically. It is evident that the performance penalty for this type of operation is not very much.

(Paradigm C)

Full parallel operations: Port cost calculation, via cost calculation, etc. fall into this category where all cells' SPE are busy in full parallel in the full size machine. The smaller machine can only process one frame at a time, and the time taken to do the process would be MN/mn, compared to the full size machine time of just 1 unit.

(Paradigm D)

Global propagation operation: It was shown earlier that the activities in the full size machine propagates from the source cells outward in a diamond like wave fashion. Superimposed onto a frame, these active cells overlap in one or more fold onto the SPEs of the smaller machine. Therefore, in each pass of connecting an additional LST, as shown in logic blocks 426-438 of FIG. 24, these subprocesses must accommodate the frames. This is accomplished by use of an auxiliary work stack into which all incoming neighbors' path costs are stored into appropriate frame's portion. After a round of receiving, the SPE performs and buffers the outgoing path costs until all frames' work is performed. This is followed by a round of sending to the neighbors the outgoing path costs accompanied by the frame ID to start a new pass. Obviously, the SPE resets the busy flag only after it processed all tasks in the work stack. It is then natural that, at any given time, each SPE may be processing the propagation of a cell in different frames. The performance penalty when the machine size is small (say less than 8×8) is quite high. The penalty progressively lessens as the machine size increases towards the chip size. Compared to an infinite chip with infinite machine, a 32×32 processor array machine would incur a doubling of the processing time, on the average. A detailed analysis of this performance penalty appears elsewhere.

What is essential is the concept of the work stack which is used to account for the processing of all the cells in different frames that the SPE in the framed machine represents.

Figure 33:
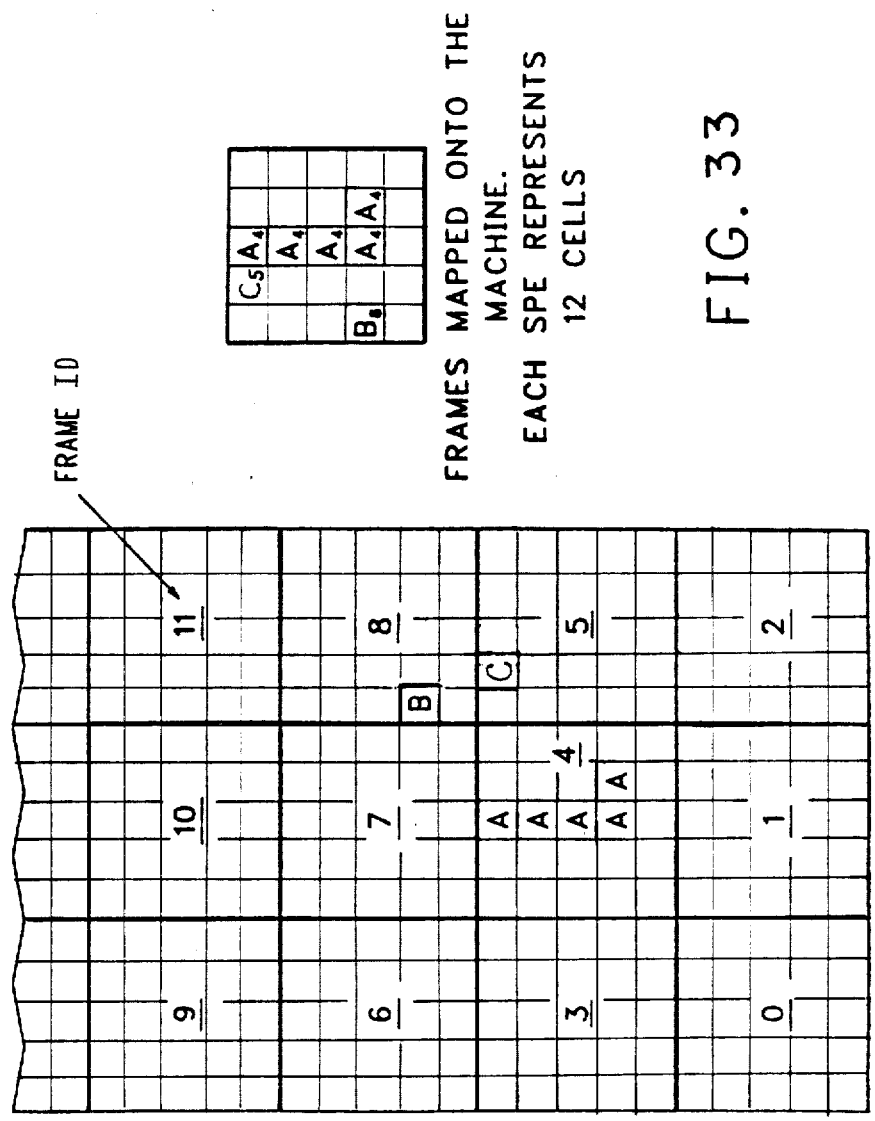
FIG. 33 illustrates how, in an activity pattern as shown in FIGS. 28.1-28.8, the maximum overlap of cells onto SPEs occur in the frame machine.

Referring back to the example shown in FIGS. 28.1-28.8, assume the frames given in FIG. 33, for example. From these two figures, the maximum overlap of active cells onto SPEs occur as follows:

| | PROCESSING TIME | | |
|---|---|---|---|
| | CHIP SIZED MACHINE | (MAXIMUM OVERLAP) 5 × 5 MACHINE | FRAMES INVOLVED |
| W1 | 1 | 1 | 4,5,8 |
| W2 | 1 | 2 | 4,5,7,8 |
| W3 | 1 | 2 | 1,4,5,7,8, |
| W4 | 1 | 3 | 1,3,4,5,7,8 |
| W5 | 1 | 4 | 1,2,3,4,5,6,7,8 |
| W6 | 1 | 4 | 0~8 |
| W7 | 1 | 6 | 0.1.2.3.5.6.7.8.10 |
| Total | 7 | 22 | |

Therefore, the 5×5 machine would incur over 3 times the penalty for connecting the example case, insofar as the computation time in the SPE is essentially spent in performing the logic functions of the logic blocks 532 and 534 of FIG. 26.2 for the propagation of path costs in logic block 426 of FIG. 24.

(Paradigm E)

Figure 34:
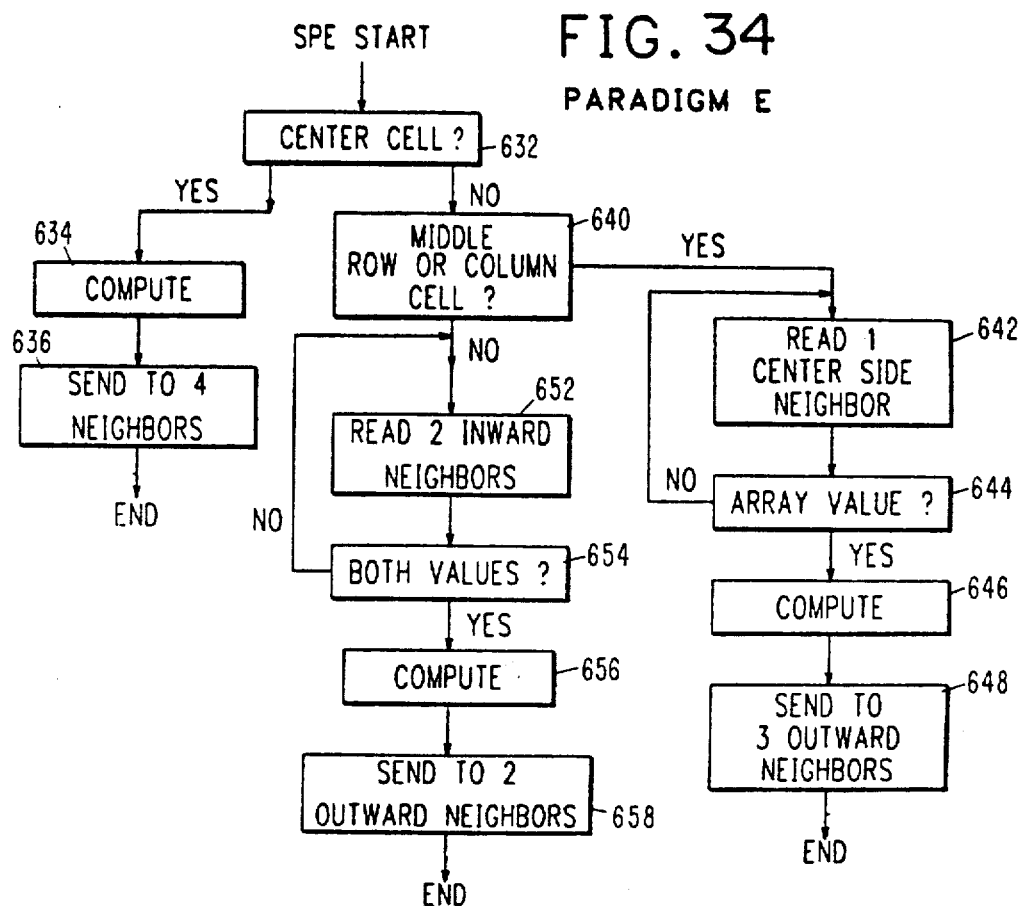
FIG. 34 is a detailed flowchart illustrating the paradigm, E, from an SPE's viewpoint.

Center out 2-dimensional sweep: In the fine track embedding phase of the wire routing, 236 of FIG. 10, and in many other applications in the course of physical design the 2-dimensional sweeping mode of computation is used. FIG. 34 illustrates the paradigm from an SPE's viewpoint.

The center cell SPE proceeds to compute its task and send the results of the computation to the 4 neighbors, as shown in 634 and 636.

The SPEs representing other cells along the center row or the column of the chip (yes branch off 640), waits until a value is received from the center direction (642 and 644), computes on the received value (646), results of which then are sent to all 3 of its outward neighbors. The other SPEs, representing cells not in the center row or column, waits until both of its inward neighbors have sent data (652, 654), and proceeds to compute on the received data (656), the results of which are sent to both of its outward neighbors (658).

Figure 35:
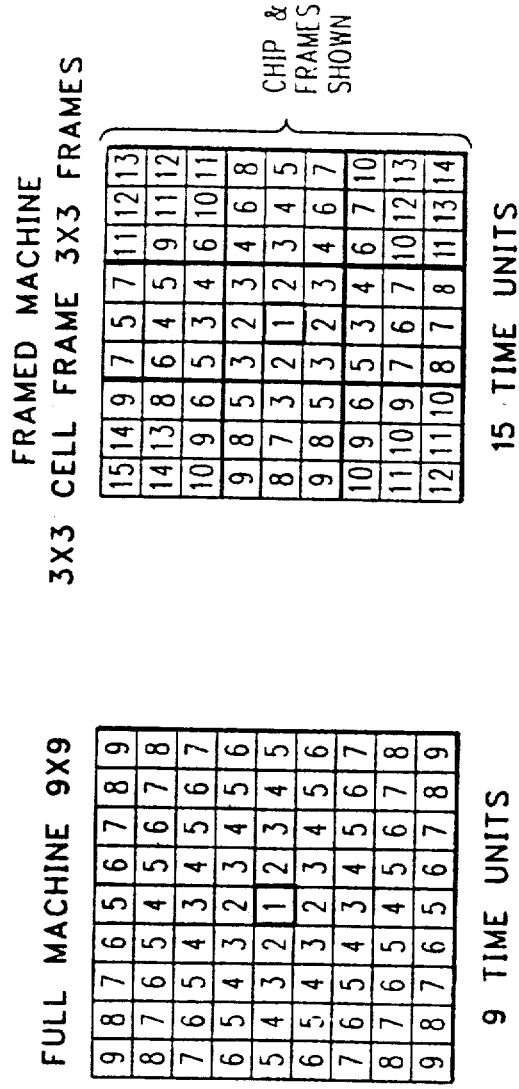
FIGS. 35 and 36 illustrate the processing of a work stack for a full machine and framed machine.
Figure 36:
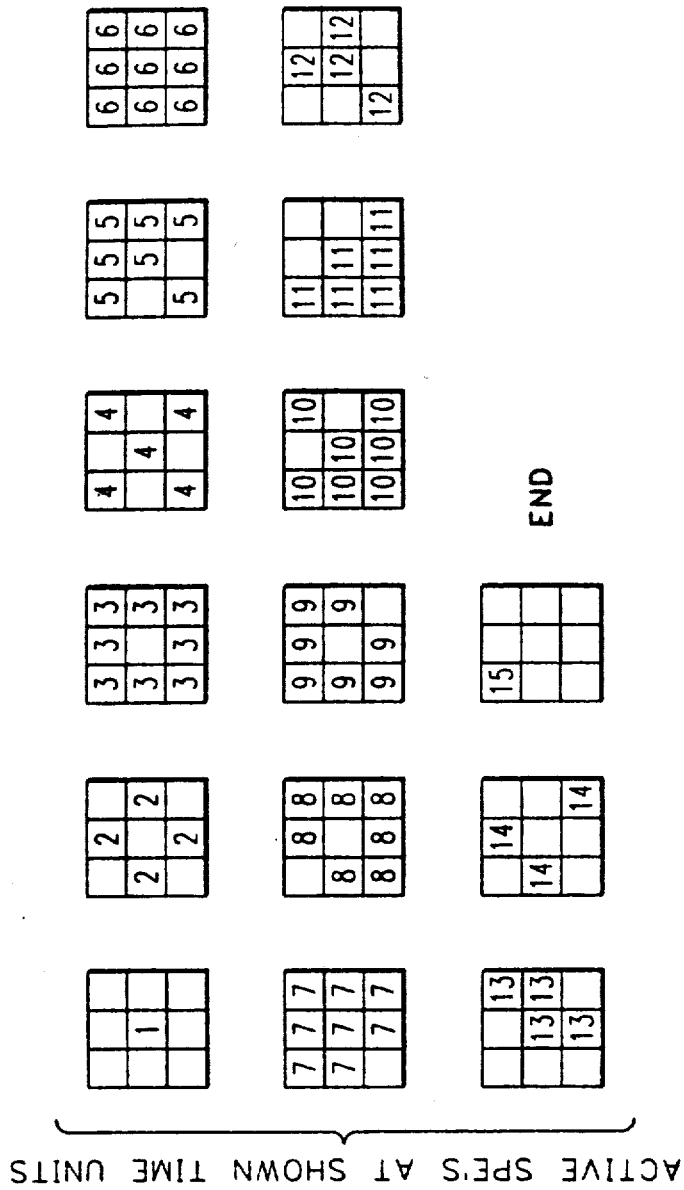

On a full size machine, the processing activity (COMPUTE box of the figure) propagates out from the center in a diamond-like wave until the 4 corners are reached. In the folded machine, the processing progresses in somewhat irregular shape outward as shown in FIGS. 35 and 36. As evidenced from this example, the performance time penalty is much less than the ratio of sizes; chip vs. machine, given that the machine size is reasonable.

The example of FIGS. 35 and 36 illustrates how the order of processing the work stack can be influenced by some predetermined criteria. Each SPE in this example processed the cell closer to the center of the chip first.

It has been shown that the machine processes set forth in the exemplary wire routing system functioned in an efficient highspeed manner. The speed advantage translates to high quality results due to the affordability of much more computation. It is to be recognized that the exemplary machine is also highly suitable for a major portion of an entire physical design process. Designing further parallel algorithms or modifying is readily achievable once the machine structure and the principle of programming the machine as described is understood.

INDUSTRIAL APPLICABILITY

It is an object of the invention to provide a physical design machine.

It is another object of the invention to provide an improved wire routing machine for VLSI networks.

It is yet another object of the invention to provide an improved global wiring machine for VLSI networks.

It is still another object of the invention to provide an improved global wiring machine which includes congestion estimates to determine optimum wiring paths.

It is a further object of the invention to provide an improved global wiring machine for VLSI networks utilizing congestion estimates, port costs and via costs to determine optimal wiring paths.

It is still a further object of the invention to provide an improved global wiring machine for VLSI networks comprised of master-slice chips consisting of an array of active circuit areas on one plane with wiring channels running between these active areas in orthogonal directions on separate planes, with vias running orthogonally to both channels to affect connections between the planes.

It is yet another object of the invention to provide a global wiring machine for VLSI master-slice chips, utilizing a master controller which communicates with an array of multi-port processors to determine channel wire routings between the active areas on the chip.

It is yet a further object of the invention to provide an improved global wiring machine for VLSI master-slice chips utilizing frame mapping techniques such that an array of multi-port processors can determine the wire routing between active areas on the chips, wherein the number of active areas on the chips is much larger than the array.

Having thus described our invention, what we claim as new, and desire to secure by Letters Patent is:

1. A multiple-instruction multiple-data stream processing array comprising;
    a control processor for providing the storing and coordinating functions for said processing array, including multiple column and row selection at a given time;
    a plurality of multiple-instruction multiple-data stream processing elements, with each processing element being directly connected to at least the four adjacent processing elements for asynchronous communication therewith, and each processing element including:
        at least four data input storage means, to respectively directly store data from said at least four adjacent processing elements in said array;
        a data output storage means, to store data which is to be directly provided to said at least four adjacent processing elements in said array;
        a control data input storage means, to store data which is provided from said control processor;
        a control data output storage means, to store data which is to be provided to said control processor;
        at least four flag latches for indicating the flow of information between processing elements, and which are responsive to respective strobe signals indicating when another one of said at least four adjacent processing elements has directly stored data into one of the at least four data input storage means, and for informing said another one of said at least four processing elements that said one of said at least four data input storage means has received said data;
        strobe signal output means for indicating when the data stored in said data output storage means is transmitted to another one of said at least four elements in said array;
        a control input latch, responsive to a control signal from said control processor which is indicative of data being stored in said control data input storage means from said control processor; and
        computing means which operate in response to programs stored therein, and responsive to control signals provided from said control processor to process at least the data stored in said at least four data input storage means and said control data input storage means.

2. The combination claimed in claim 1, including an array I/O processor comprising:
    control logic means responsive to said control signals from said control processor to provide said control signals selectively to said processing elements, and for controlling data flow to and from said control processor and said processing elements.

* * * * *